US011817315B2

(12) United States Patent
Wallis et al.

(10) Patent No.: US 11,817,315 B2
(45) Date of Patent: Nov. 14, 2023

(54) ZINCBLENDE STRUCTURE GROUP III-NITRIDE

(71) Applicants: Cambridge Enterprise Limited, Cambridge (GB); Anvil Semiconductors Limited, Allesley (GB)

(72) Inventors: David John Wallis, Cambridge (GB); Martin Frentrup, Cambridge (GB); Menno Johannes Kappers, Cambridge (GB); Suman-Lata Sahonta, Cambridge (GB)

(73) Assignees: Cambridge Enterprise Limited, Cambridge (GB); Anvil Semiconductors Limited, Warwickshire (GB)

( * ) Notice: Subject to any disclaimer, the term of this patent is extended or adjusted under 35 U.S.C. 154(b) by 0 days.

(21) Appl. No.: 17/681,607

(22) Filed: Feb. 25, 2022

(65) Prior Publication Data

US 2022/0384181 A1    Dec. 1, 2022

Related U.S. Application Data

(63) Continuation of application No. 16/496,388, filed as application No. PCT/EP2018/058250 on Mar. 29, 2018, now Pat. No. 11,302,530.

(30) Foreign Application Priority Data

Mar. 31, 2017   (WO) ................ PCT/EP2017/057764

(51) Int. Cl.
*H01L 33/00*   (2010.01)
*H01L 33/32*   (2010.01)
(Continued)

(52) U.S. Cl.
CPC ...... *H01L 21/0254* (2013.01); *H01L 21/0262* (2013.01); *H01L 21/02381* (2013.01);
(Continued)

(58) Field of Classification Search
CPC ................ H01L 33/32; H01L 21/0254; H01L 21/02381; H01L 21/02458;
(Continued)

(56) References Cited

U.S. PATENT DOCUMENTS 5,874,747 A   2/1999  Redwing et al.
9,705,031 B2  7/2017  Kappers et al.
(Continued)

FOREIGN PATENT DOCUMENTS

JP    H09249499 A   9/1997

OTHER PUBLICATIONS

Ambacher (1998) Growth and Applications of Group III-Nitrides, J. Phys. D: Appl. Phys. 31:2653-2710.
(Continued)

*Primary Examiner* — Savitri Mulpuri
(74) *Attorney, Agent, or Firm* — Rudy J. Ng; Bozicevic, Field & Francis LLP

(57) ABSTRACT

A method is disclosed of manufacturing a semiconductor structure comprising an (001) oriented zincblende structure group III-nitride layer, such as GaN. The layer is formed on a 3C-SiC layer on a silicon substrate. A nucleation layer is formed, recrystallized and then the zincblende structure group III-nitride layer is formed by MOVPE at temperature T3 in the range 750-1000° C., to a thickness of at least 0.5μ. There is also disclosed a corresponding semiconductor structure comprising a zincblende structure group III-nitride layer which, when characterized by XRD, shows that the substantial majority, or all, of the layer is formed of
(Continued)

zincblende structure group III-nitride in preference to wurtzite structure group III-nitride.

9 Claims, 47 Drawing Sheets

(51) Int. Cl.
  H01L 21/02 (2006.01)
  H01L 29/04 (2006.01)
  H01L 29/20 (2006.01)
(52) U.S. Cl.
  CPC .. H01L 21/02447 (2013.01); H01L 21/02458 (2013.01); H01L 29/04 (2013.01); H01L 29/2003 (2013.01); H01L 33/007 (2013.01); H01L 33/32 (2013.01)
(58) Field of Classification Search
  CPC ........... H01L 21/02576; H01L 29/2003; H01L 21/02502; H01L 21/02447; H01L 29/04; H01L 21/0262; H01L 33/007
  See application file for complete search history.

(56) References Cited

U.S. PATENT DOCUMENTS

| | | |
|---|---|---|
| 2003/0012984 A1 | 1/2003 | Ueda |
| 2004/0077165 A1 | 4/2004 | Armitage et al. |
| 2004/0127042 A1 | 7/2004 | Nagasawa et al. |
| 2007/0297969 A1 | 12/2007 | Van Patten et al. |
| 2009/0091002 A1 | 4/2009 | Arena et al. |
| 2009/0127583 A1 | 5/2009 | Ohachi et al. |
| 2016/0247967 A1 | 8/2016 | Ward |
| 2017/0069716 A1 | 3/2017 | Roberts et al. |

OTHER PUBLICATIONS

As et al., (2000) "Electroluminescence of a Cubic GaN/GaAs (001) p—n Junction", Applied Physics Letters 76(1):13-15.
As (2010) "Recent Developments on Non-Polar Cubic Group III Nitrides for Optoelectronic Applications", Proc. of SPIE vol. 7608 76080G—1-15 pages.
Ayers (1995) "New Model for the Thickness and Mismatch Dependencies of Threading Dislocation Densities in Mismatched Heteroepitaxial Layers", Journal of Applied Physics 78(6): 3724-3726.
Barchuk et al., (2011) "Diffuse X-Ray Scattering from Stacking Faults in a-Plane GaN Epitaxial Layers", Physical Review B 84, 094113 8 pages.
Bumenau (2000) "Dislocations in Hexagonal and Cubic GaN", J. Phys.: Condens. Matter 12 10223-10233.
Chen et al., (2007) "Microstructure and Strain Relaxation of Epitaxial $PrScO_3$ Thin Films Grown on (001) $SrTiO_3$ Substrates", Appl. Phys. Lett. 91, 031902—3 pages.
Cheng et al., (1995) "Selective Growth of Zinc-Blende, Wurtzite,or a Mixed Phase of Gallium Nitride by Molecular Beam Epitaxy", Appl. Phys. Lett. 66(12): 1509-1511.
Chichibu et al., (2002) "Recombination Dynamics of Localized Excitons in Cubic Phase $In_xGa_{1-x}N$/GaN Multiple Quantum Wells on 3C-SiC/Si (001)", Phys. Stat. Sol. (b) 234, No. 3, 746-749.
Chichibu et al., (2005) "Limiting Factors of Room-Temperature Nonradiative Photoluminescence Lifetime in Polar and Nonpolar GaN Studied by Time-Resolved Photoluminescence and Slow Positron Annihilation Techniques", Applied Physics Letters 86, 021914-3.
Compeán García et al., (2015) "Bulk Lattice Parameter and Band Gap of Cubic $In_xGa_{1-x}N$ (001) Alloys on MgO(100) Substrates", Journal of Crystal Growth 418:120-125.
Cullity (1956) "Elements of X-Ray Diffraction", Library of Congress Catalog No. 56-10137, chapter 4, pp. 104-136.
Cullity (1978) "Elements of X-Ray Diffraction", Library of Congress Catalog No. 56-10137, Appendix 3.pp. 501-503.
Dawson et al., (2016) "The Nature of Carrier Localisation in Polar and Nonpolar InGaN/GaN Quantum Wells", J. Appl. Phys. 119, 181505—7 pages.
Detchprohm et al., (2010) "Wavelength-Stable Cyan and Green Light Emitting Diodes on Nonpolar m-plane GaN Bulk Substrates", Appl. Phys. Lett. 96: 051101—3 pages.
Dun & Koch (1957) "Comparison of Dislocation Densities of Primary and Secondary Recrystallization Grains of Si-Fe*", ActaMet vol. 5 pp. 548-554.
DunstanN (1997) "Strain and Strain Relaxation in Semiconductors", Journal of Materials Science: Materials in Electronics 8:337-375.
Dupraz et al., (2015) "Signature of Dislocations and Stacking Faults of Face-centred Cubic Nanocrystals in Coherent X-ray Diffraction Patterns: A Numerical Study", J. Appl. Cryst. 48: 621-644.
Fewster (1989) "A High-Resolution Multiple-Crystal Multiple-Reflection Diffractometer", J. Appl. Cryst. 22, 64-69.
Fewster (1999). "Absolute Lattice Parameter Measurement", Journal of Materials Science: Materials in Electronics 10 175-183.
Fiorentini et al., (1999) "Effects of Macroscopic Polarization in III-V Nitride Multiple Quantum Wells", The American Physical Society 60(12):8849-8858.
Fujii et al., (2010) "Photoelectrochemical Properties of Single Crystalline and Polycrystalline GaN Grown by the Na-flux Method", Electrochemistry 78(2):136-139.
Hamachi et al., (2019) "Correlation Between Current Leakage and Structural Properties of Threading Dislocations in GaN Bulk Single Crystals Grown Using a Na-Flux Method", Japanese Journal of Applied Physics 58, SCCB23:1-6.
Hammersley et al., (2005) "Effects of Quantum Well Growth Temperature on the Recombination Efficiency of InGaN/GaN Multiple Quantum Wells that Emit in the Green and Blue Spectral Regions" Applied Physics Letters 107, 132106—5 pages.
Hammersley et al., (2016) "Effect of QW Growth Temperature on the Optical Properties of Blue and Green InGaN/GaN QW Structures", Phys. Status Solidi C 13, (5-6): 209-213.
HanadaA (2009) "Basic Properties of ZnO, GaN, and Related Materials", Oxide and Nitride Semiconductors—Processing, Properties, and Applications, Advances in Materials Research 12, 1-19.
Herres et al., (1999) "X-Ray Analysis of the Texture of Heteroepitaxial Gallium Nitride Films", Materials Science and Engineering B59:202-206.
Hoffmann (1976) Stresses in Thin Films: The Relevance of Grain Boundaries and Impurities*, "Basic Problems, Applications and Trends", Paper 6-R-I., 34:185-190.
Inaba (2014) "Special Feature: GaN for Opto- and Power-Electronic Applications (2) Characterization of GaN-Related Materials using High-Resolution XRD", Rigaku Journal, 30(1):1-16.
International Search Report dated Dec. 15, 2017 issued on PCTEP2017057764, 8 pages.
International Search Report dated Jul. 13, 2018 issued on PCT/EP2018/058250, 12 pages.
Kemper et al., (2012) "Formation of Defects in Cubic GaN Grown on Nano-Patterned 3C-SiC (001)", Phys. Status Solidi C 9, No. 3-4, 1028-1031.
Kemper et al., (2015) "STEM-CL Investigations on the Influence of Stacking Faults on the Optical Emission of Cubic GaN Epilayers and Cubic GaN/AlN Multi-Quantum Wells", Phys. Status Solidi C 12, No. 4-5, 469-472.
La Via (2012) "Silicon Carbide Epitaxy", Research Signpost, eBook 262 pages.
Lee et al., (2005) "Effect of Threading Dislocations on the Bragg Peakwidths of GaN, AlGaN, and AlN Heterolayers", Applied Physics Letters 86, 241904—4 pages.
Lei et al., (1991) "Epitaxial Growth of Zinc Blende and Wurtzitic Gallium Nitride Thin Films on (001) Silicon", Appl. Phys. Lett. 59, 944-946.
Lischka (1997) "Epitaxial ZnSe and Cubic GaN: Wide-Band-Gap Semiconductors with Similar Properties?", Phys. Stat. Sol. (b) 202, 673-681.

(56) References Cited

OTHER PUBLICATIONS

Marcinkevicius et al., (2013) "Photoexcited Carrier Recombination in Wide m-Plane InGaN/GaN Quantum Wells", Applied Physics Letters 103, 111107:1-5.
Martinez-Guerrero et al., (2002) "Structural Properties of Undoped and Doped Cubic GaN Grown on SiC(001)", Journal of Applied Physics 91(8): 4983-4987.
Metzger et al., (1998) "Defect Structure of Epitaxial GaN Films Determined by Transmission Electron Microscopy and Tripleaxis X-Ray Diffractometry", Philosophical Magazine,.77(4):1013-1025.
Miller et al., (1985) "Electric Field Dependence of Optical Absorption Near the Band Gap of Quantum-Well Structures", The American Physical Society 32(2):1043-1060.
Nippert et al., (2016) "Temperature-Dependent Recombination Coefficients in InGaN Light-Emitting Diodes: Hole Localization, Auger Processes, and the Green Gap", Appl. Phys. Lett. 109(16):161103—5 pages.
Novikov et al., (2011) "Molecular Beam Epitaxy as a Method for the Growth of Free-Standing Bulk Zinc-Blende GaN and AlGaN Crystals", Journal of Crystal Growth 323:80-83.
Okada & Tokumaru (1984) "Precise Determination of Lattice Parameter and Thermal Expansion Coefficient of Silicon between 300 and 1500 K", Journal of Applied Physics 56(2):314-320.
Pacheco-Salazar et al., (2005) "Growth and Characterization of Cubic $In_xGa_{1-x}N$ Epilayers on Two Different Types of Substrate", Journal of Crystal Growth 284:379-387.
Paszkowicz et al., (2004) "Rietveld-Refinement Study of Aluminium and Gallium Nitrides", Journal of Alloys and Compounds 382:100-106.
Paulus et al., (1997) "A Correlated Ab Initio Treatment of the Zinc-Blende Wurtzite Polytypism of SiC and III-V Nitrides" J. Phys.: Condens. Matter 9 2745-2758.
Powell et al., (1993) "Heteroepitaxial Wurtzite and Zinc-Blende Structure GaN Grown by Reactive-Ion Molecular-Beam Epitaxy: Growth Kinetics, Microstructure, and Properties", Journal of Applied Physics 73(1):189-204.
Qu et al., (2001) "Polarity Dependence of Hexagonal Inclusions and Cubic Twins in GaN/GaAs (0 0 1) Epilayers Measured by Conventional X-Ray Pole Figure and Grazing Incident Diffraction Pole Figure", Journal of Crystal Growth 226:57-61.
Reynolds (1986) "The Lorentz-Polarization Factor and Preferred Orientation in Oriented Clay Aggregates", Clays and Clay Minerals, 34(4):359-367.
Roder et al., (2005) "Temperature Dependence of the Thermal Expansion of GaN", Physical Review B 72(8): 085218—6 pages.
Roder et al., (2006) "Stress and Wafer Bending of a-plane GaN Layers on r-plane Sapphire Substrates", J. Appl. Phys. 100(10): 103511—11 pages.
Romanov et al., (1997) "Modeling of Threading Dislocation Density Reduction in Heteroepitaxial Layers", Threading Dislocation Density Reduction in Layers (II), Phys. Stat. Sol. (b) 199:33-49.
Rusing et al., (2016) "Joint Raman Spectroscopy and HRXRD Investigation of Cubic Gallium Nitride Layers Grown on 3C-SiC", Phys. Status Solidi B 253, No. 4, 778-782.
Schörmann et al., (2006) "Molecular Beam Epitaxy of Phase Pure Cubic InN", Appl. Phys. Lett. 89, 261903—3 pages.
SG Written Opinion, Singapore Application No. 11201908884Q, dated Oct. 1, 2020, 8 pages.
Shen et al., (2003) "X-Ray Diffraction Analysis of MOCVD Grown GaN Buffer Layers on GaAs (0 0 1) Substrates", Journal of Crystal Growth 254:23-27.
Srikant et al., (1997) "Mosaic Structure in Epitaxial Thin Films Having Large Lattice Mismatch", Journal of Applied Physics 82, 4286-4295.
Trampert et al., (1997) "Phase Transformations and Phase Stability in Epitaxial β-GaN Films †‡", Angnew Chem Int Ed. Engl. 36(19):2111-2112.
Tsuchiya et al., (1998) "Growth Condition Dependence of GaN Crystal Structure on (0 0 1)GaAs by Hydride Vapor-Phase Epitaxy", Journal of Crystal Growth 189/190 395-400.
Vurgaftman & Meyer (2003) "Band Parameters for Nitrogen-Containing Semiconductors", J. Appl. Phys., 94(6): 3675-3696.
Waasmaier &. Kirfel (1995) "New Analytical Scattering-Factor Functions for Free Atoms and Ions", Acta Cryst. A51,416-431.
Wahab et al., (1994) "Growth of High-Quality 3C-SiC Epitaxial Films on Off-Axis Si(001) Substrates at 850° C. by Reactive Magnetron Sputtering", Appt. Phys. Lett. 65 (6):725-727.
Wu (1997) "Crystal Structure of GaN Grown on 3C-SiC Substrates by Metalorganic Vapor Phase Epitaxy", Japanese Journal of Applied Physics 36:4241-4245.
Yang et al., (1996) "MBE Growth of Cubic GaN on GaAs Substrates", Basic Solid State Physics 194(1): 109-120.
Yeh et al., (1992) "Zinc-Blende-Wurtzite Polytypism in Semiconductors", Physical Review B 46(16): 10086-10097.
Young et al., (2010) "Lattice Tilt and Misfit Dislocations in (11\bar22) Semipolar GaN Heteroepitaxy", Applied Physics Express 3 :011004—3 pages.
Zhao et al., (2012) "Indium Incorporation and Emission Properties of Nonpolar and Semipolar InGaN Quantum Wells", Appl. Phys. Lett. 100, 201108—4 pages.
Zhu et al., (2013) "Prospects of III-Nitride Optoelectronics Grown on Si", Rep. Prog. Phys. 76,106501 (31pages).
Exam Report dated Jan. 17, 2022 issued on IN 20197044023, 6 pages.
Exam Report dated Mar. 22, 2022 issued on JP2019-553074 4 pages 12 pages of English translation.
Exam Report dated May 23, 2022 issued on KR 10-2019-7031983, 68 pages 6 pages of English translation.
Exam Report dated Mar. 28, 2022 issued on IL 269724, 4 pages.
Exam Report dated Apr. 21, 2022 issued on EP 18715641.9, 6 pages.

Fig. 57  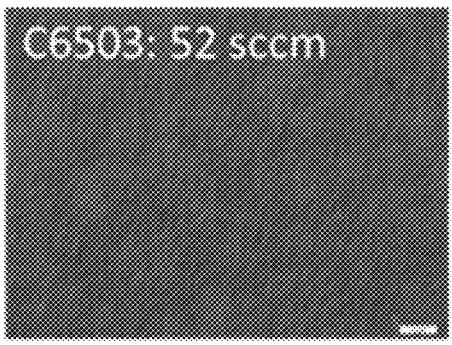 Fig. 60
Fig. 58  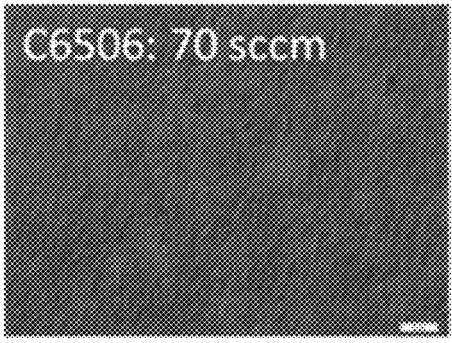 Fig. 61
Fig. 59 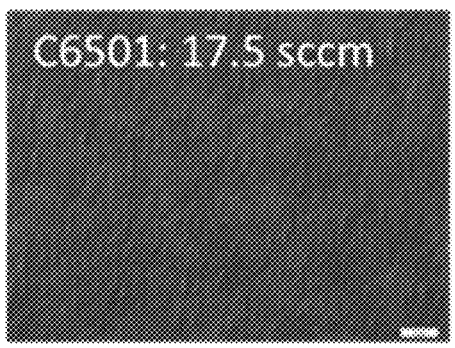 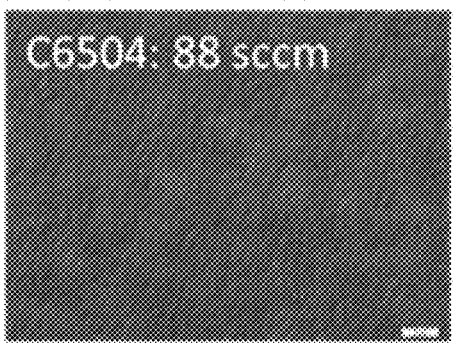 Fig. 62

ND=0
λ=521 nm
Δλ=118 nm

ND=13.5
λ=540 nm
Δλ=125 nm

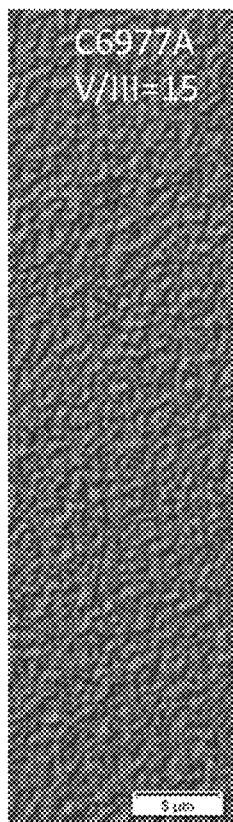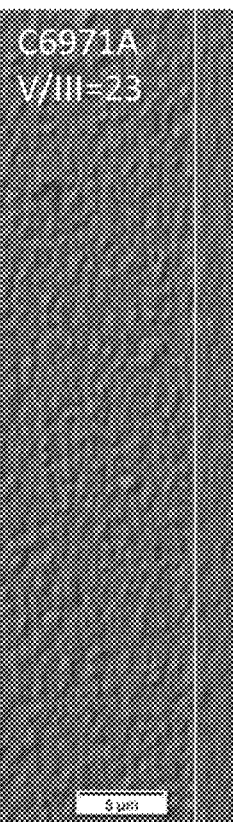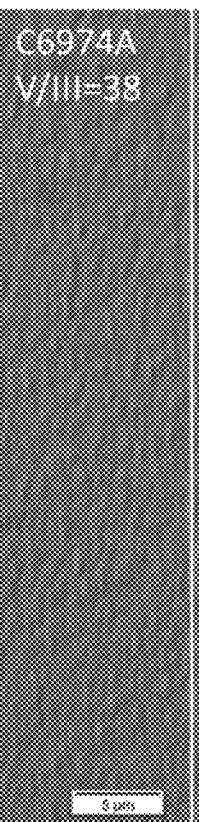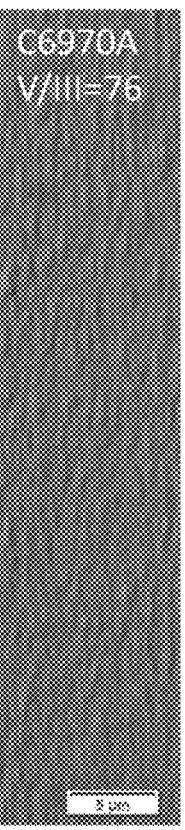
Fig. 95　　Fig. 96　　Fig. 97　　Fig. 98
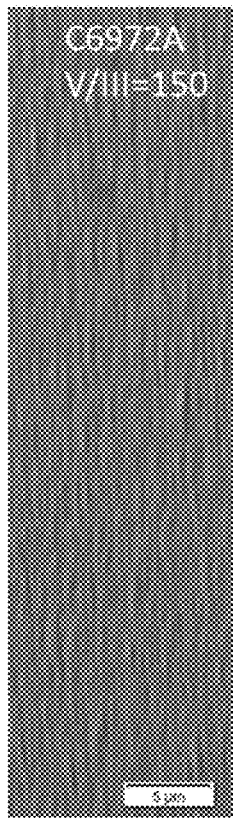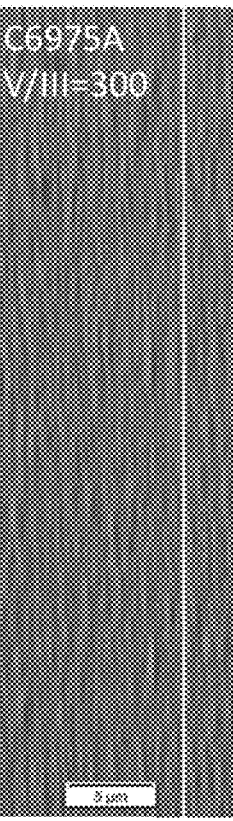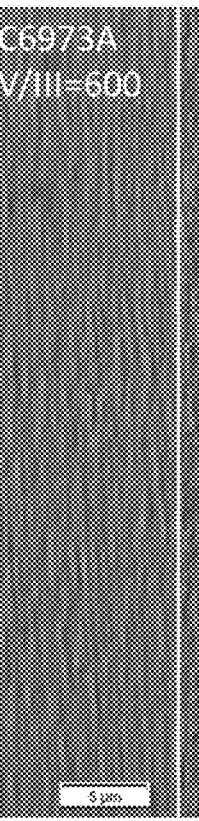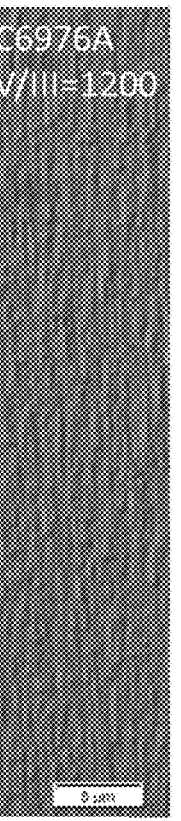
Fig. 99　　Fig. 100　　Fig. 101　　Fig. 102

ZINCBLENDE STRUCTURE GROUP III-NITRIDE

CROSS-REFERENCE TO RELATED APPLICATIONS

This application is a continuation of U.S. application Ser. No. 16/496,388, filed Sep. 20, 2019, which is a U.S. National Stage entry of International Application No. PCT/EP2018/058250, filed Mar. 29, 2018, which claims benefit of priority to International Application No. PCT/EP2017/057764, filed Mar. 31, 2017, the disclosures of each of which are incorporated herein by reference.

BACKGROUND TO THE INVENTION

Field of the Invention

The present invention relates to the formation of layers of zincblende structure group III-nitride, e.g. GaN, AlGaN, InGaN, InAlN and more generally $In_xAl_yGa_{1-x-y}N$. Disclosed herein are characterizations of such layers and methods for their formation. These materials have particular, but not necessarily exclusive application, in the field of semiconductor structures and devices, such as light emission applications, e.g. LEDs, lasers, and other devices such as transistors, diodes, sensors.

Related Art

The group-III nitride semiconductors offer a wide range of optoelectronic applications such as multiple quantum well (MQW) LEDs and laser diodes emitting in the blue and green spectral region. Such devices are commonly grown along the c-direction of the hexagonal wurtzite phase, in which strong internal electrical polarisation fields across the quantum wells result in a reduction of the radiative recombination rates, and current density-dependent emission wavelength [Miller et al (1985); Fiorentini et al (1999); Hammersley et al (2015)]. Although these effects are somewhat mitigated by the use of thin QW layers (typically 2-4 nm thick) long radiative recombination lifetimes and relatively low internal quantum efficiencies are observed for green light emitting structures [Nippert et al (2016); Hammersley et al (2016)]. QW structures grown along non-polar axes of the wurtzite GaN phase, e.g., the a-plane and m-plane, have been designed to avoid the polarisation fields and related limitations. Although the non-polar wurtzite devices show very short radiative lifetimes [Marcinkevičius et al (2013); Dawson et al (2016)] and wavelength characteristics independent of current density [Detchprohm et al (2010)], their quantum efficiencies have never surpassed those of polar c-plane structures [Dawson et al (2016)]. A possible explanation for the underachievement of green-emitting non-polar wurtzite devices could be the fact that indium-richer QWs are required to achieve green emission, in the absence of the polarisation field-related quantum confined Stark effect (QCSE) [Fiorentini et al (1999)]. Apart from the increased interfacial strain with the GaN buffer and barrier layers, the lower indium incorporation efficiency of non-polar growth planes compared to the polar growth plane requires low process temperatures for indium-rich layer growth [Zhao et al (2012)]. This potentially results in high densities of impurities and point defects, which act as non-radiative recombination centres and further decrease the efficiency of non-polar wurtzite MQWs [Chichibu et al (2005)].

Hence, GaN-related structures in the cubic zincblende phase have re-emerged as a promising approach to achieving improved efficiencies for green-wavelength LEDs after strong initial interest in the mid 1990s.

Cubic zincblende InGaN/GaN MQW structures grown on the (001) plane may be polarisation field free, as in the zincblende phase these fields are only induced by shear stresses [Hanada (2009)], which are not present in (001) oriented films. Therefore, compared with c-plane hexagonal structures, the electron-hole wavefunction overlap is increased, which should lead to increases in the radiative recombination rate. Furthermore, InGaN has a narrower bandgap in the cubic phase than in the hexagonal phase for a given indium content [Schormann et al (2006); Compean Garcia et al (2015)], allowing green-wavelength emission to be achieved at lower indium contents than in non-polar wurtzite structures. However, as zincblende GaN and InGaN are metastable under most growth conditions, it is possible that zincblende films will contain inclusions of the more stable wurtzite polytype, and therefore have a substantial content of wurtzite-like stacking faults and lamellae [Trampert et al (1997); Shen et al (2003); Wu et al (1997); Yang et al (1996)].

US 2016/0247967 discloses suitable substrates for growing cubic GaN layers. These substrates comprise a single crystal silicon wafer with spaced-apart monocrystalline silicon carbide layers formed on the silicon wafer, with amorphous or polycrystalline silicon carbide layers formed between the monocrystalline silicon carbide layers. The monocrystalline SiC is in the form of the 3C—SiC polymorph. GaN is formed over the SiC layer, with epitaxy allowing monocrystalline GaN to form over the monocrystalline SiC and polycrystalline GaN forming over the polycrystalline/amorphous SiC. The effect of this is to provide stress relief for the monocrystalline GaN regions. Other approaches to control stress in the GaN layer are possible, for example the introduction of lattice mismatched layers, such as compositionally graded AlGaN, which induce compressive stress during growth to counteract the tensile stress introduced by the thermal expansion mismatch. This approach has been used for the growth of conventional GaN on Si structures [Zhu et al (2013)]. US 2016/0247967 does not provide substantial detail of how the GaN should be grown, or any explanation or quantification of the content of wurtzite-like regions of GaN in the monocrystalline GaN. In this regard, the disclosure of US 2016/0247967 is limited to stating that the GaN layers can be formed using a Metal Organic Vapour Phase Epitaxy (MOVPE) process using a temperature less than 1000° C., preferably between 800° C. and 950° C.

SUMMARY OF THE INVENTION

In order to achieve single phase epitaxial films with reasonable crystal quality, it is necessary to support the growth process by a powerful structural characterisation technique.

The present invention has been devised in order to address at least one of the above problems. Preferably, the present invention reduces, ameliorates, avoids or overcomes at least one of the above problems.

Accordingly, in a first aspect, the present invention provides a method of manufacturing a semiconductor structure comprising a substantially (001) oriented zincblende structure group III-nitride layer, the method including the steps:

providing a silicon substrate;

providing a 3C—SiC layer on the silicon substrate;

growing a group III-nitride nucleation layer;
carrying out a nucleation layer recrystallization step; and
depositing and growing the zincblende structure group III-nitride layer by MOVPE at temperature T3 in the range 750-1000° C., to a thickness of at least 0.3 μm.

The present inventors have found that these steps provide a zincblende structure group III-nitride layer of improved crystalline quality, in particular with respect to the reduction of the formation of wurtzite structure group III-nitride inclusions.

In this disclosure, some numerical ranges are expressed in terms of open ended ranges with upper or lower limits, or in terms of closed ended ranges with upper and lower limits. It is expressly stated here that preferred ranges are disclosed herein that are combinations of upper and/or lower limits from different ranges for the same parameter.

Preferably, before growing the group III-nitride nucleation layer, the 3C—SiC layer is subjected to a nitridation step at a temperature T1 in the range 800-1100° C. This step is considered to be advantageous in terms of ensuring the plentiful availability of N for subsequent group III-nitride formation. The use of temperature T1 outside this range is considered to reduce the PL NBE peak intensity and broadens the emission FWHM.

We now consider the conditions for deposition and growth of the group III-nitride nucleation layer. Preferably, the group III-nitride nucleation layer is grown at temperature T2 in the range 500-700° C. More preferably, the temperature T2 is in the range 550-650° C. The growth rate may be at least 0.1 nm/s. The growth rate may be up to 1 nm/s. The thickness of the nucleation layer may be at least 3 nm, but is more preferably greater than 3 nm. More preferably, the thickness of the NL may be at least 10 nm. The thickness of the nucleation layer (NL) may be up to 100 nm. Preferably, the thickness of the NL may be up to 50 nm. More preferably, the thickness of the NL may be up to 40 nm. Preferably, the chosen temperature for T2 lies about 40-60° C. above the temperature where the growth rate deviates from a constant value to a lower value, entering a regime in which the ammonia flow determines the growth rate.

Following the growth of the nucleation layer, there is the nucleation layer recrystallization step. In this step, preferably the temperature is ramped up at a rate of between 0.1-10° C./second. More preferably the temperature is ramped up at a rate of between 0.5-5° C./second. This is found to be a suitable approach for satisfactory nucleation layer recrystallization, permitting subsequent high quality epilayer deposition.

The group III-nitride nucleation layer is preferably a zincblende structure group III-nitride nucleation layer.

In the step of depositing and growing the zincblende structure group III-nitride layer on the recrystallized nucleation layer, the reactor pressure is preferably not more than 500 Torr. More preferably, the reactor pressure is not more than 300 Torr. More preferably, the reactor pressure is not more than 100 Torr.

In the step of depositing and growing the zincblende structure group III-nitride layer on the recrystallized nucleation layer, the V-to-III ratio is preferably in the range 10-300. More preferably, the V-to-III ratio is in the range 20-150. More preferably the V-to-III ratio is is in the range 50-100. During this step, the growth rate is preferably in the range 0.1-1 nm/second. A growth rate of about 0.5 nm/second has been found to be suitable, for example. Careful selection of the V-to-III ratio within the preferred ranges shows improvements in the surface morphology, the zincblende phase purity and XRD rocking curve peak widths.

In the step of depositing and growing the zincblende structure group III-nitride layer on the recrystallized nucleation layer temperature T3 is preferably in the range 800-920° C. More preferably, temperature T3 is at least 810° C., more preferably at least 820° C., more preferably at least 830° C. Temperature T3 is preferably at most 910° C., at most 900° C., or at most 890° C. A particularly suitable range for T3 is found to be 845-880° C. Careful selection of temperature T3 within the preferred ranges shows improvements in the surface morphology from Nomarski images, XRD rocking curve peak width and PL. For example, samples grown in the range 860-880° C. shows a relatively smooth surface and corresponding NBE PL peak is the strongest, although also the broadest in the data presented here. At higher growth temperature, it is found that the surface roughens, the PL NBE peak narrows significantly but also the yellow band increases in intensity.

Changes in surface roughness with growth temperature were confirmed from AFM. The phase purity, as determined by XRD shows that it is possible to very substantially reduce the amount of wurtzite inclusions when T3 is 900° C. or lower. When T3 is higher than 900° C. the XRD analysis shows an increasing contribution of reflections due to the wurtzite lattice, indicating incorporation of hexagonal inclusions in the cubic zincblende matrix.

It has been found in this work that it is possible to widen the preferred conditions of temperature T3 and III-V ratio by carrying out epilayer growth at relatively low pressure. In one exemplary set of conditions for growing zincblende GaN epilayers by MOVPE at a constant pressure of 100 Torr, T3 can be in the range 850 and 890° C., with a V/III ratio of 38 to 150. This results in a relatively smooth film with a wurtzite contamination of less than 1%. The preferred thickness of the NL is in the range 10-50 nm, for example about 22 nm.

Preferably, the group III-nitride layer is an $In_xAl_yGa_{1-x-y}N$ based layer, where $0 \leq x \leq 1$, $0 \leq y \leq 1$.

The silicon substrate has a diameter of at least 100 mm. Different substrate diameters are possible. It is notable that the growth processes described here are easily scalable to substrates of any suitable size, such as at least 150 mm, at least 200 mm or at least 300 mm.

In a second aspect, the present invention provides a semiconductor structure comprising a zincblende structure group III-nitride layer, wherein:

the group III-nitride layer has a thickness of at least 0.5 μm; and the group III-nitride layer is monocrystalline zincblende structure group III-nitride to the extent that when the group III-nitride layer is subjected to XRD characterization, the intensity $I_{10\text{-}11}$ attributable to wurtzite structure group III-nitride 10-11 reflections and the intensity $I_{002}$ attributable to zincblende structure group III-nitride 002 reflections satisfy the relation:

$$\frac{I_{10\text{-}11}}{I_{002}} \leq 0.05$$

Features of the first aspect of the invention may be combined with features of the second aspect of the invention, either singly or in any combination, unless the context demands otherwise.

Preferably, at least one of the following relationships applies:

$$\frac{I_{10-11}}{I_{002}} \leq 0.04$$

$$\frac{I_{10-11}}{I_{002}} \leq 0.03$$

$$\frac{I_{10-11}}{I_{002}} \leq 0.02$$

$$\frac{I_{10-11}}{I_{002}} \leq 0.01$$

More preferably, the intensity $I_{10-11}$ attributable to wurtzite structure group III nitride 10-11 reflections and the intensity $I_{002}$ attributable to zincblende structure group III-nitride 002 reflections satisfy the relation:

$$\frac{I_{10-11}}{I_{002}} \leq 0.005$$

It is possible for the intensity $I_{10-11}$ attributable to wurtzite structure group III nitride 10-11 reflections and the intensity $I_{002}$ attributable to zincblende structure group III-nitride 002 reflections to be determined by two dimensional reciprocal space mapping, to form a measured reciprocal space map, encompassing the expected reflections of zincblende structure group III-nitride 002 and wurtzite structure group III-nitride 10-11. Reciprocal space mapping is a technique that is well known to the skilled person and allows an efficient capture of a large amount of data to indicate the crystal phases present in the film.

The intensity $I_{10-11}$ located at a position in reciprocal space attributable to wurtzite structure group III-nitride 10-11 reflections may be caused by stacking faults formed on {111} facets of zincblende structure group III-nitride, evidenced by elongate streaks in the measured reciprocal space map between the reflections of zincblende structure group III-nitride 002 and the expected wurtzite structure group III-nitride 10-11 reflections. In this way, it is possible for there to be measurable reflected x-ray intensity at the defined location in reciprocal space, but this does not necessarily mean that wurtzite structure group III-nitride inclusions are present. Rather, the x-ray intensity may be provided by reflections from stacking faults. The presence of hexagonal stacking faults is considered to be less problematic to the performance of the group III nitride layer than the presence of wurtzite structure inclusions.

In the third aspect, the present invention provides a zincblende structure group III-nitride layer, wherein:
the group III-nitride layer has a thickness of at least 0.5 µm; and the group III-nitride layer is monocrystalline zincblende structure group III-nitride to the extent that when the group III-nitride layer is subjected to XRD characterization, the relative volume proportions of zincblende structure group III-nitride $V_{zb}$ and wurtzite structure group III-nitride $V_{wz}$ satisfy the relation:

$$\frac{V_{wz}}{V_{zb}} \leq 0.05$$

where $V_{wz}$ is assessed on the basis of wurtzite structure group III-nitride 1-103 reflections and $V_{zb}$ is assessed on the basis of zincblende structure group III-nitride 113 reflections according to:

$$\frac{V_{wz}}{V_{zb}} = \frac{I_{1-13}}{I_{113}} \cdot \frac{1+\cos^2(2\theta_{113})}{1+\cos^2(2\theta_{1-13})} \cdot \frac{2 \cdot \sin(\theta_{1-13}) \cdot \cos(\theta_{1-13})}{2 \cdot \sin(\theta_{113}) \cdot \cos(\theta_{113})} \cdot \frac{\left(\frac{|F_{113}|}{V_{uczb}}\right)^2}{\left(\frac{|F_{1-13}|}{V_{ucwz}}\right)^2}$$

where:
$V_{uczb}$ is the volume of the zincblende structure group III-nitride unit cell
$V_{ucwz}$ is the volume of the wurtzite structure group III-nitride unit cell
$F_{113}$ is the structure amplitude of the zincblende structure group III-nitride 113 reflections
$F_{1-13}$ is the structure amplitude of the wurtzite structure group III-nitride 1-103 reflections
$2\theta_{113}$ is the 2θ angle for the zincblende structure group III-nitride 113 reflections
$2\theta_{1-13}$ is the 2θ angle for the wurtzite structure group III-nitride 1-103 reflections
$I_{113}$ is the integrated intensity of the zincblende structure group III-nitride 113 reflections
$I_{1-13}$ is the integrated intensity of the wurtzite structure group III-nitride 1-103 reflections.

Features of the first aspect of the invention, and/or features of the second aspect of the invention may be combined with features of the third aspect of the invention, either singly or in any combination, unless the context demands otherwise.

Preferably, at least one of the following relationships applies:

$$\frac{V_{wz}}{V_{zb}} \leq 0.04$$

$$\frac{V_{wz}}{V_{zb}} \leq 0.03$$

$$\frac{V_{wz}}{V_{zb}} \leq 0.02$$

$$\frac{V_{wz}}{V_{zb}} \leq 0.01$$

$$\frac{V_{wz}}{V_{zb}} \leq 0.005$$

Preferably, the zincblende structure group III-nitride layer of the semiconductor structure of the second and/or third aspect is substantially (001) oriented.

The zincblende structure group III-nitride layer of the semiconductor structure of the second and/or third aspect may have a thickness of at least 0.3 µm.

In any of the first, second or third aspects, the zincblende structure group III-nitride layer of the semiconductor structure of may have a thickness of at least 0.4 µm, at least 0.6 µm, at least 0.8 µm, at least 1 µm, at least 1.5 µm, or at least 2 µm.

The zincblende structure group III-nitride layer may have a reflective layer interposed between the zincblende structure group III-nitride layer and a substrate. This is useful for the structure in use as a device, particular in a light emitting device.

The zincblende structure group III-nitride layer may have dimensions, in two directions orthogonal to each other and to the thickness direction, of at least 1 mm. More preferably, these dimensions may be at least 2 mm, at least 3 mm, at least 4 mm or at least 5 mm.

However, it is to be understood that for some useful devices the zincblende structure group III-nitride layer may have dimensions smaller than those indicated above. This may be the case, for example, where the structure is diced for use in particular devices.

The present invention also provides a semiconductor device incorporating a semiconductor structure according to the second or third aspect, wherein the semiconductor device is selected from the group consisting of: a light emitting diode (LED); a laser; a diode; a transistor; a sensor.

Further optional features of the invention are set out below.

BRIEF DESCRIPTION OF THE DRAWINGS

Embodiments of the invention will now be described by way of example with reference to the accompanying drawings in which:

FIGS. 57-62 show changes in surface morphology from Nomarski images with silane flow rate for 500 nm thick films grown at T=860° C., P=300 Torr and V/III=80.

FIGS. 95-102 show Nomarski optical micrographs showing the surface of GaN epilayers grown over the V/III range of 15 to 1200 at a constant temperature of 875° C. and a pressure of 100 Torr. The V/III ratio used for each is indicated on the respective images.

Figure 1:
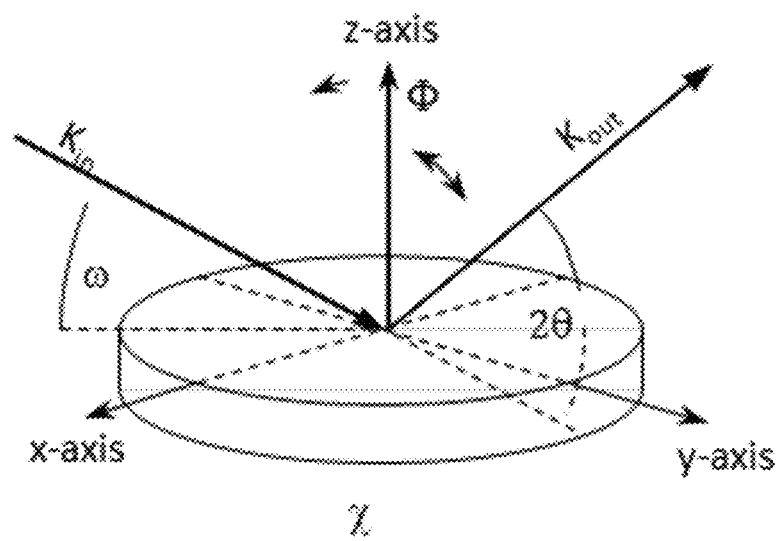
FIG. 1 schematically illustrates the beam path and different goniometer motions in X-ray diffraction characterization.

DETAILED DESCRIPTION OF THE PREFERRED EMBODIMENTS, AND FURTHER OPTIONAL FEATURES OF THE INVENTION

Solving the green gap problem is a key challenge for the development of future LED-based light systems. A promising approach to achieving higher LED efficiencies in the green spectral region is the growth of III-nitrides in the cubic zincblende phase. However, the metastability of zincblende GaN along with the crystal growth process often lead to phase mixture with the wurtzite phase, high mosaicity, high densities of extended and point defects, and strain, which can all impair the performance of light emitting devices. X-ray diffraction (XRD) is the main characterisation technique to analyse these device-relevant structural properties, as it is very cheap in comparison to other techniques and enables fast feedback times. In this disclosure we present various XRD techniques to identify the phase purity in predominantly zincblende GaN thin films, to analyse their mosaicity, strain state, and wafer curvature. The different techniques are illustrated on samples grown on pieces of 4" SiC/Si wafers via MOVPE or MOCVD (Metal Organic Vapor Deposition.

X-ray diffraction (XRD) is a suitable method for the purposes explained above, as it is non-destructive, well established and provides detailed information on the structural properties of crystalline materials quickly. Here we illustrate how XRD techniques can be used to identify textures, phase purity, crystal orientations, and to quantify the mosaicity of thin cubic zincblende films. We used the presented techniques to characterise epitaxial GaN thin films grown on low cost, large area (001) cubic 3C—SiC/Si templates in order to give fast feedback for further growth optimisation.

Crystallographic Properties of III-Nitrides

The group-III nitride materials AlN, GaN, InN, and their alloys, $Al_xGa_{1-x}N$, $In_yGa_{1-y}N$ $In_xAl_yGa_{1-x-y}N$, where $0 \leq x \leq 1$, $0 \leq y \leq 1$, can crystallise in the wurtzite, zincblende, and rocksalt structures, of which the first two are the most commonly observed phases in epitaxial thin films [Ambacher (1998); Hanada (2009)]. The hexagonal wurtzite phase and cubic zincblende phase of GaN-based semiconductors are two different polytypes of the same material. In both structures the bonds between the metal ions and the nitrogen ions are tetrahedrally coordinated, and the interionic distances within the close packed planes are approximately the same. The two structures mainly differ in the stacking sequence of these planes, which in the wurtzite structure is ... AaBbAaBbAaBb ... for (0001) planes, while in the zincblende structure it is ... AaBbCcAaBbCc ... for (111) planes, where Aa, Bb, and Cc denote different metal-N bilayers. The distance between crystal planes in the wurtzite structure is given by $$\frac{1}{d_{hkl}^2} = \frac{4}{3}\left(\frac{h^2 + hk + k^2}{a^2}\right) + \frac{l^2}{c^2} \quad \text{(Eq. 1)}$$

and in the zincblende structure by $$\frac{1}{d_{hkl}^2} = \frac{h^2 + k^2 + l^2}{a^2} \quad \text{(Eq. 2)}$$

[Cullity (1978)]. Here a and c are the individual lattice parameters of each structure, and h, k, and l are the Miller-Bravais-indices of the crystal plane. The crystallographic similarities of both polytypes, and the fact that the formation energy for both phases is similar [Yeh (1992)], make it possible that fractions of both polytypes form during the growth process of imperfect material.

Note that, as is well known, cubic structures can be described by the three Miller index notation (h, k, l) and hexagonal structures can be described by the Bravais-Miller index notation (h, k, i, l). However, in the Bravais-Miller index notation, i=−(h+k), and so it is also permissible to describe crystal planes and X-ray reflections of hexagonal structures completely via the three Miller index notation (h, k, l).

Experimental Description and Basics of X-Ray Diffraction

X-ray diffraction (XRD) is one of the most often used methods for the characterisation of crystalline samples. The method is based on the measurement of X-ray reflections, whose pattern represents a Fourier-transformed image of the crystal structure in reciprocal space. The diffraction angle (2θ) of the hkl reflection and the spacing $d_{hkl}$ of (hkl) planes are related with each other via Bragg's law:

$$2d_{hkl} \cdot \sin \theta = \lambda \quad \text{(Eq. 3)}$$

For the X-ray characterisation of our cubic zincblende GaN thin films we used two different standard laboratory diffractometers with Cu-Kα$_1$ sources (λ=1.54056 Å). High resolution measurements were performed on a Philips X'Pert diffractometer, in which the radiation from the X-ray tube was filtered by an asymmetric 4-crystal Bartels monochromator. Thereafter, an adjustable crossed slits collimator further shrank the beam in size and reduced the divergence to a few arc-seconds before it hit the sample at the incident angle ω. X-rays scattered by 2θ from the sample were then measured with a gas-proportional point detector either directly (open detector configuration) or after passing through an additional monochromator (triple axis configuration) for high resolution analysis. The samples were mounted on an Eulerian cradle, which allows rotation about the sample normal (φ), as well as tilt of the sample with respect to the beam-path-plane (bpp) (χ). By changing the x- and y-position of the sample stage and reducing the illuminated area different regions on the sample surface were in focus and could be analysed. FIG. 1 illustrates the beam geometry and the different motions of the sample stage.

Reciprocal space maps were measured with a PANalytical Empyrean diffractometer equipped with a 2-bounce hybrid monochromator, ¼°-slit, Eulerian cradle, and a PIXcel solid state area detector. This configuration guarantees high intensity, and allows very fast and precise measurement of large maps in reciprocal space.

As correct alignment is an important factor for the accurate evaluation of the Bragg reflections and lattice properties, the goniometer 2θ-angle was calibrated on the primary beam before each measurement session. Then the sample was moved into the primary beam path (z-movement) until half of the intensity was blocked, following the best-practice approach suggested in Fewster and Andrew (1995).

The measurements were performed on predominantly zincblende GaN thin films, which were grown by metalorganic vapour phase epitaxy (MOVPE) on pieces of 4" (001) cubic 3C—SiC templates deposited on Si substrates, discussed in more detail below. In order to relieve strain in the large area templates, the 3 μm to 8 μm thick SiC layers were etch-patterned with a polycrystalline square grid to create millimetre-length mesa structures. The present invention is not limited to the use of substrate of this size, but it is noted that the embodiments of the present invention permit the use of large area substrates, which allows for efficient growth and device processing.

Suitable SiC/Si substrates are disclosed in US 2016/0247967.

The SiC layer is polished by chemical mechanical polishing (CMP) to reduce the surface roughness (as measured by AFM) from about 5-10 nm to less than about 1 nm.

Manufacture of Films

The growth of zincblende GaN and InGaN using MOVPE is described below. A so-called two-step growth method was used consisting of a substrate cleaning and nitridation step at elevated temperature (800<T1<1100° C.), the growth of a thin GaN nucleation layer at low temperature (500<T2<700° C.), a nucleation layer recrystallization step and the deposition of the GaN layer at elevated temperature (750<T3<1000° C.).

The temperatures cited here are emissivity-corrected pyrometry values as measured using the in-situ monitoring tool EpiTT supplied by LayTec AG. The values are calibrated against a Si/Al eutectic wafer.

Figure 85:
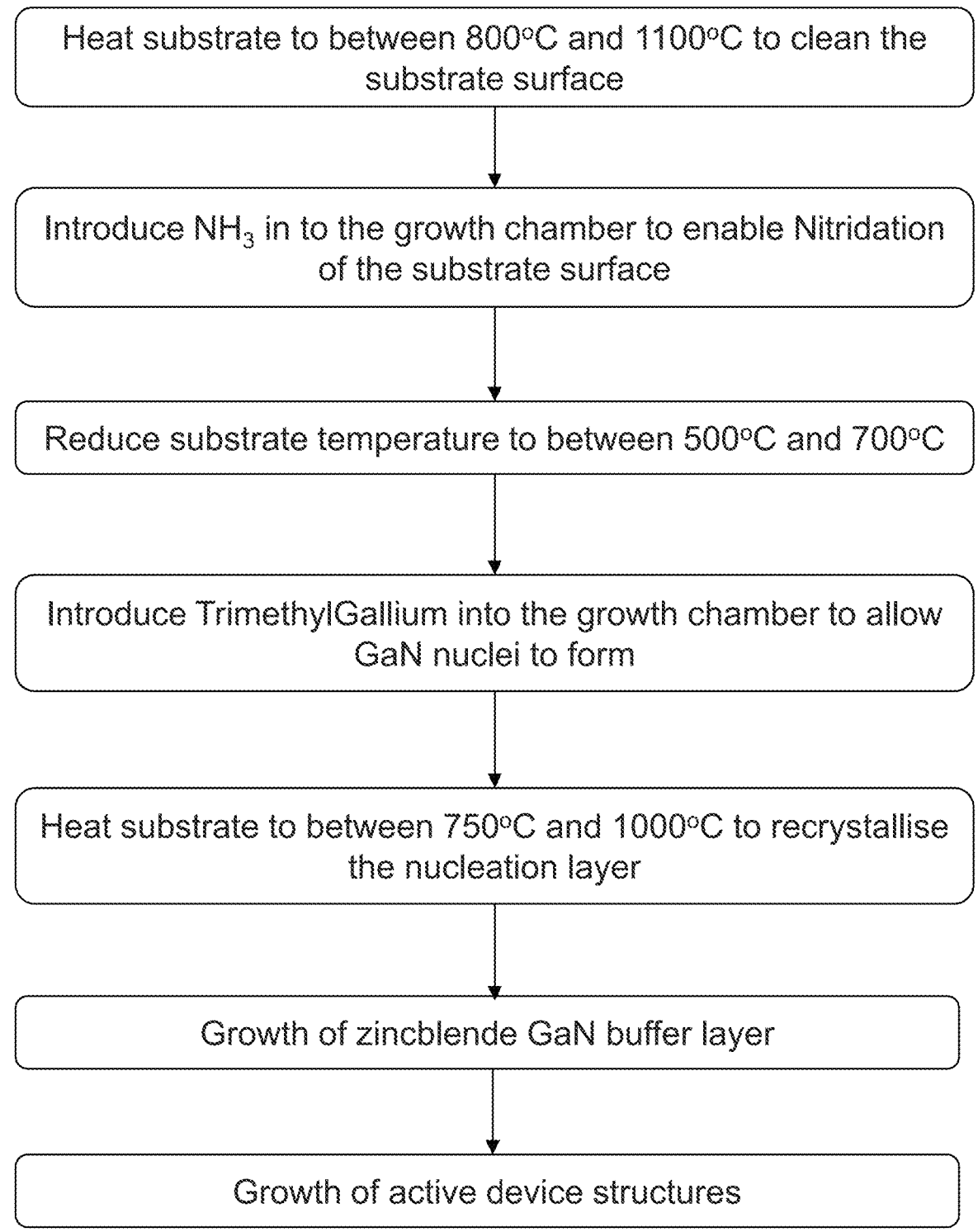
FIG. 85 shows a flow chart showing the process for forming a GaN layer according to an embodiment of the invention.

FIG. 85 shows a flow chart showing the process for forming a GaN layer according to an embodiment of the invention.

Figure 86:
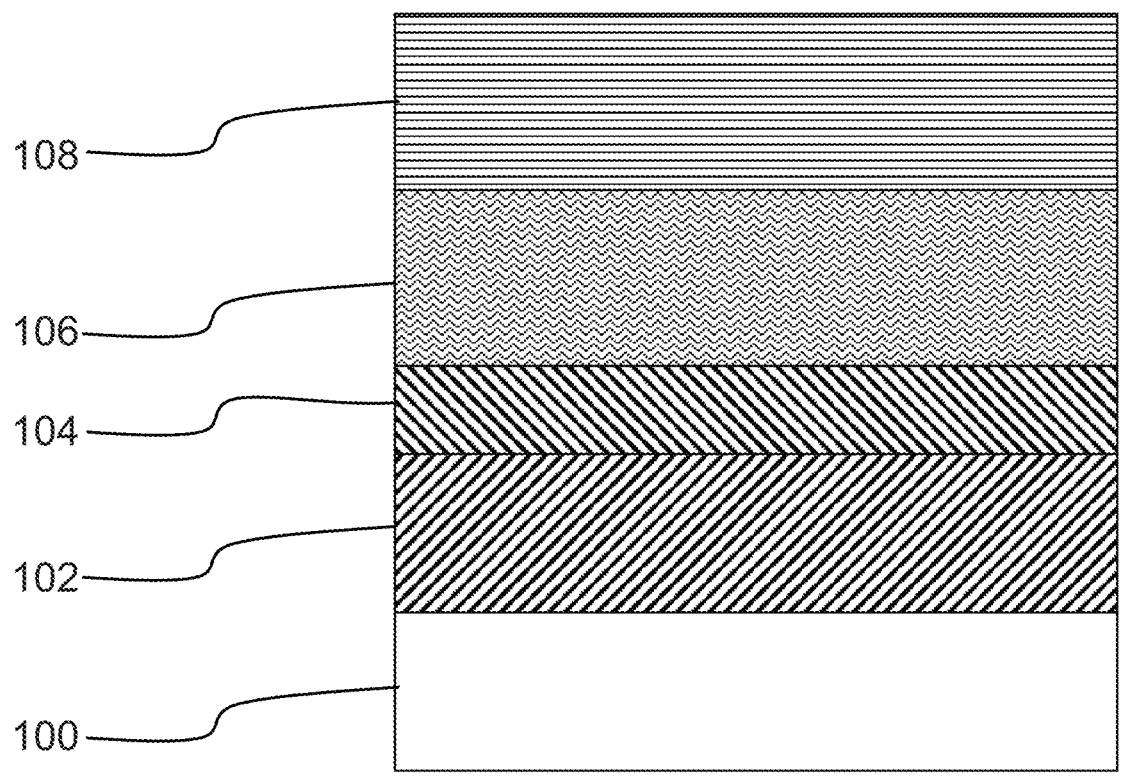
FIG. 86 shows a schematic cross sectional drawing showing the as-formed GaN layer on SiC/Si.

FIG. 86 shows a schematic cross sectional drawing showing the as-formed GaN layer and active devices on SiC/Si. The thickness of the layers is not to scale. Silicon substrate 100 has a 3C—SiC layer 102. A GaN nucleation layer 104 is formed over the 3C—SiC layer 102. A cubic GaN buffer layer 106 is formed over the GaN nucleation layer 104. Next, the active device layers 108 are formed.

Figure 87:
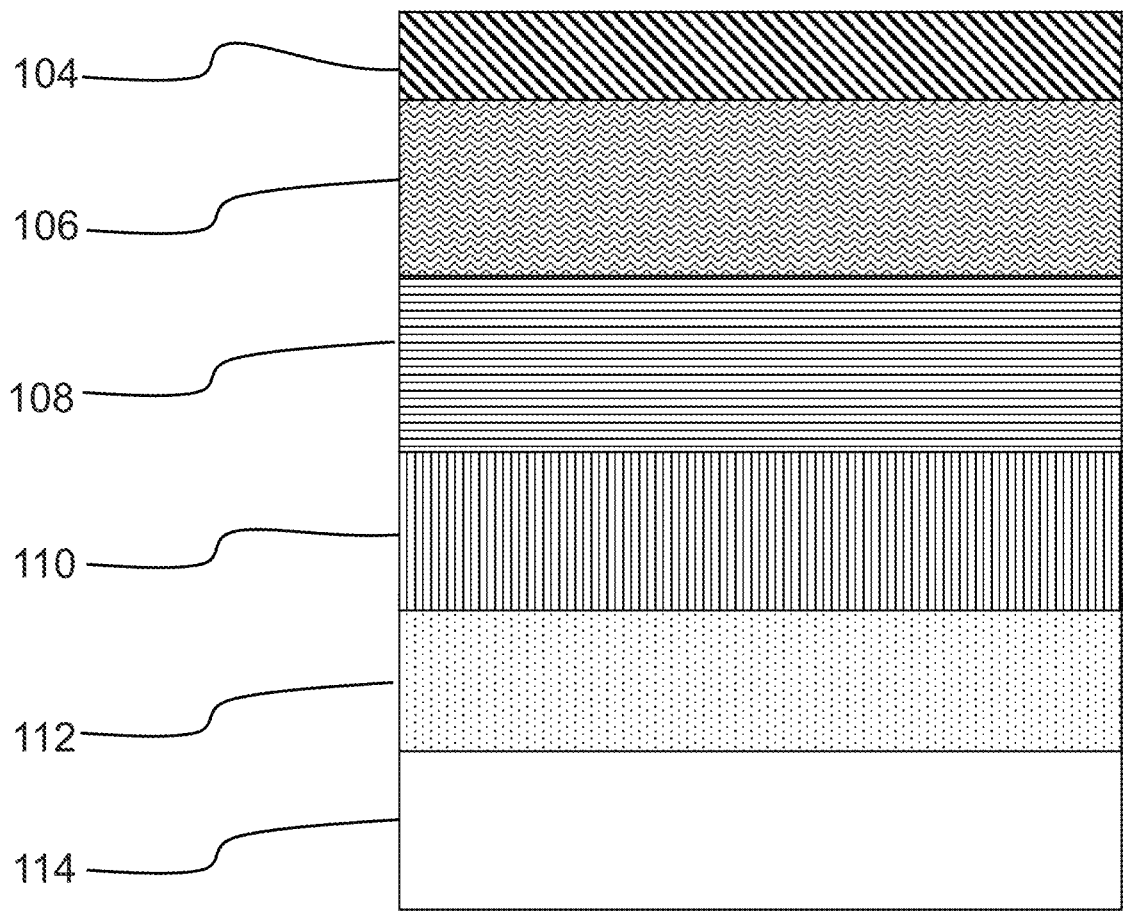
FIG. 87 shows a schematic cross sectional drawing showing the GaN layer transferred to a different substrate for use as a semiconductor device (e.g. LED).
Figure 88:
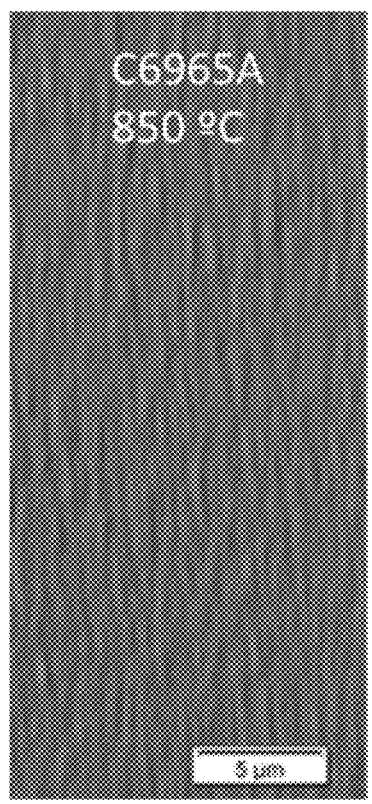
FIGS. 88-93 show Nomarski optical micrographs showing the surface of GaN epilayers grown over the temperature range of 850 to 910° C. at a constant V/III of 76 and a pressure of 100 Torr. The temperature used for each is indicated on the respective images.
Figure 89:
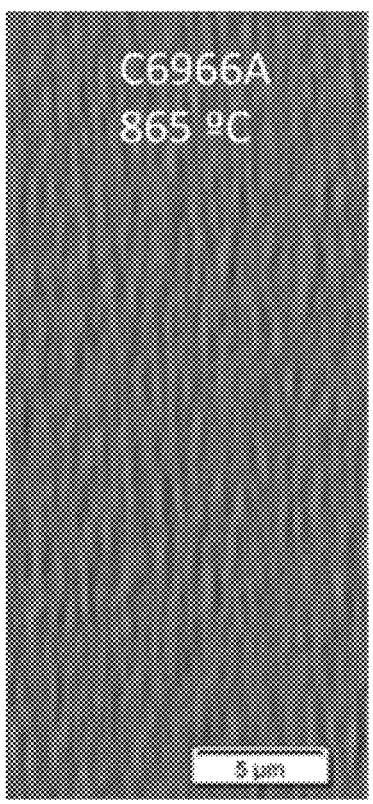
Figure 90:
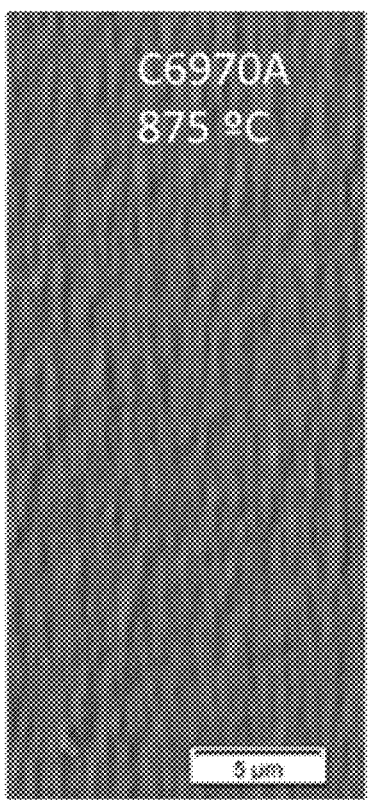
Figure 91:
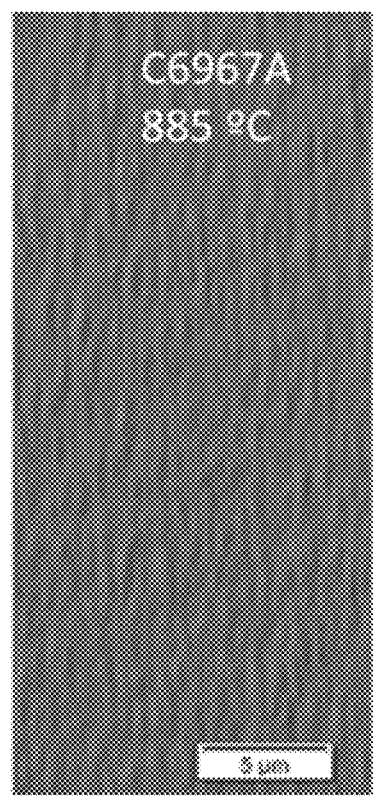
Figure 92:
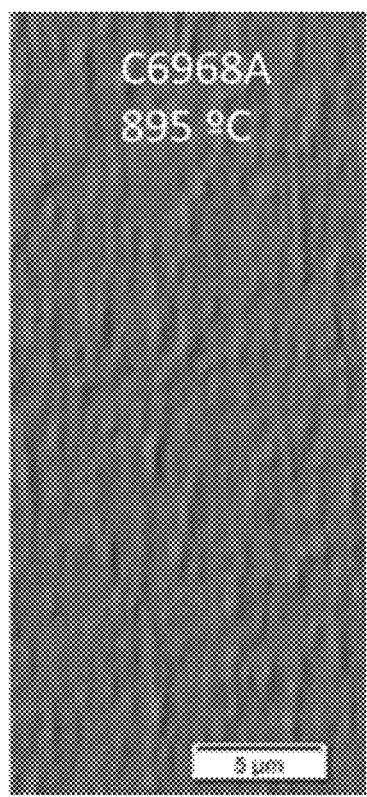
Figure 93:
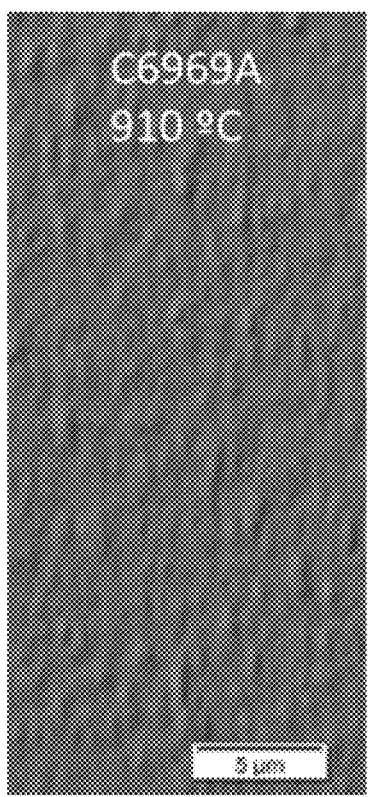

FIG. 87 shows a schematic cross sectional drawing showing the GaN layers formed in FIG. 86 transferred to a different substrate for use as a semiconductor device (e.g. LED). A reflective p-contact 110 is first formed on the active device layers 108. At this point buried n-contact layers may also be formed if required (not shown). Then a bonding layer 112 (including optional diffusion barrier(s)) is used to bond the device structure to a silicon handling wafer 114. Following bonding, the original Si/SiC substrate is removed to prevent light absorption. The nucleation layer 104 and cubic GaN buffer layer 106 may either be left in place as illustrated and utilised as part of any light extraction structures, or they may also be removed leaving only the active device layers 108 bonded to the silicon handling wafer 114 for further device processing.

The films are characterized by the well-known technique of photoluminescence (PL), in which the film is illuminated with a laser (266 nm Q-switched) above the bandgap of the GaN material. This promotes the formation of a substantial number of electron-hole pairs which recombine to emit light. The emission spectrum is captured. Note that cubic GaN has a bandgap of about 3.2 eV and hexagonal GaN has a bandgap of about 3.4 eV.

Substrate Nitridation

For 360 s the substrate is exposed to a flow mixture of ammonia and hydrogen (ratio: 3/17) at a reactor pressure of 100 Torr and a temperature of 960° C. Using a lower or higher temperature than 960° C. reduces the PL NBE peak intensity and broadens the emission FWHM, as shown in FIGS. 4, 5, 7, 8, 10, 11, 13, 14, 16, 17.

Nitridation of the surface partially removes oxide from the SiC surface and populates the surface with N atoms ready to form GaN when Ga becomes available.

In an alternative embodiment, it is possible to fully remove the oxide thermally, but this would require a treatment temperature of about 1400° C.

Nucleation Layer Deposition

Figure 18:
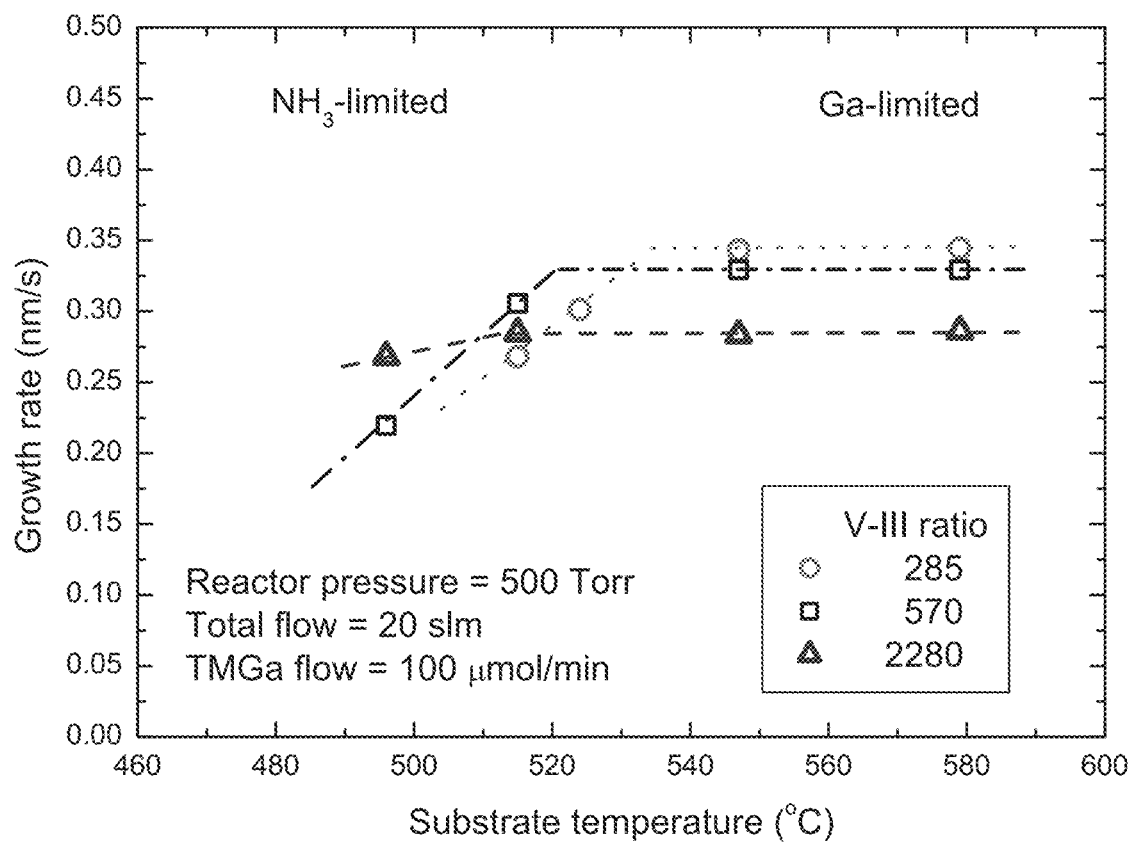
FIG. 18 shows the nucleation layer (NL) growth rate against the growth temperature and V/III ratio.
Figure 19:
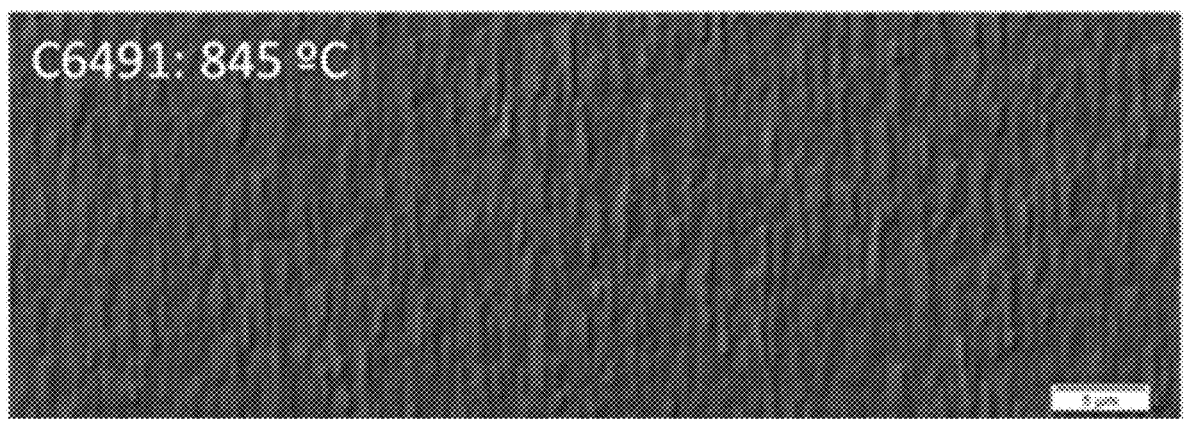
FIGS. 19-27 show changes in surface morphology from Nomarski microscopy images with growth temperature (845, 860 and 880° C.; see FIGS. 19, 22 and 25), and show changes in optical properties from PL versus growth temperature (845, 860 and 880° C.; see FIGS. 20, 21, 23, 24, 26 and 27).
Figure 20:
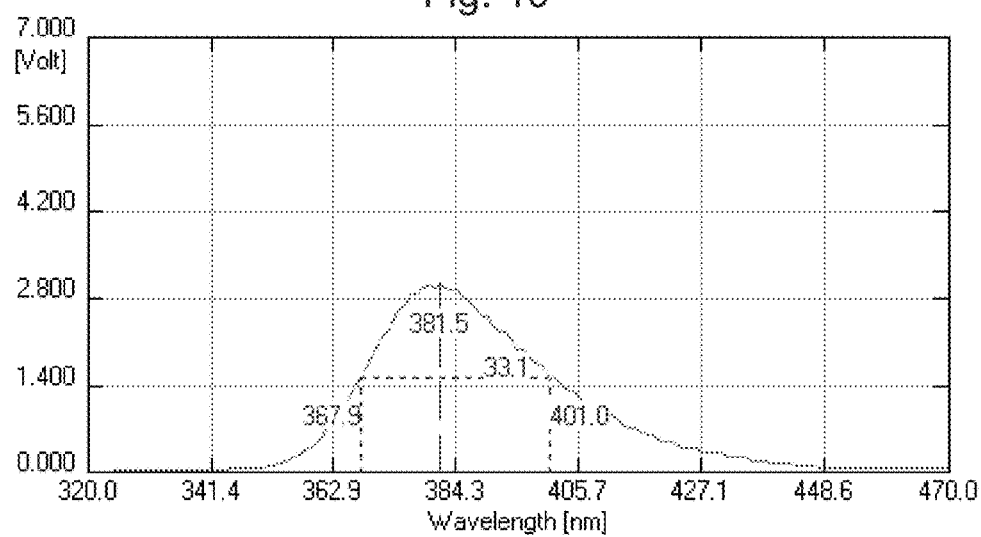
Figure 21:
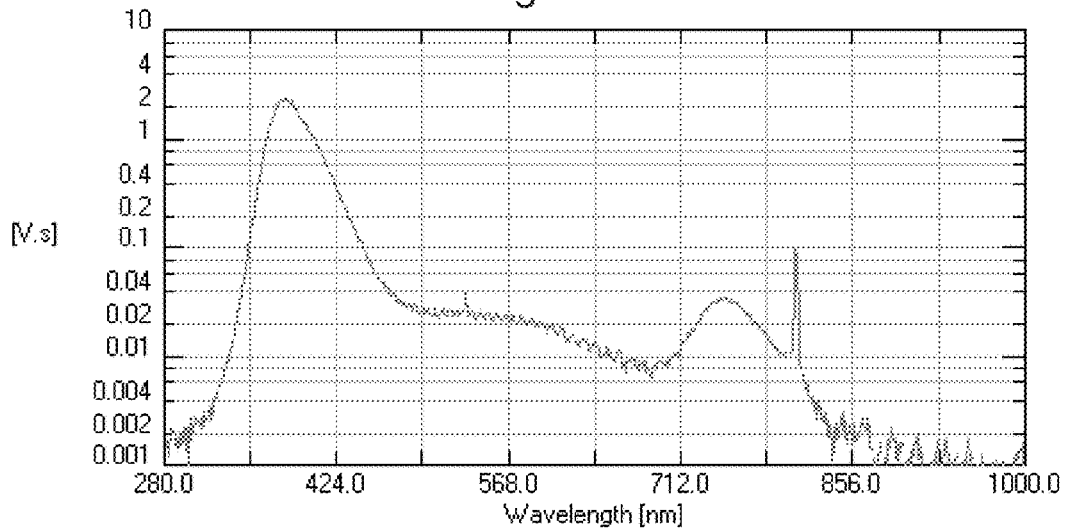
Figure 22:
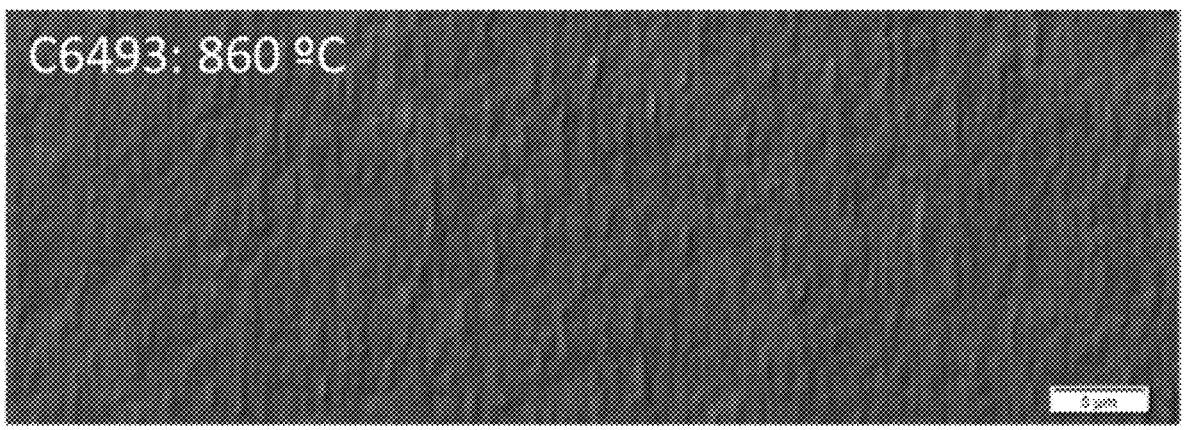
Figure 23:
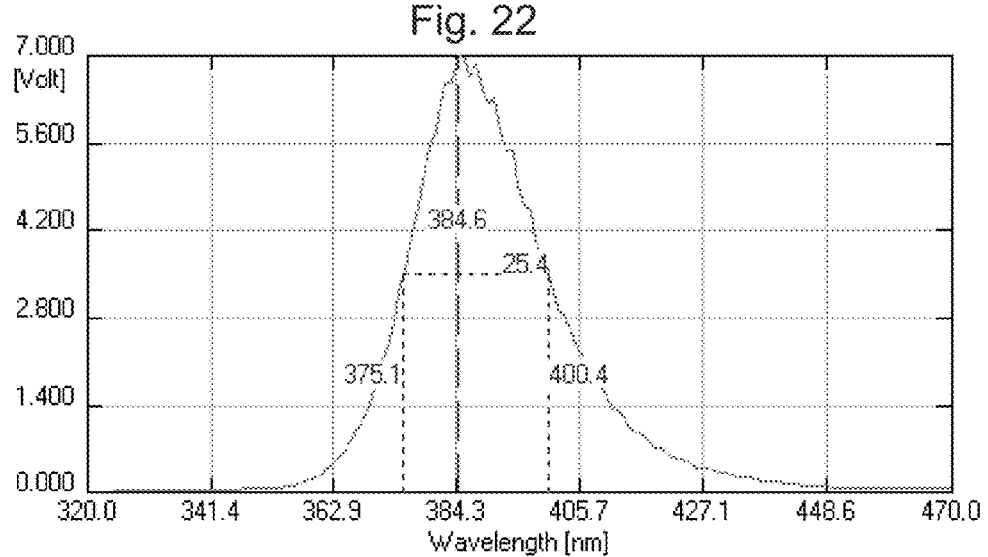
Figure 24:
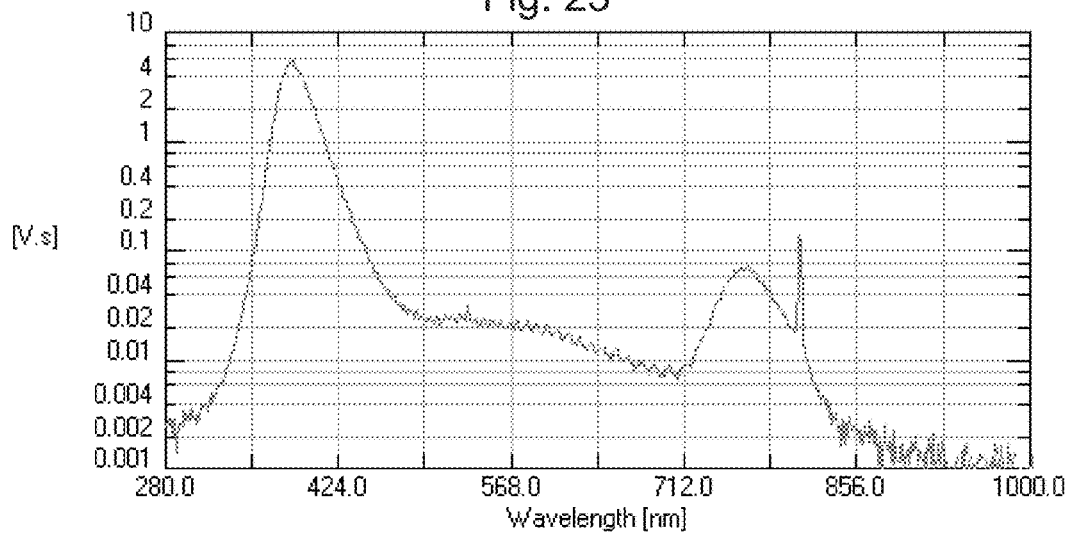
Figure 25:
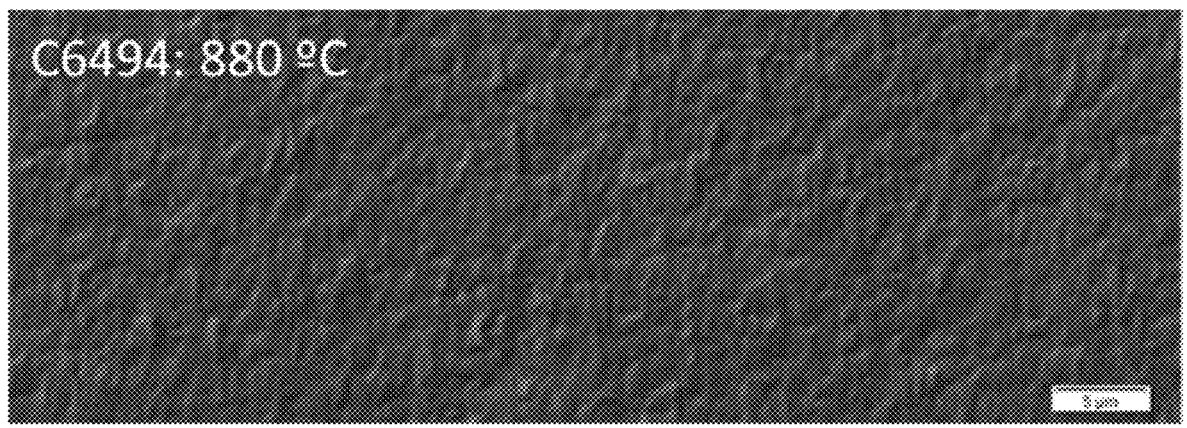
Figure 26:
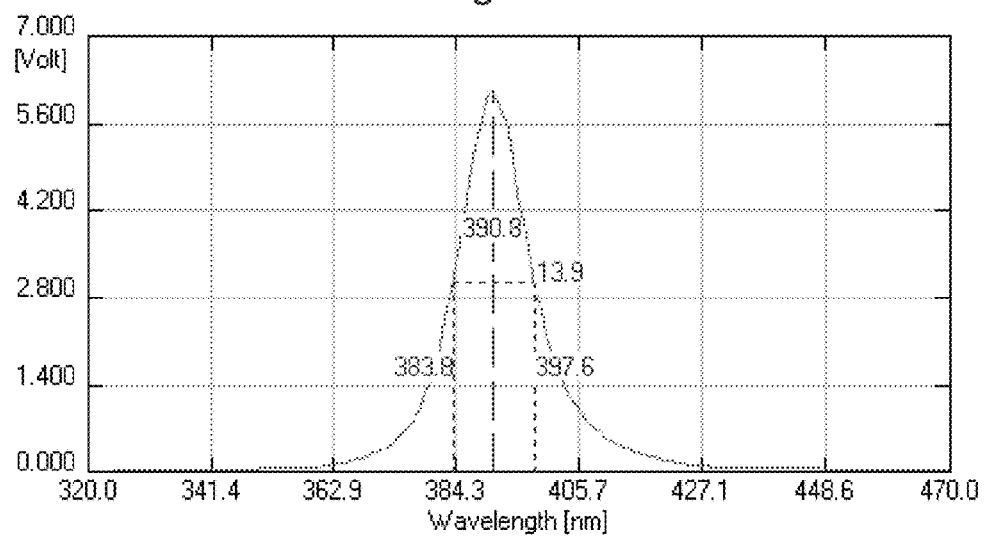
Figure 27:
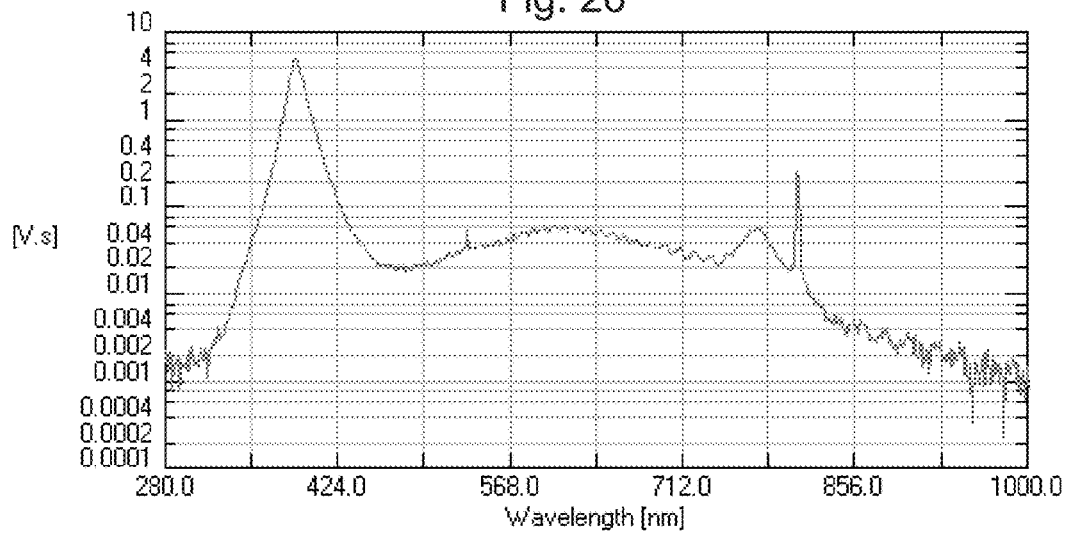

About 40 nm of GaN is deposited at a reactor pressure of 500 Torr and a temperature of 575° C. using a TMG flow rate of 93 micromol/min, an ammonia flow of 0.15 slm. The growth rate is about 0.3 nm/s. The chosen growth temperature lies about 40-60° C. above the point where the growth rate deviates from a constant value to a lower value, entering a regime in which the ammonia flow determines the growth rate. FIG. 18 shows the nucleation layer (NL) growth rate against the growth temperature and V to III ratio.

It is considered that the nucleation layer formation step forms relatively small GaN nuclei, in view of the low temperature.

Note that it is possible to provide a buffer layer between the SiC layer and the GaN layer, if desired, in order to manage the thermal expansion mismatch between these layers. This buffer layer could consist of an AlN layer or an $Al_xGa_{1-x}N$ layers where the composition is varied in a stepwise fashion or is continually graded or a combination of a $AlN/Al_xGa_{1-x}N$ layers.

Recrystallisation

The temperature is ramped at a rate of 1° C./sec to an epilayer growth temperature at a pressure of 100 Torr and an ammonia flow of 0.5 slm, a hydrogen flow of 20 slm. The dwell time is 30 secs. Alternatively, a higher ammonia flow rate may be used, which it is found helps to prevent or reduce roughening of the nucleation layer.

The recrystallization step is intended to allow the crystal quality of the nucleation layer to be improved by smoothening the layer surface and preventing the formation of surface facets, which can lead to wurtzite-like inclusions. During the recrystallization step a supply of N (from $NH_3$)

at the GaN nucleation layer surface is provided, in order to reduce or avoid the decomposition of the GaN nucleation layer at high temperature.

Epilayer Growth

GaN deposition is carried out at a reactor pressure of 300 Torr and a temperature of 860° C. using a TMG flow rate of 140 micromol/min, an ammonia flow of 0.25 slm, giving a growth rate of about 0.5 nm/s. The changes in surface morphology from Nomarski images and PL observed when varying the growth temperature between 845 and 880° C. at a fixed V to III ratio (see FIGS. 19-27) shows the optimum growth temperature is around 860° C.; the sample grown at 860° C. shows a relatively smooth surface and corresponding NBE PL peak is the strongest but also the broadest. At higher growth temperature, the surface roughens, the PL NBE peak narrows significantly but also the Yellow Band (YB) increases in intensity. The temperatures quoted are based on in-situ real time measurements using an emissivity corrected pyrometer. The pyrometer may be calibrated with reference to either the Al/Si eutectic temperature or a calibrated light source such as the AbsoluT system supplied by LayTec AG. The calibration procedure for such emissivity corrected pyrometer systems should be well known to those skilled in the art of MOVPE.

Figure 28:
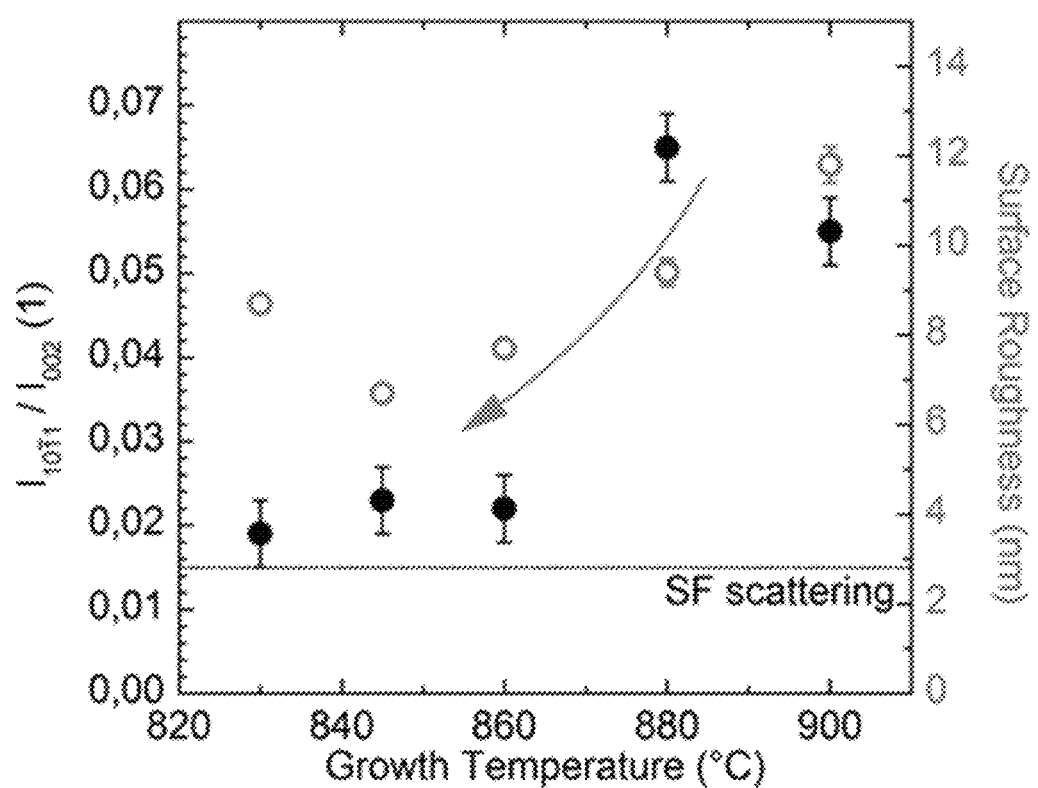
FIG. 28 shows the changes in surface roughness from atomic force microscopy (AFM) (open circles symbols) and hex-to-cubic ratio (filled circles symbols) versus growth temperature.

Changes in surface roughness with growth temperature were confirmed from AFM (see FIG. 28) while the phase purity determined by a hex-to-cubic XRD peak ratio shows that no significant hexagonal inclusions exist in the cubic film grown at a temperature of 860° C. or lower. At higher growth temperature than 860° C., in the growth conditions reported here, the XRD analysis shows an increasing contribution of reflections due to the wurtzite lattice, indicating incorporation of hexagonal inclusions in the cubic zincblende matrix.

Figure 29:
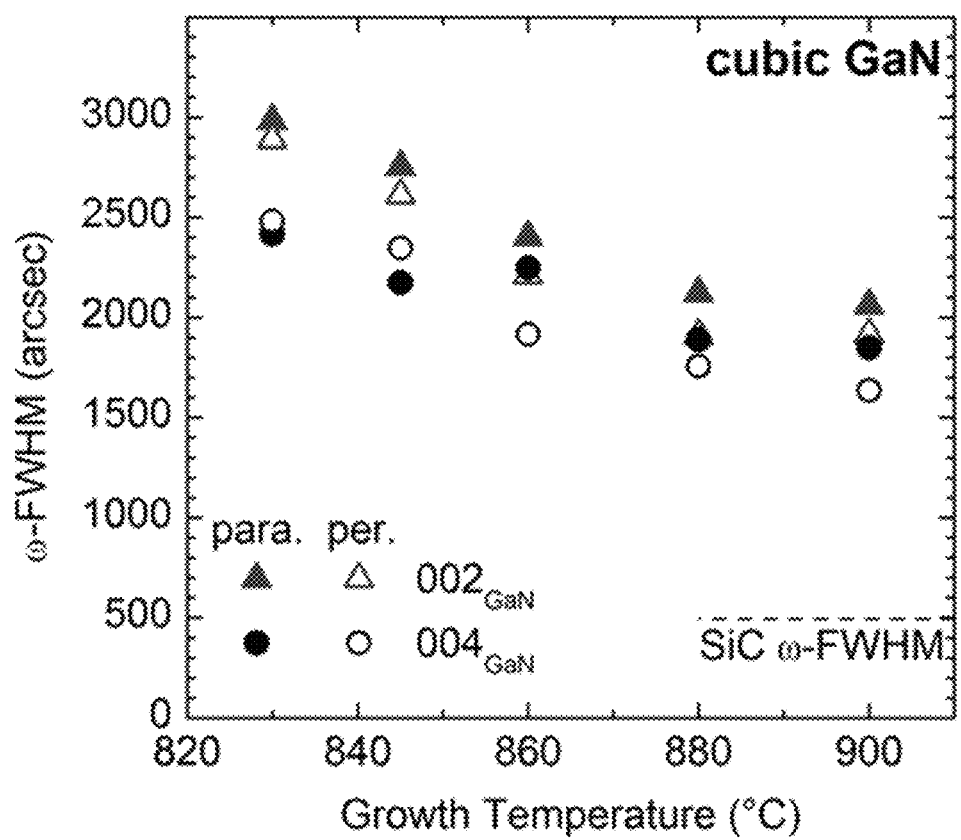
FIG. 29 shows changes in XRD 002 and 004 rocking curve FWHM versus growth temperature.
Figure 30:
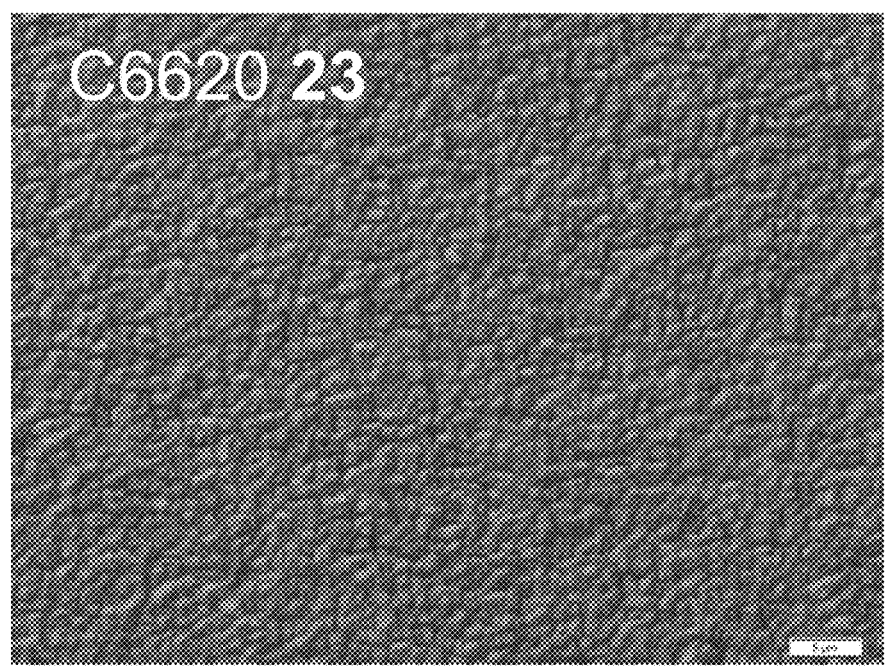
FIGS. 30-41 show changes in surface morphology from Nomarski images with V-to-III ratio (23 to 152 range) at a constant growth temperature of 880° C. (see FIGS. 30, 33, 36 and 39), and show changes in optical properties from PL with V-to-III ratio (23 to 152 range) at a constant growth temperature of 880° C. (see FIGS. 31, 32, 34, 35, 37, 38, 40 and 41).
Figure 31:
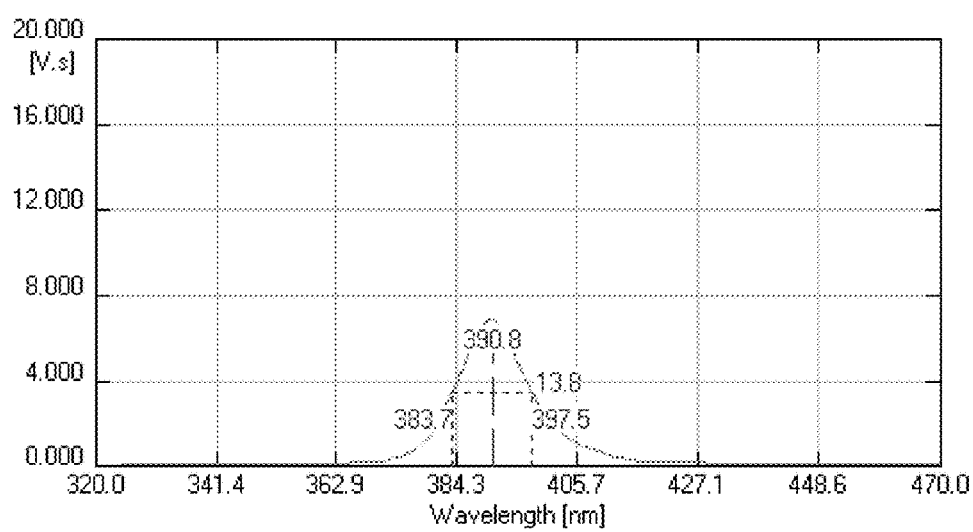
Figure 32:
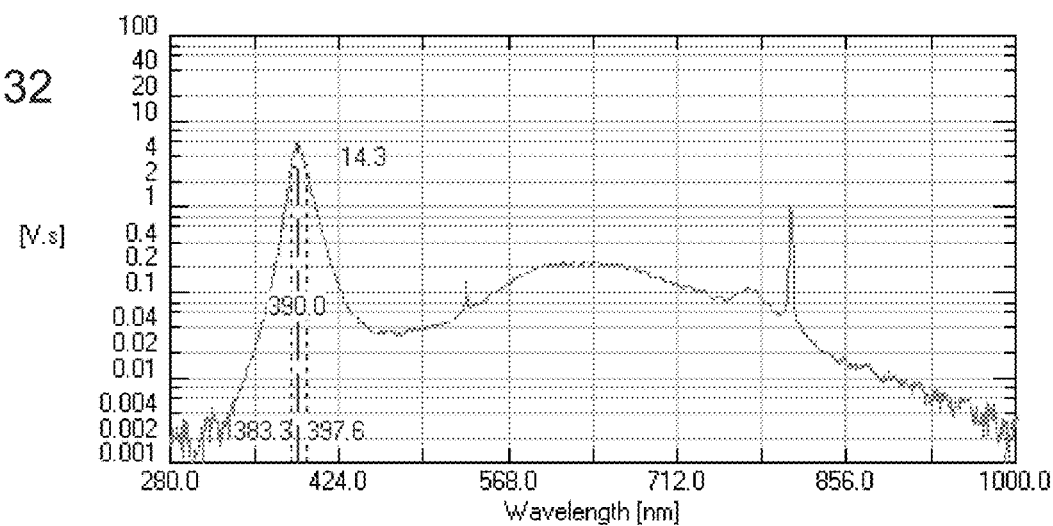
Figure 33:
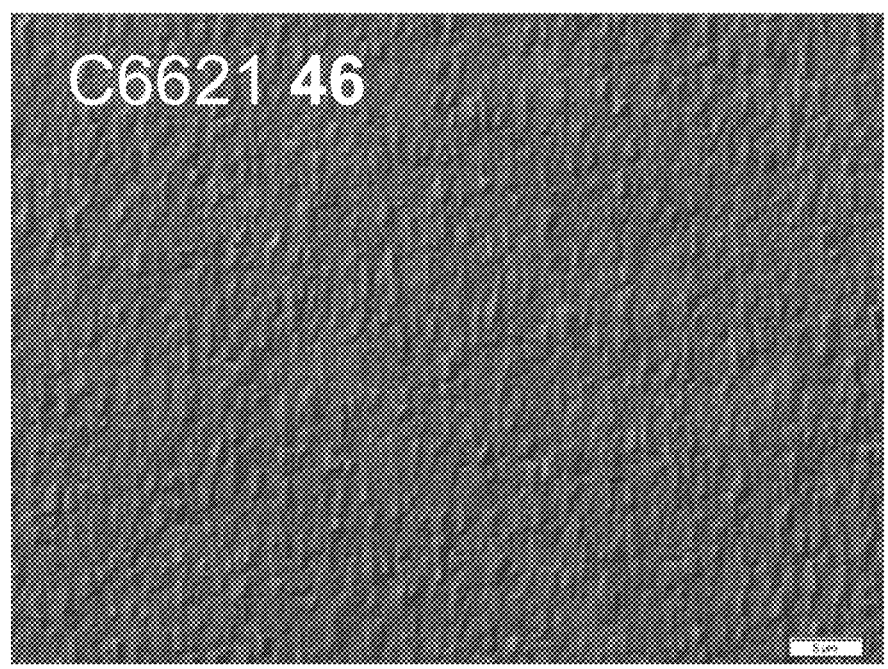
Figure 34:
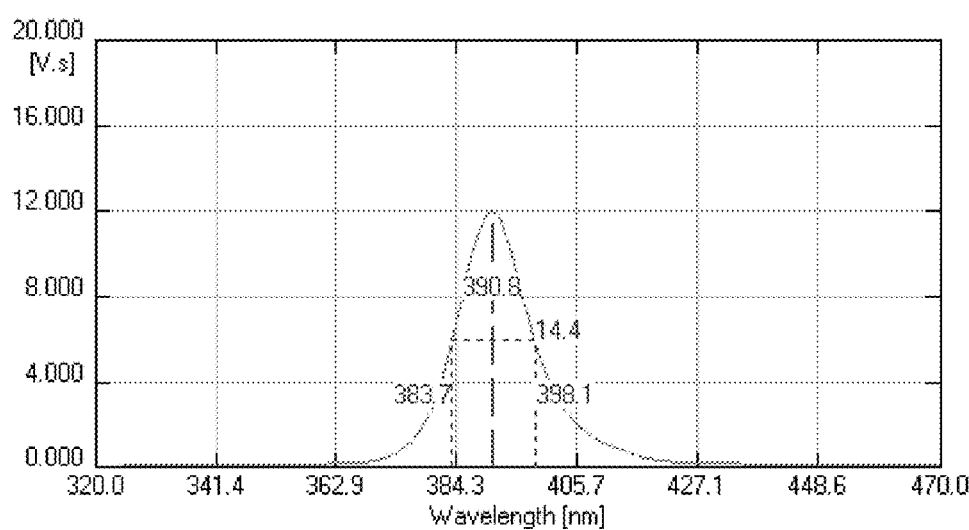
Figure 35:
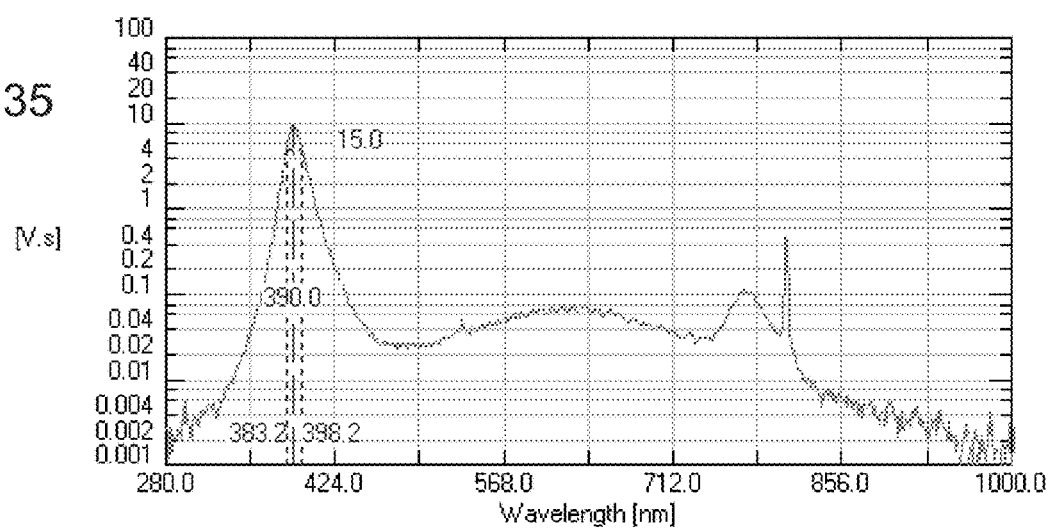
Figure 36:
Figure 37:
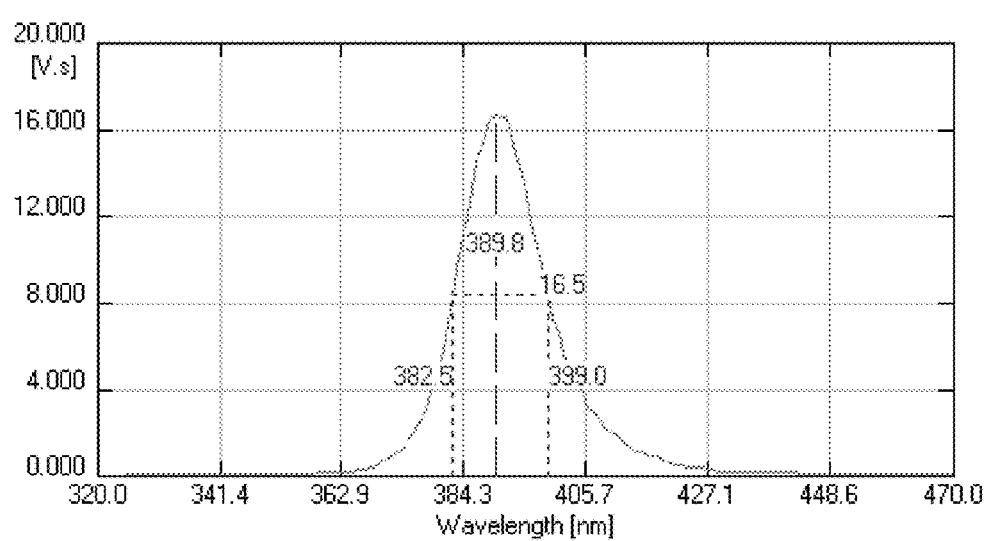
Figure 38:
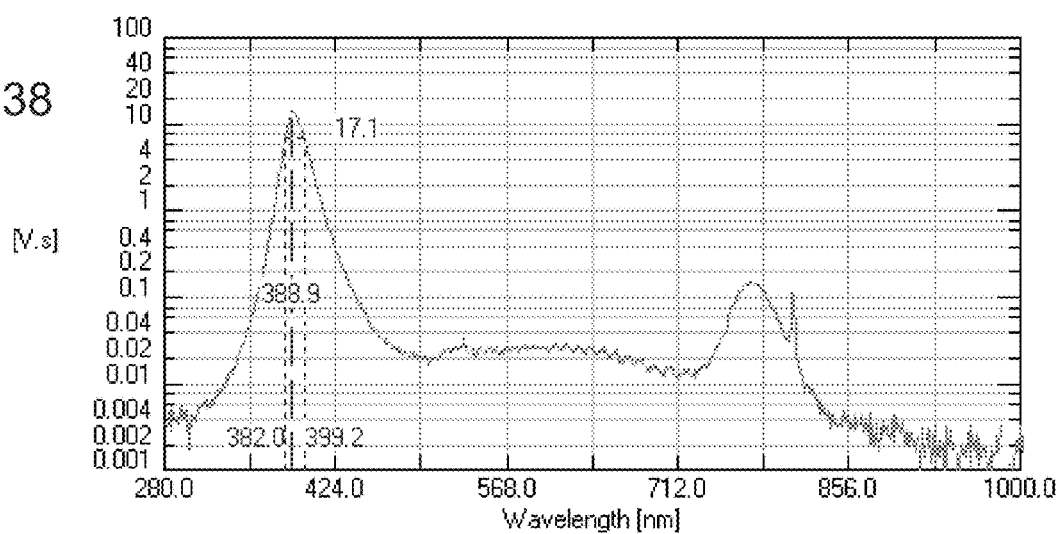
Figure 39:
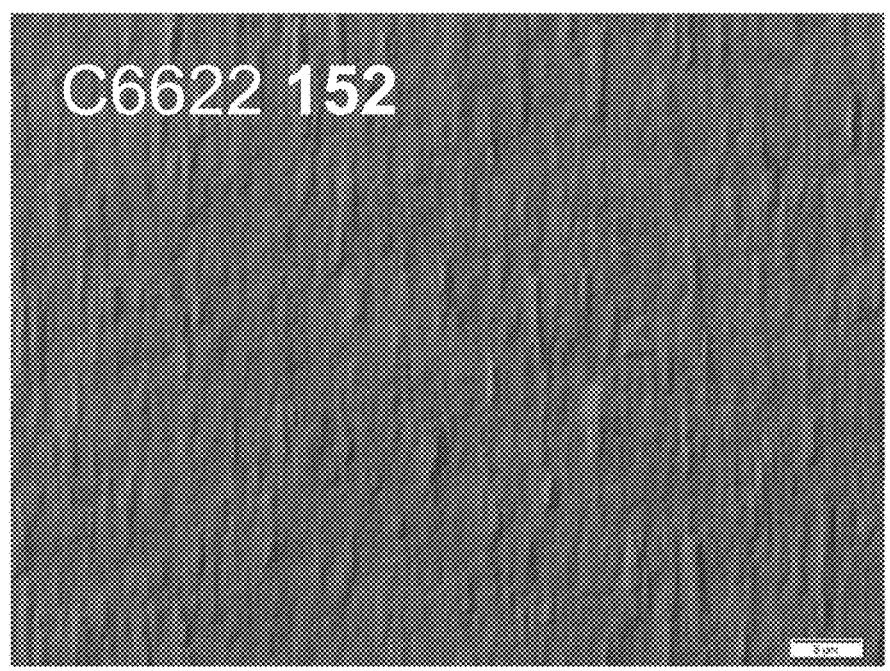
Figure 40:
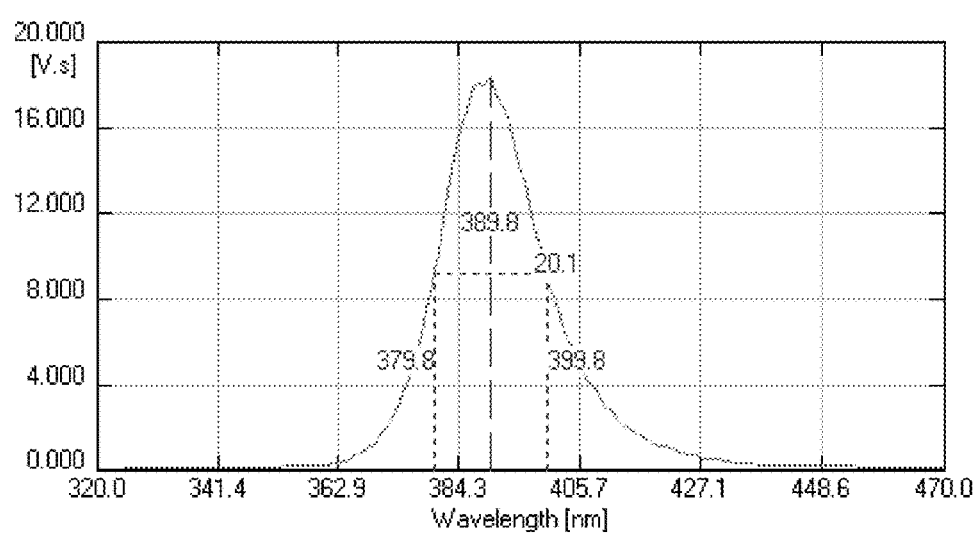
Figure 41:
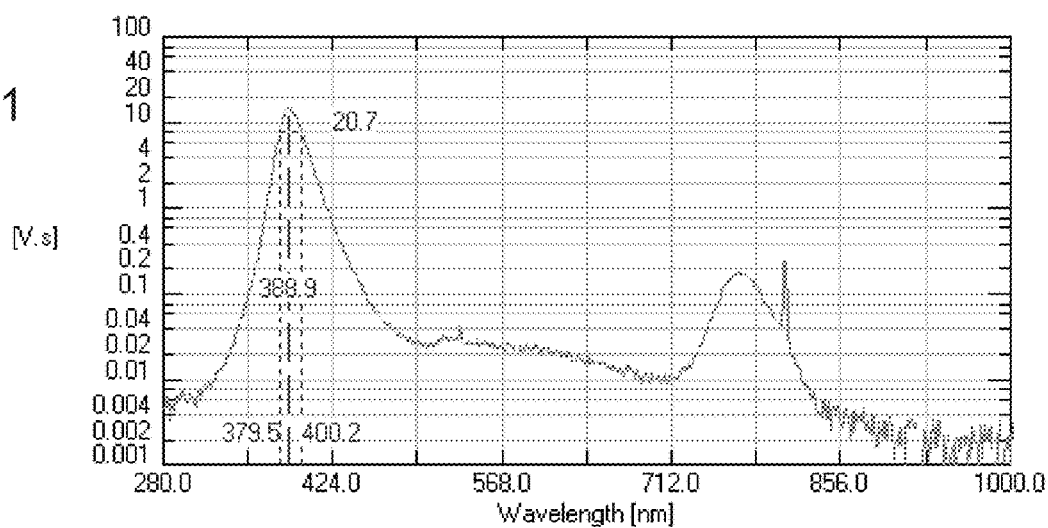
Figure 42:
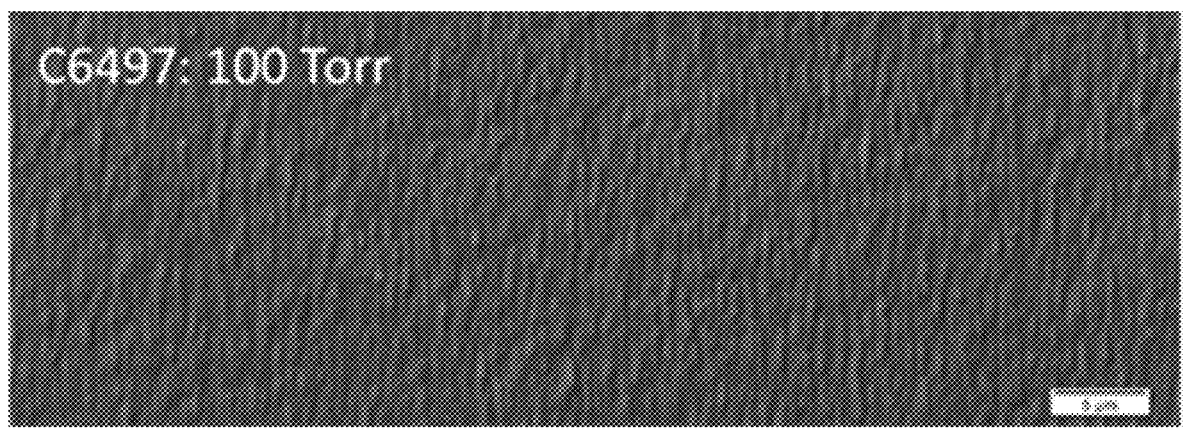
FIGS. 42-50 show changes in surface morphology from Nomarski images with growth pressure (100, 300 and 500 Torr; see FIGS. 42, 45 and 48), and show changes in optical properties from PL with growth pressure (100, 300 and 500 Torr; see FIGS. 43, 44, 46, 47, 49 and 50).
Figure 43:
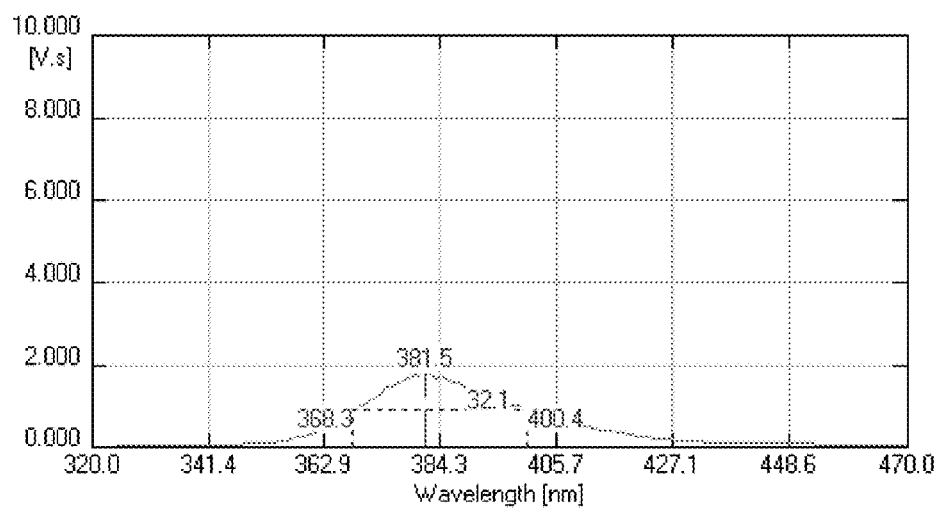
Figure 44:
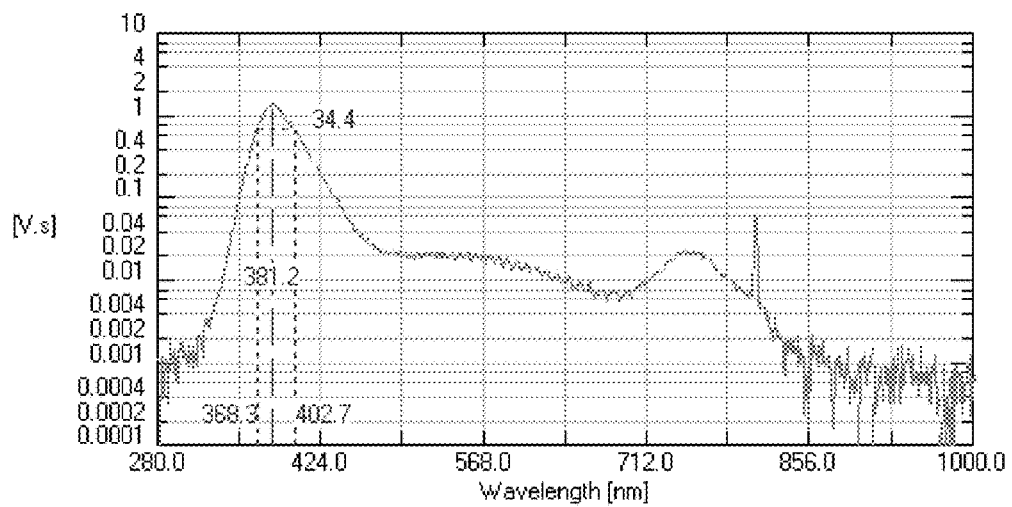
Figure 45:
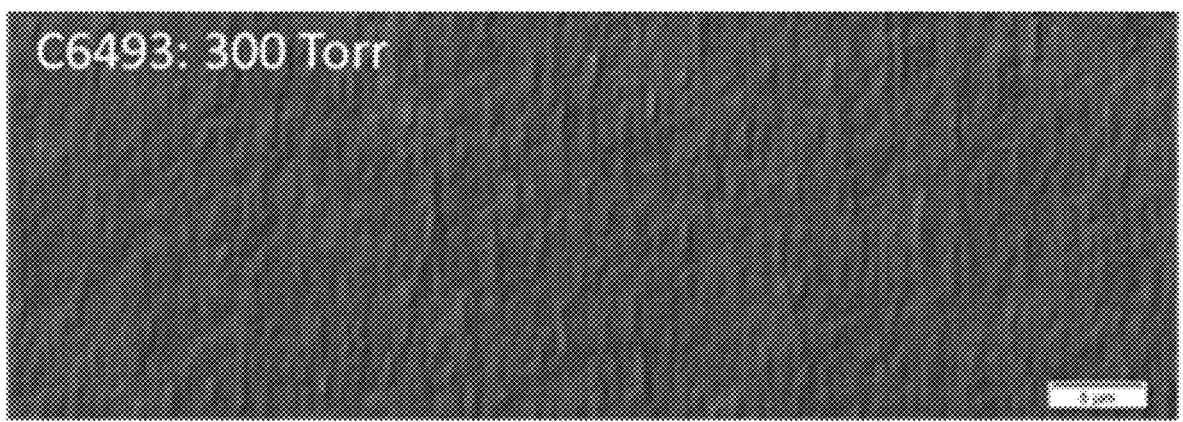
Figure 46:
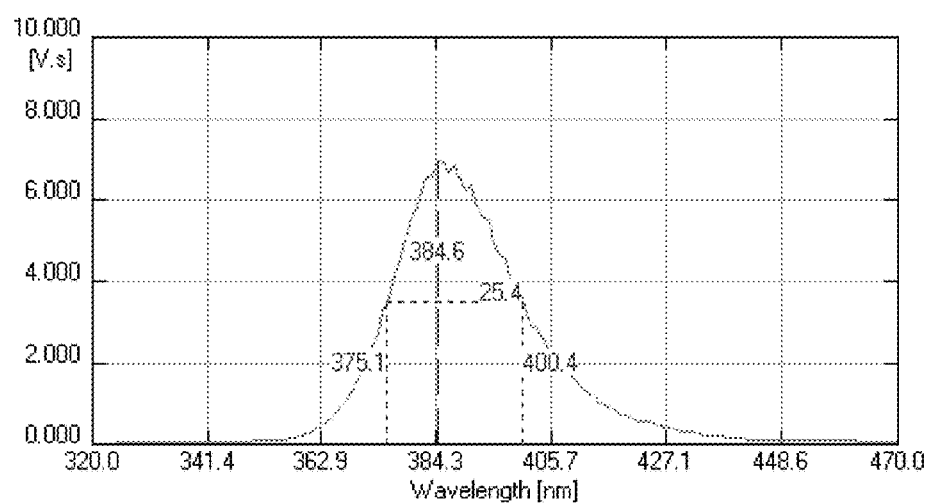
Figure 47:
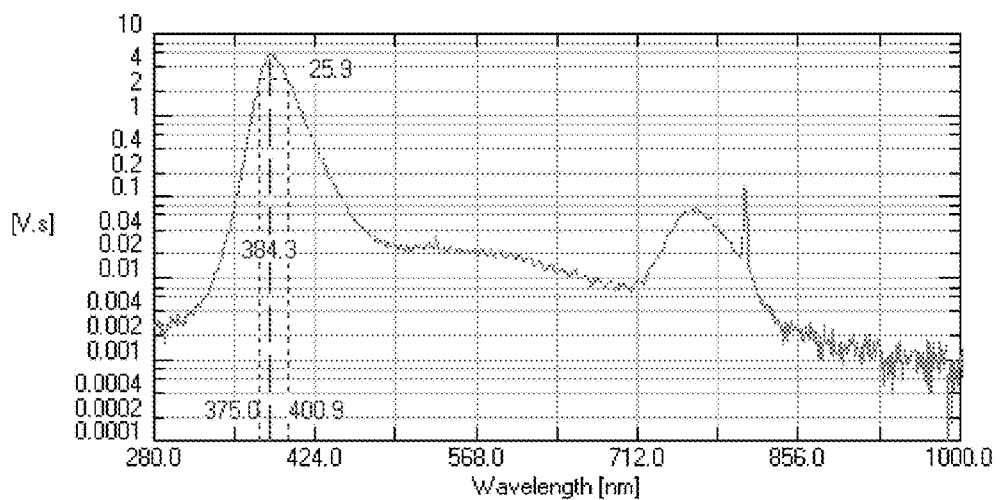
Figure 48:
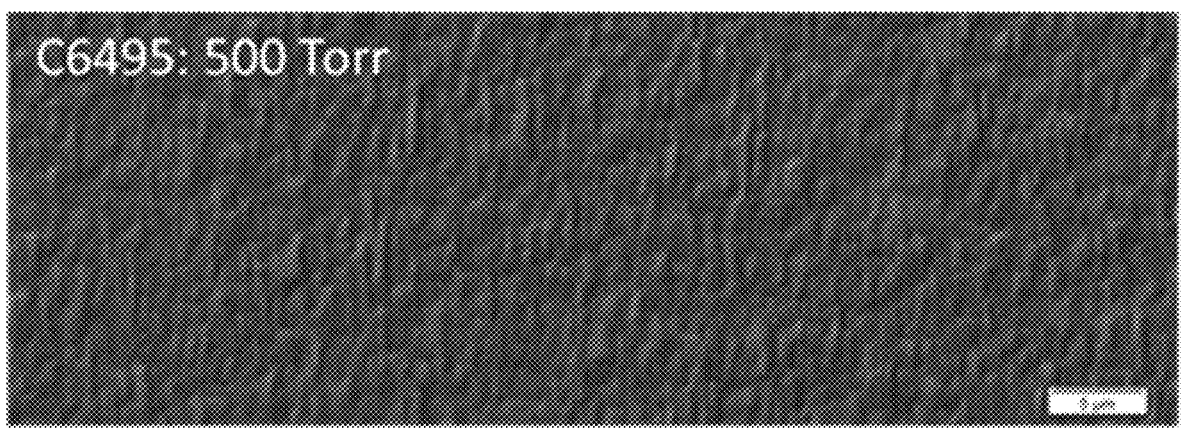
Figure 49:
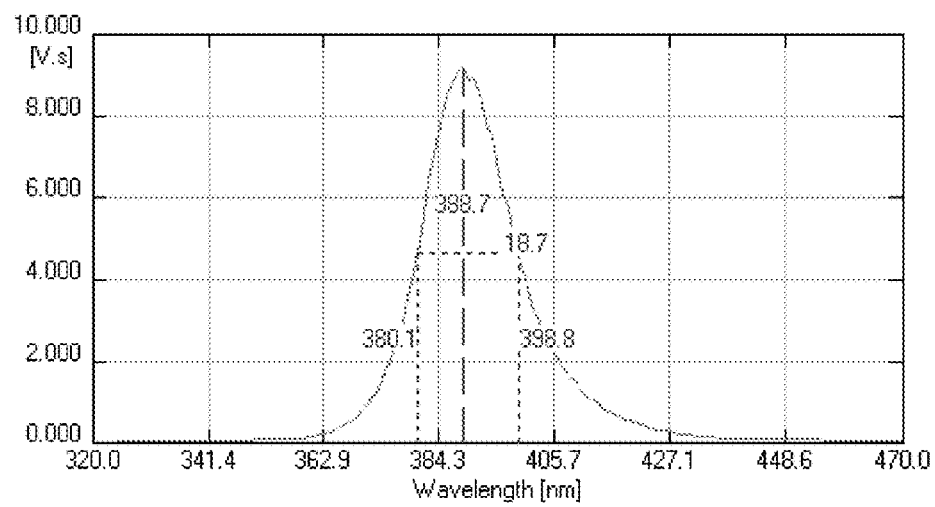
Figure 50:
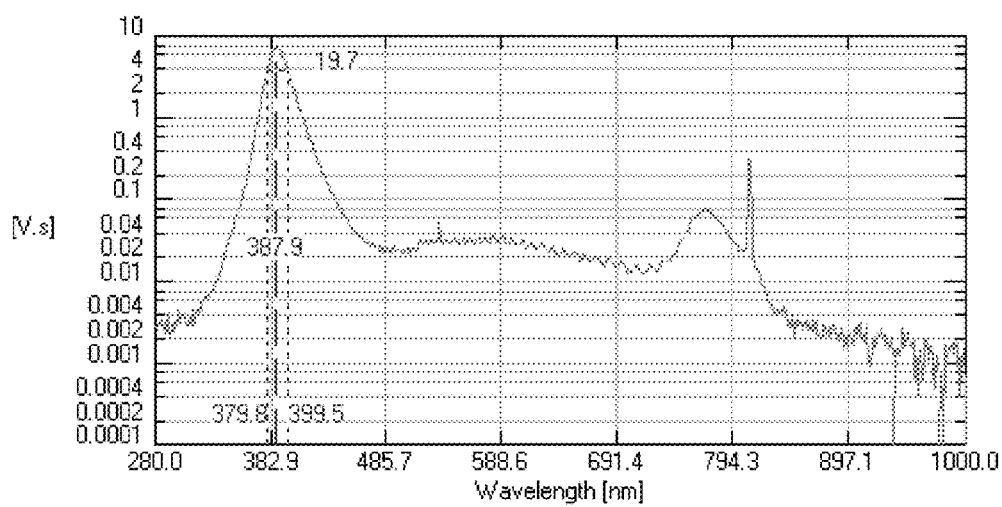
Figure 51:
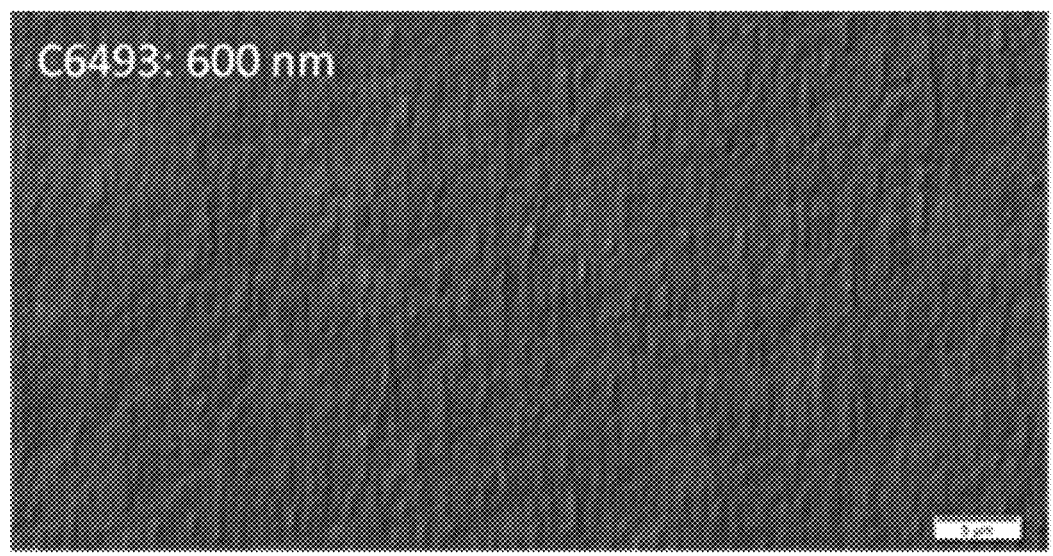
FIGS. 51-56 show changes in surface morphology from Nomarski images with layer thickness (examples for 600 and 750 nm layer thicknesses are shown) grown at T=860° C., P=300 Torr and V/III=80 (see FIGS. 51 and 54), and show optical properties from PL with layer thickness (examples for 600 and 750 nm layer thicknesses are shown; see FIGS. 52, 53, 55 and 56).
Figure 52:
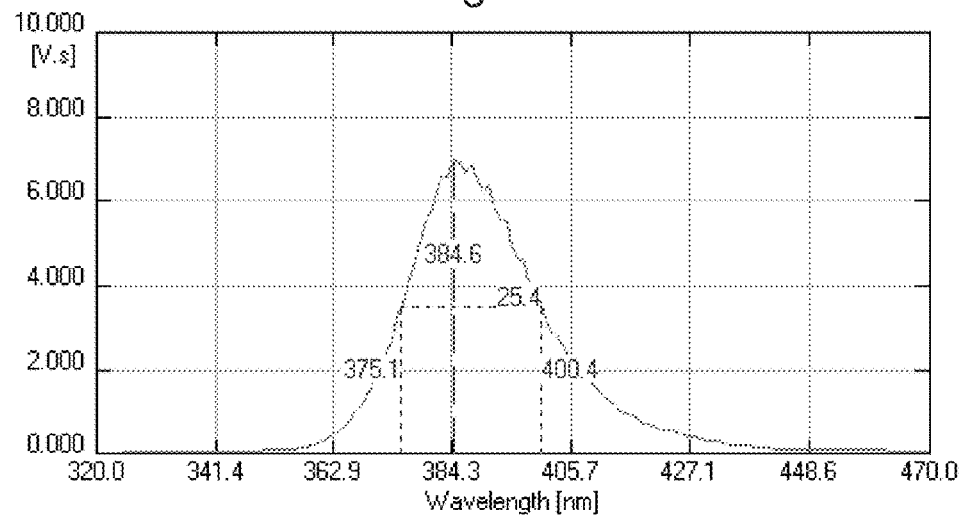
Figure 53:
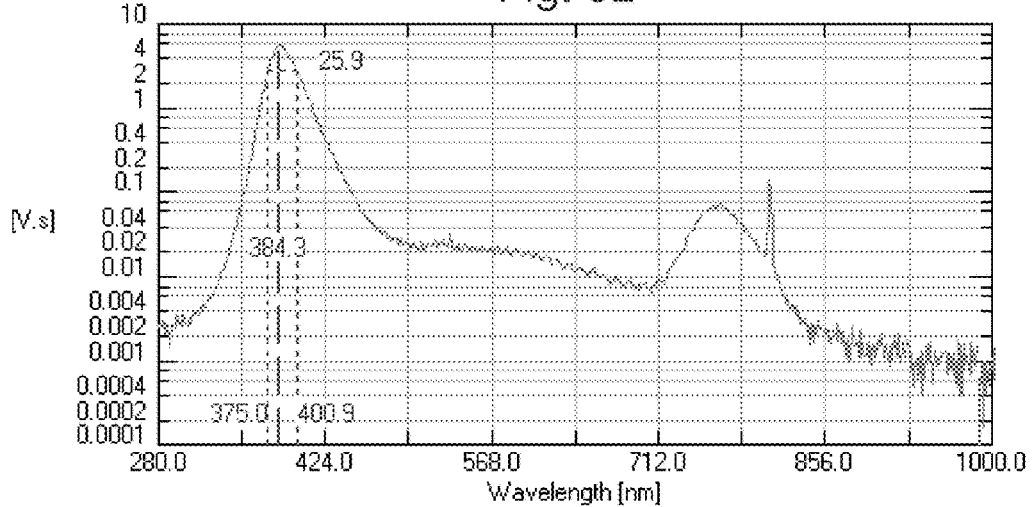
Figure 54:
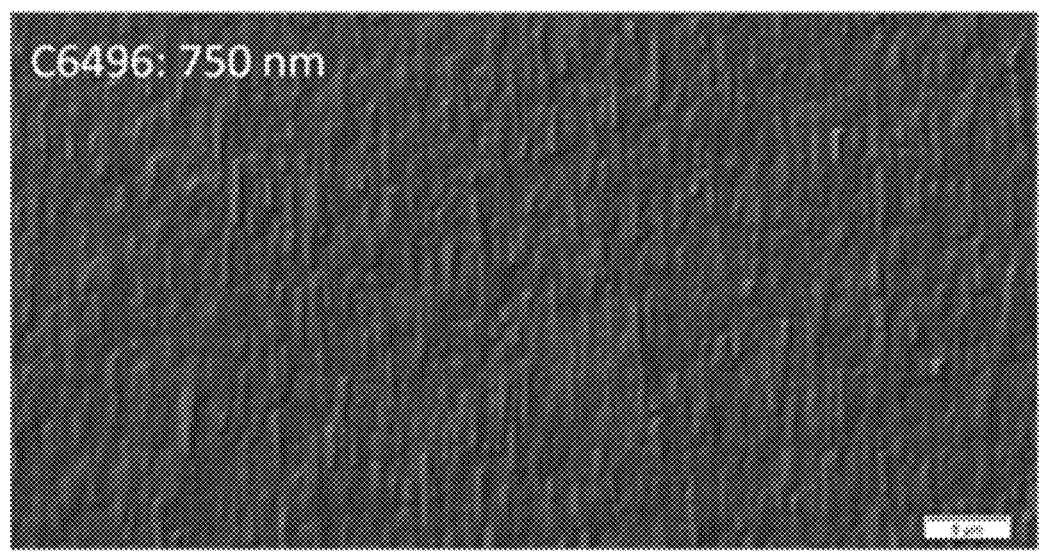
Figure 55:
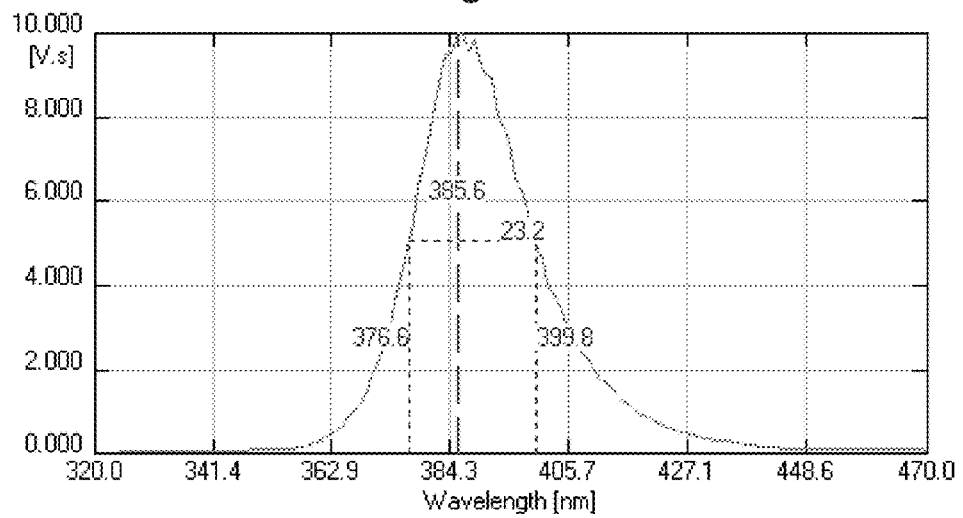
Figure 56:
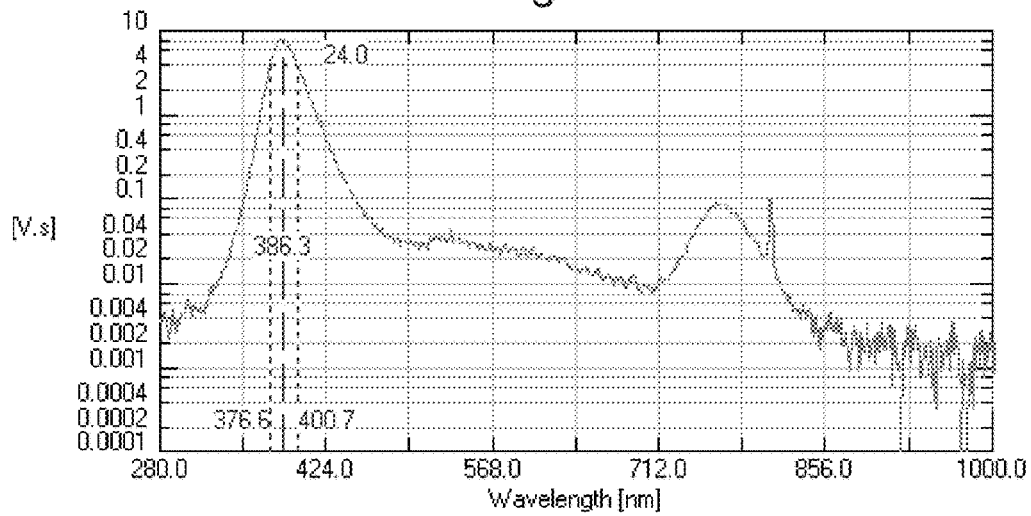

The narrowing of the PL NBE peak with increasing growth temperature may be correlated with the same trend shown by the FWHM values of the 002 and 004 XRD rocking curves (see FIG. 29).

The changes in surface morphology and PL spectra observed when varying the ratio of ammonia input flow to the Ga-precursor TMG input flow rate (V-to-III ratio, see FIGS. 30 to 41) show an improvement of the surface morphology with higher ammonia flows, as well as an increase in the PL NBE peak intensity and its FWHM, while the intensity of the YB decreases.

The changes in surface morphology and PL observed when varying the growth pressure from 100 to 300 to 500 Torr (see FIGS. 42-50) are similar in effect (from a surface morphology and PL perspective) to a corresponding increase in growth temperature of about 15 to 30° C.

The surface morphology and PL spectra when increasing the layer thickness show a roughening of the surface but an increase in the PL NBE peak intensity and a decrease of the FWHM. Examples for 600 and 750 nm thick layers are shown in FIGS. 51-56.

N-Type Doping

When incorporated into the GaN lattice, Si acts as an electron donor making the GaN n-type. We used as the Si precursor silane ($SiH_4$) diluted to 50 ppm in hydrogen. Other n-type dopant sources are possible, such as disilane ($Si_2H_6$), germane ($GeH_4$), digermane ($Ge_2H_6$), or oxygen-containing precursors. N-type conductivity was observed for Si doped layers and good quality Ohmic metal contacts have been demonstrated on the Si-doped GaN. The surface morphology of the layer and the PL NBE peak and yellow luminescence band are largely unaffected for silane flow rates up to 70 sccm (see FIGS. 57-61). At higher flow rates, surface pits appear (see FIG. 62). Optical properties of the Si-doped GaN are shown in FIGS. 63-68, with the silane flow rates also indicated.

Figure 69:
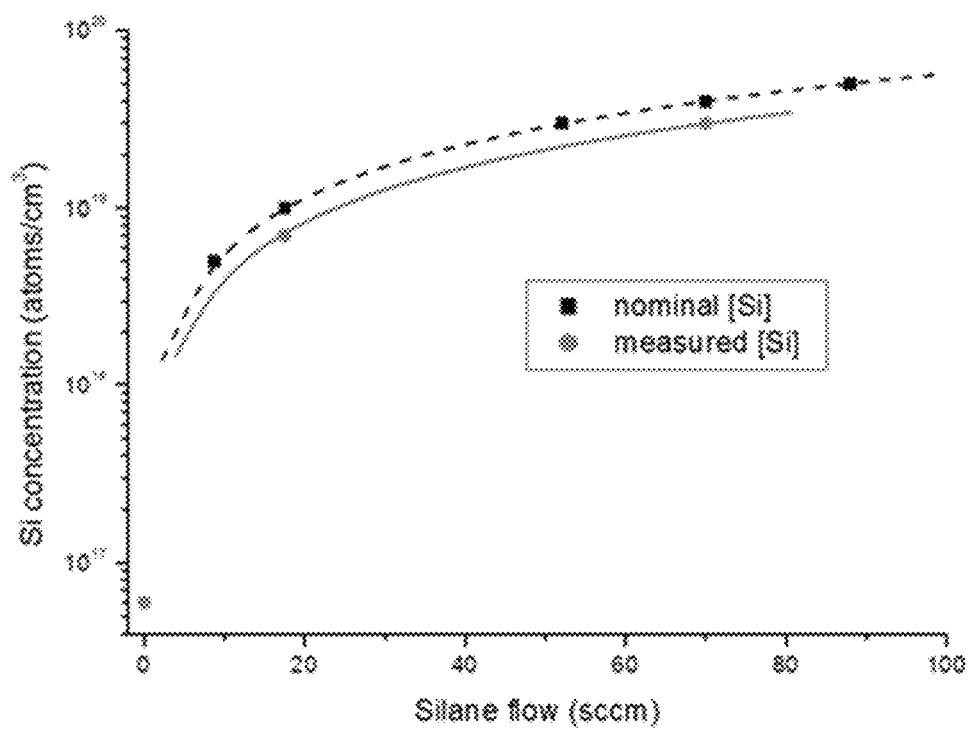
FIG. 69 shows the Si concentration in GaN films as measured by SIMS, based on the silane flow rate.

The silane input flow scales linearly with the Si concentration measured in the bulk using SIMS (see FIG. 69).

InGaN/GaN Quantum Wells

InGaN deposition occurred at a reactor pressure of 300 Torr and a temperature of between 700 and 800 QC using a TMG flow rate of 8.2 micromol/min, TMI flow rate of 9.7 micromol/min, an ammonia flow of 446 mmol/min culmination in a growth rate of about 0.8 nm/min). For the GaN barrier growth the same conditions were used except for the TMI flow.

The InGaN growth temperature to achieve a PL peak at 450 nm for a nominal Quantum Well (QW) width of 2 nm is very similar to that used for a standard wurtzite c-plane structure with the same well width. However by increasing the QW width to 10 nm the emission wavelength can be extended to 540 nm at the same growth temperature.

Figure 70:
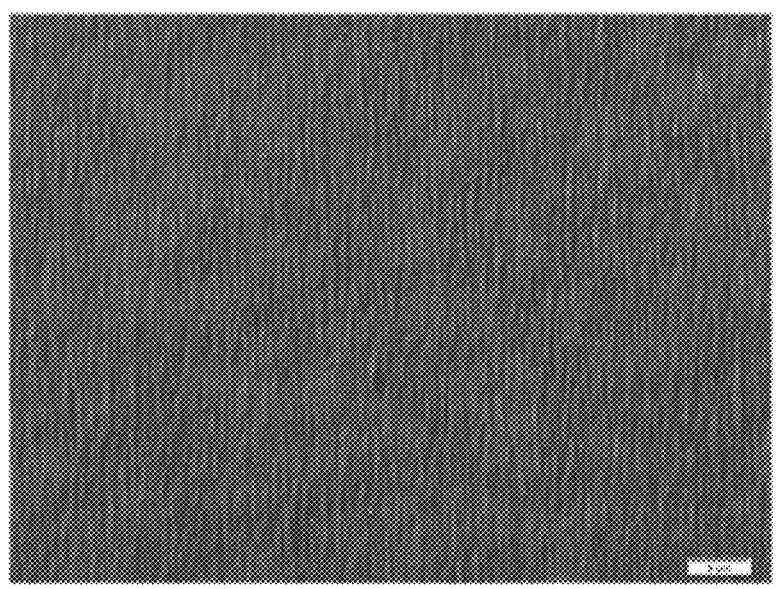
FIG. 70 shows the morphology from Nomarski imaging of a typical green QW structure according to an embodiment of the invention, taken at the centre of an individual mesa.
Figure 71:
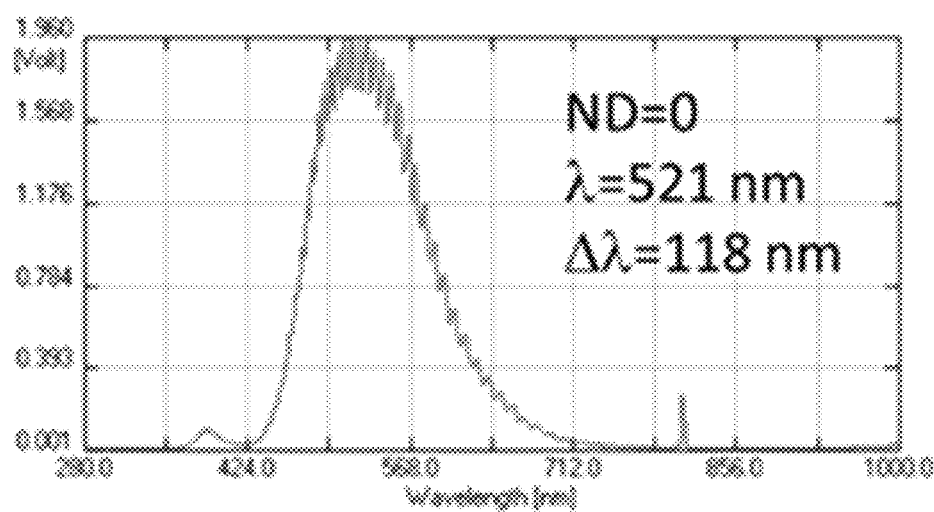
FIGS. 71 and 72 show optical properties from PL of the green QW structure in FIG. 70 at high and low laser power, respectively.
Figure 72:
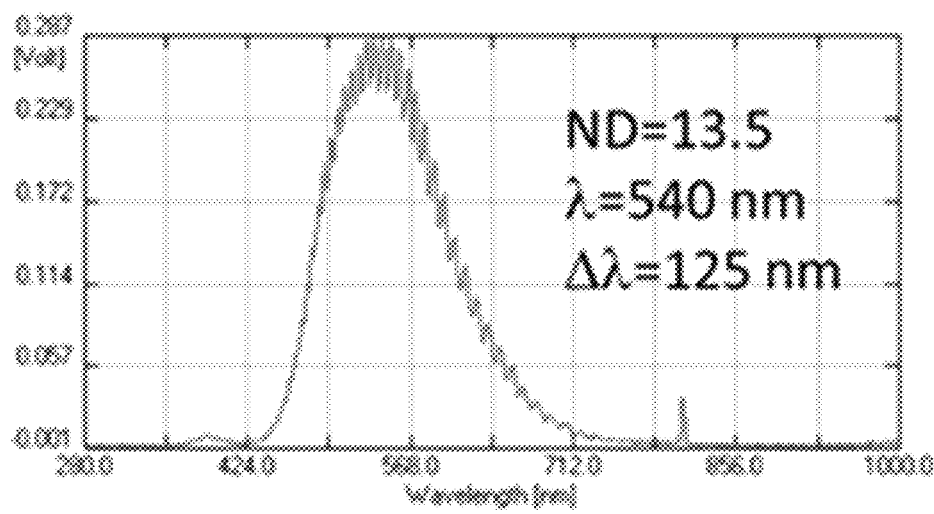
Figure 84:
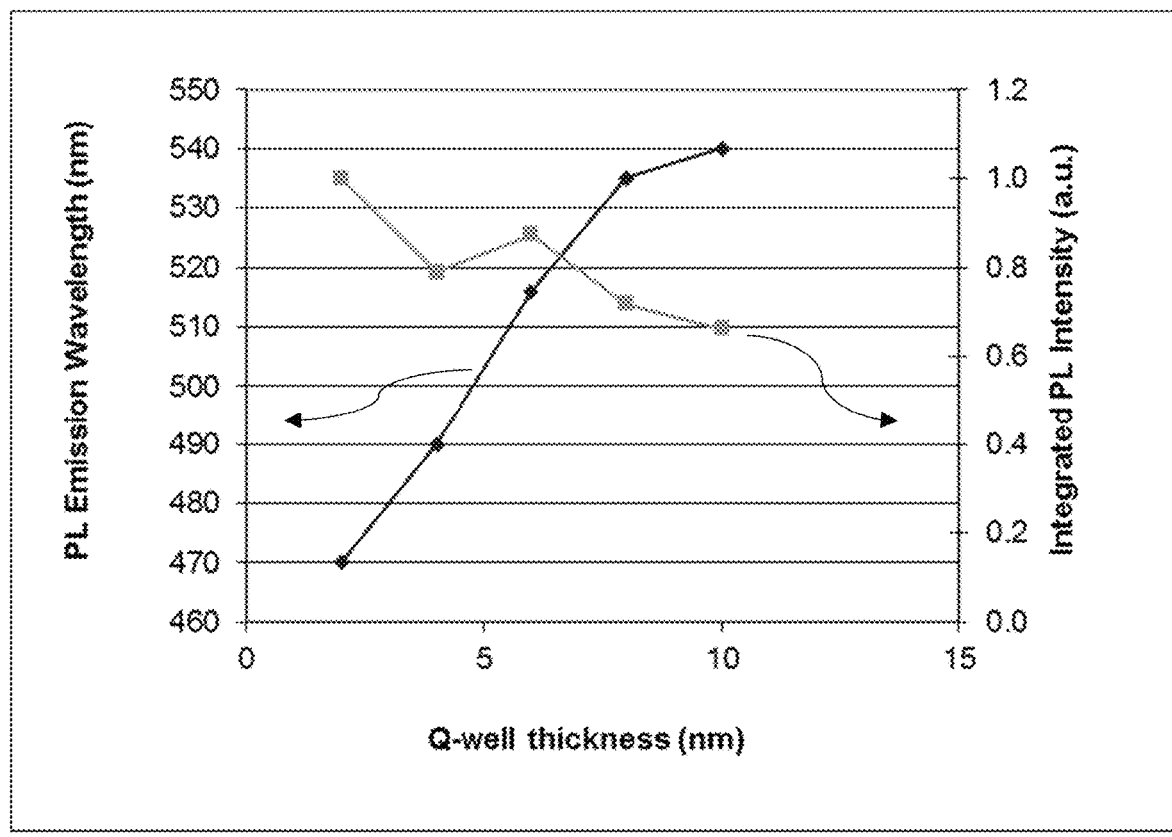
FIG. 84 shows a plot of PL emission wavelength and integrated PL intensity against QW thickness.

FIG. 70 shows an optical micrograph of a typical green QW structure and FIGS. 71 and 72 show the PL spectra take at high and low laser excitation power, respectively. The strong, broad InGaN peak at 521 nm shifts to 540 nm as the excitation density is increased. The structure includes 5 quantum wells nominally 10 nm thick formed at 300 Torr. It was observed that for a constant laser excitation power the peak emission wavelength increases approximately linearly with increasing well width up to a thickness of 8 nm when saturation commenced, as demonstrated in FIG. 84. The PL peak intensity shows a small decrease as the well width increases, but much less than might be expected in wurzite GaN Q-wells due to the green-gap.

Texture Analysis

Polytype Identification

The phases and orientations present in a GaN thin film can be identified by XRD texture analyses, where one uses the different selection rules for the appearance of a reflection in both the zincblende phase and the wurtzite phase. While for some diffraction angles 2θ reflections from both phases are superimposed, there are other, particularly suitable diffraction angles for which reflections from only one of the two phases are observable at once. For example, the wurtzite 0002 and zincblende 111 reflections, which both occur for 2θ of about 34.5° are unsuitable, as are the wurtzite 11-20 and the zincblende 220 reflections (2θ of about 57.8°). Herres et al (1999) proposed the use of the cubic 200 (2θ of about 40.0°) and the hexagonal 10-12 (2θ of about 48.1°) reflections for predominantly $(111)_{zb}$ and $(0001)_{wz}$ oriented films respectively, which has been shown to give reasonable results. However, for predominantly (001) oriented cubic films one should rather use different zincblende reflections, as the {100} reflections from the site facets are often very weak and superimposed by surface scattering effects, making the identification of the in-plane relations of the films difficult. There are several other suitable reflection combinations, from which we use for texture analysis for example the $113_{zb}$ reflections (2θ of about 69.0°) and $1-103_{wz}$ (2θ of about 63.4°), as they are well separated in reciprocal space and as the characteristic diffraction patterns are relatively simple to interpret.

Texture Mapping

Figure 2:
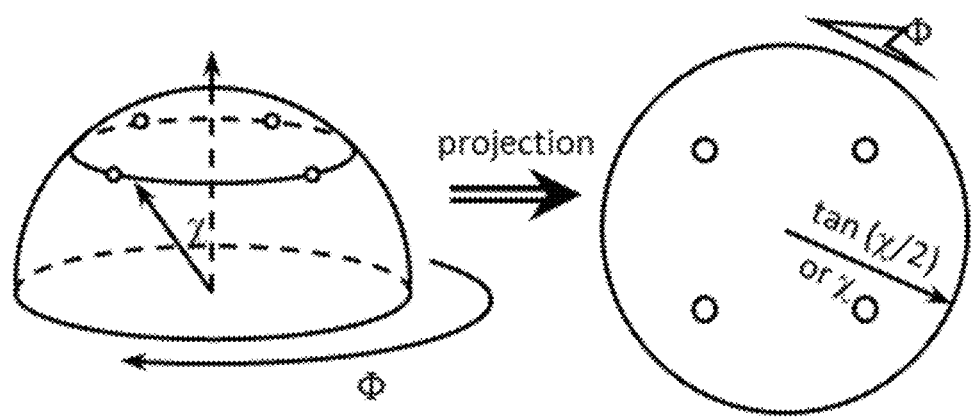
FIG. 2 schematically explains the measurement geometry to map a texture in reciprocal space and its projection onto a two-dimensional map.
Figure 3:
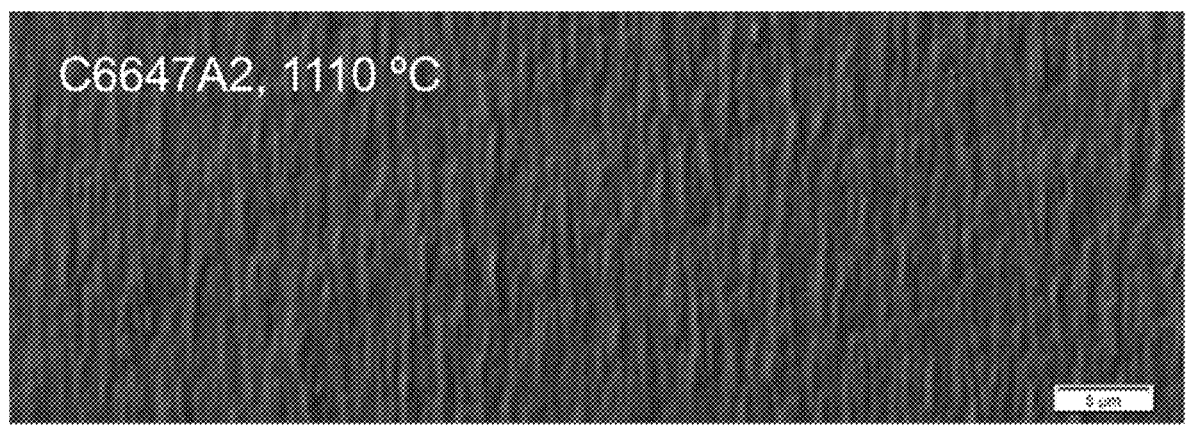
FIGS. 3-17 provide Nomarski microscopy images showing the effect of nitridation temperature on the surface morphology of the zincblende GaN film (see FIGS. 3, 6, 9, 12 and 15), and show changes in optical properties from photoluminescence (PL) versus nitridation temperature (see FIGS. 4, 5, 7, 8, 10, 11, 13, 14, 16 and 17).
Figure 4:
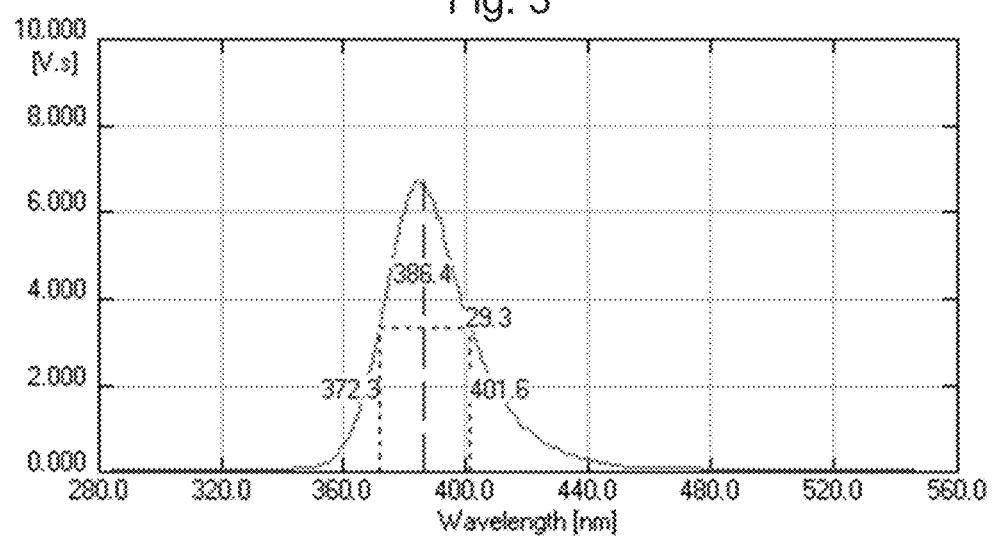
Figure 5:
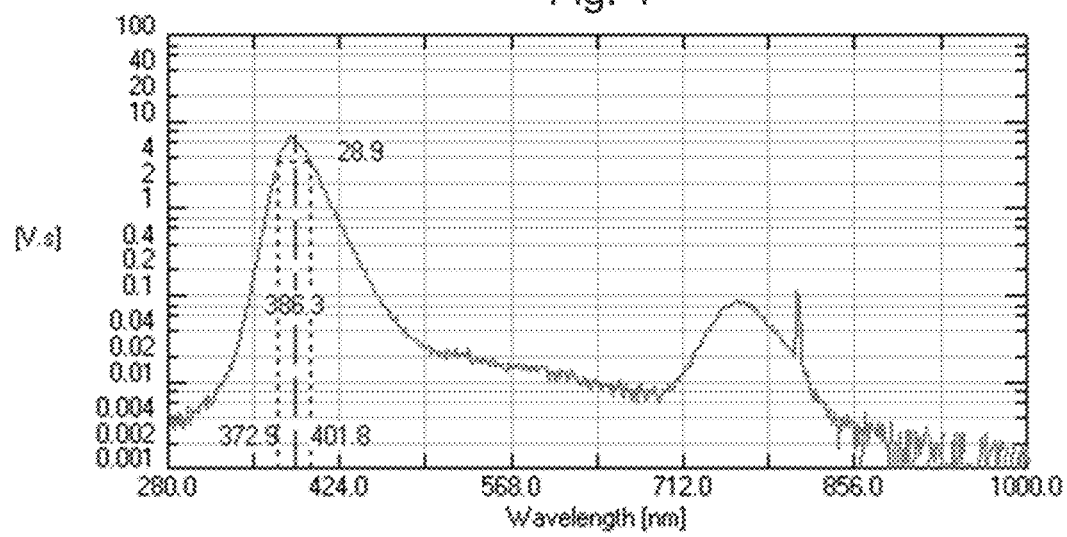
Figure 6:
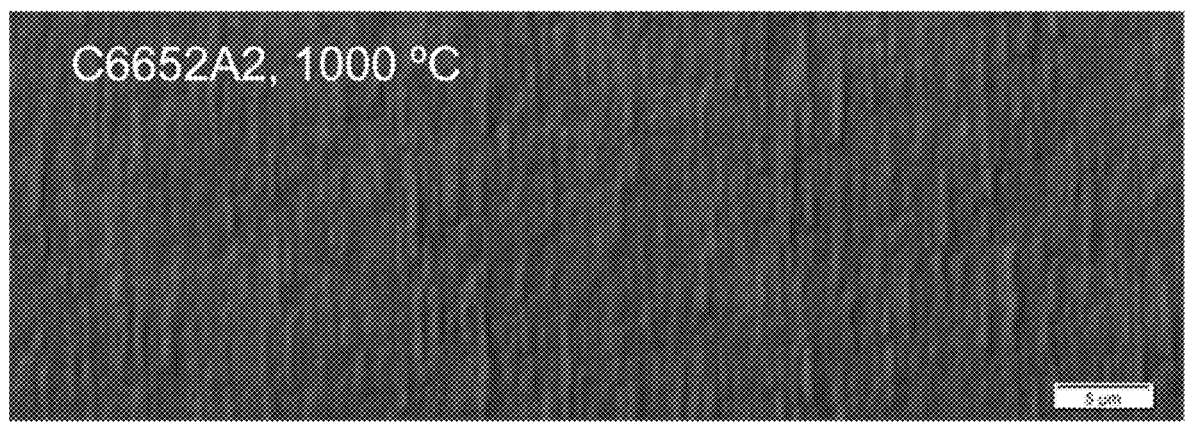
Figure 7:
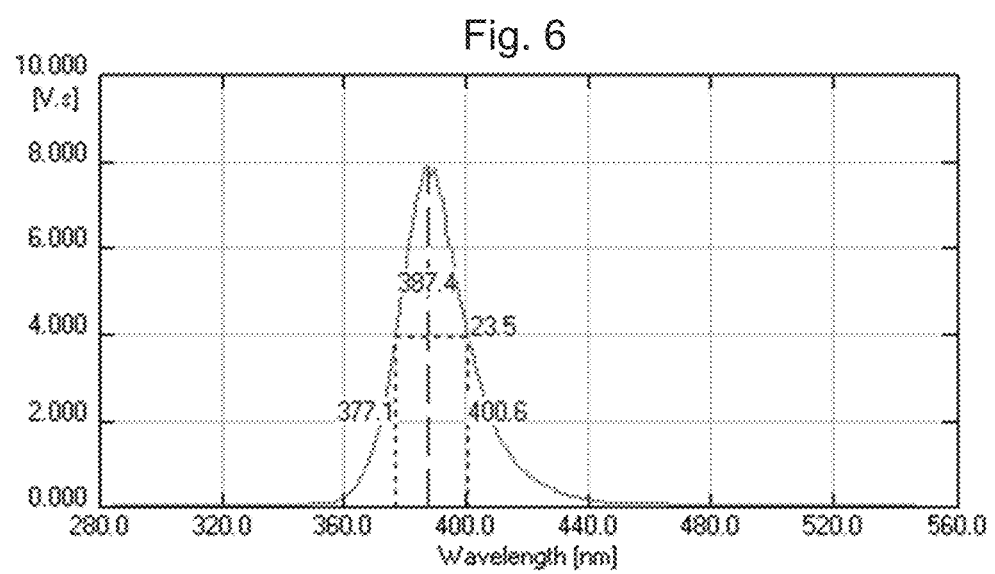
Figure 8:
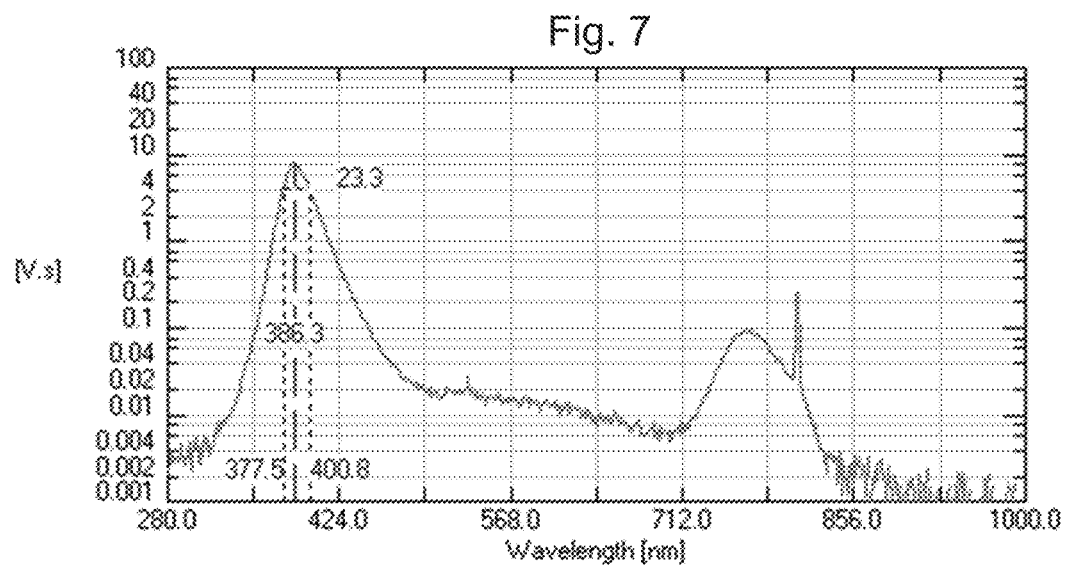
Figure 9:
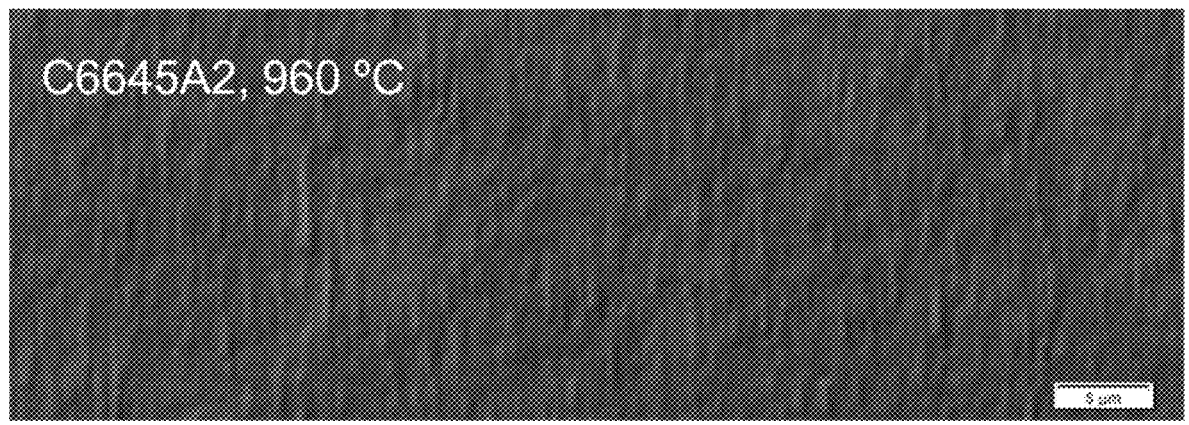
Figure 10:
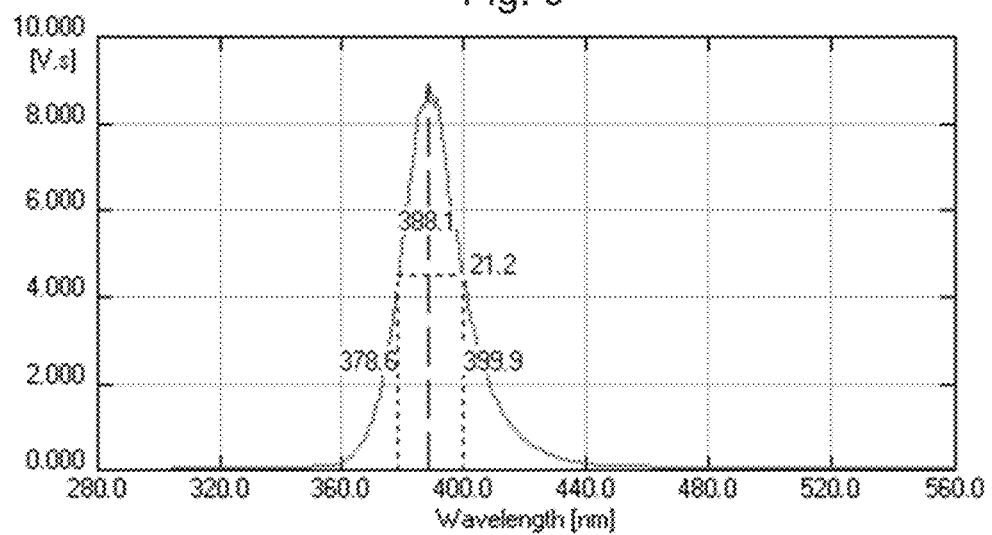
Figure 11:
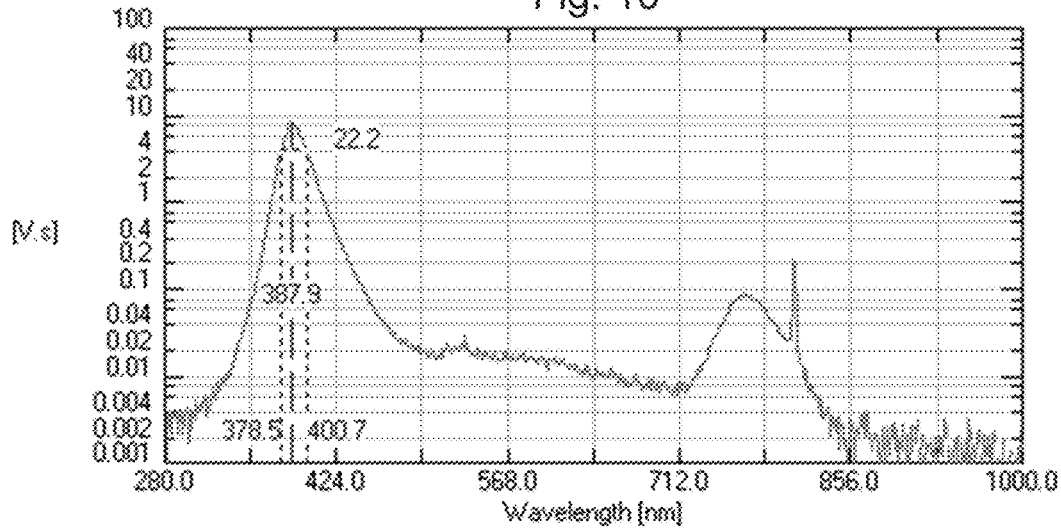
Figure 12:
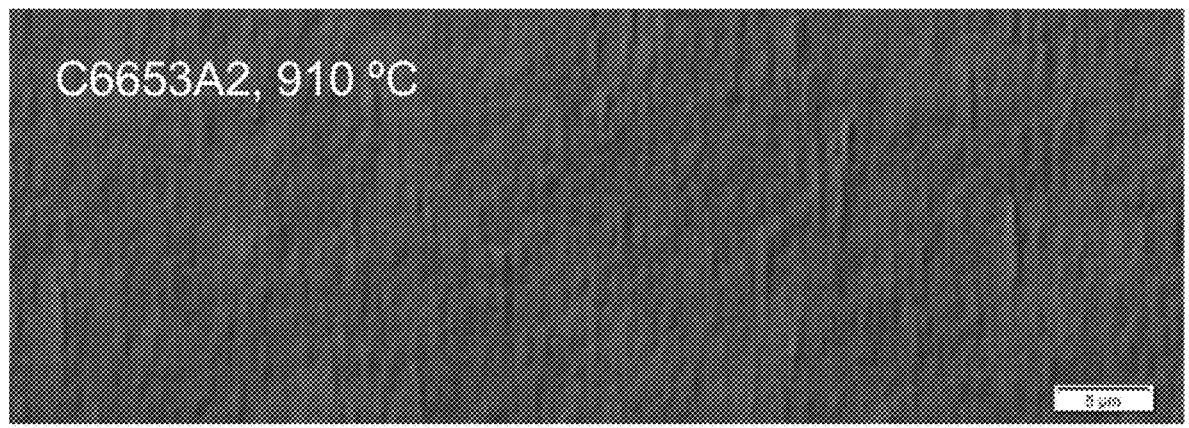
Figure 13:
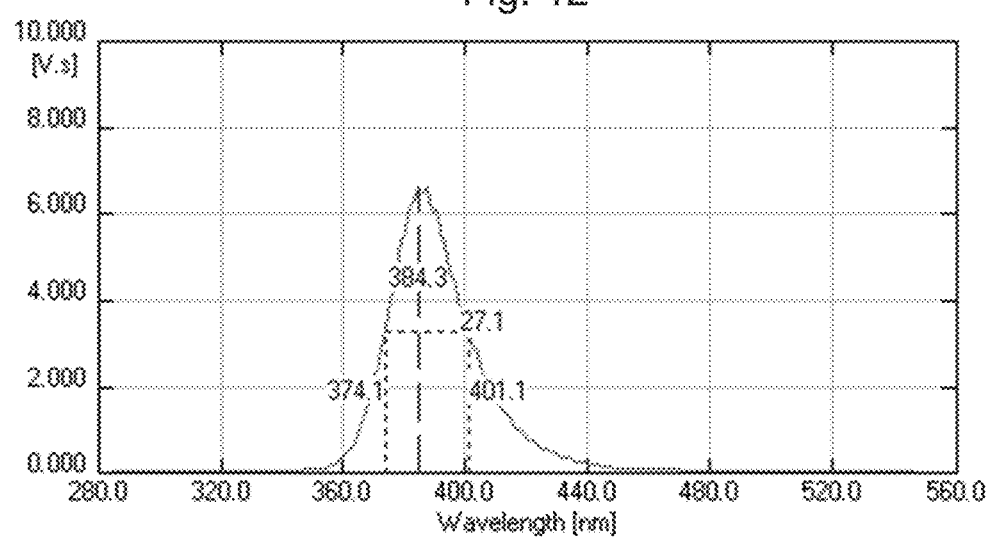
Figure 14:
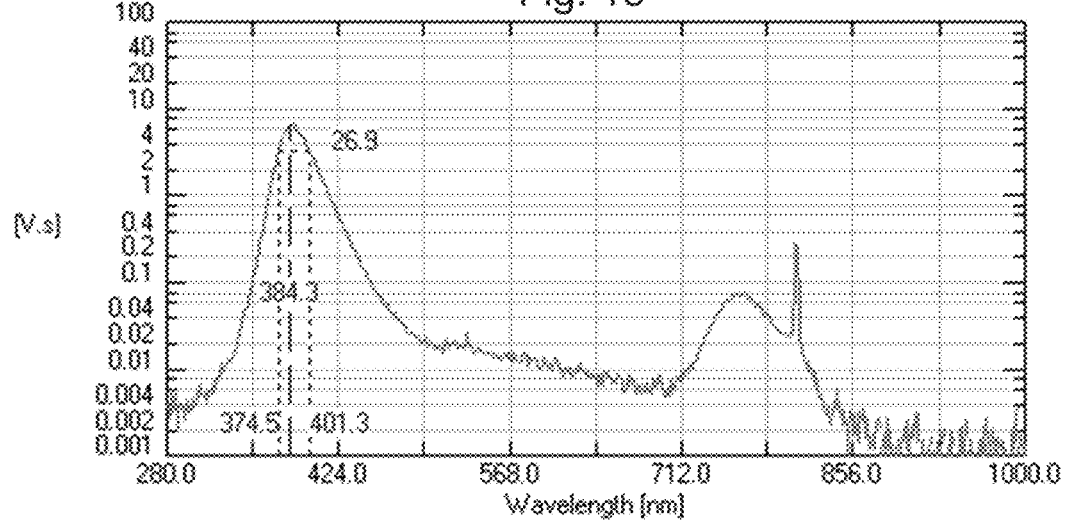
Figure 15:
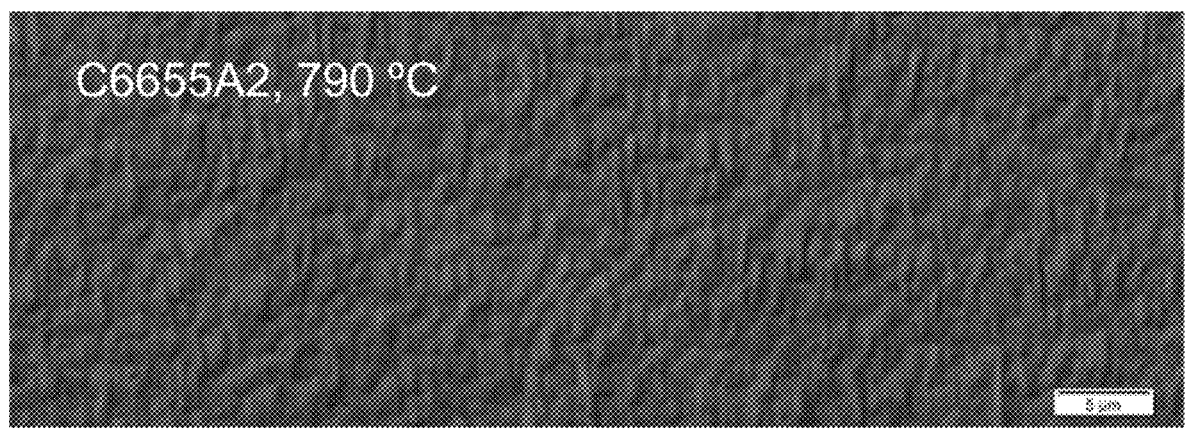
Figure 16:
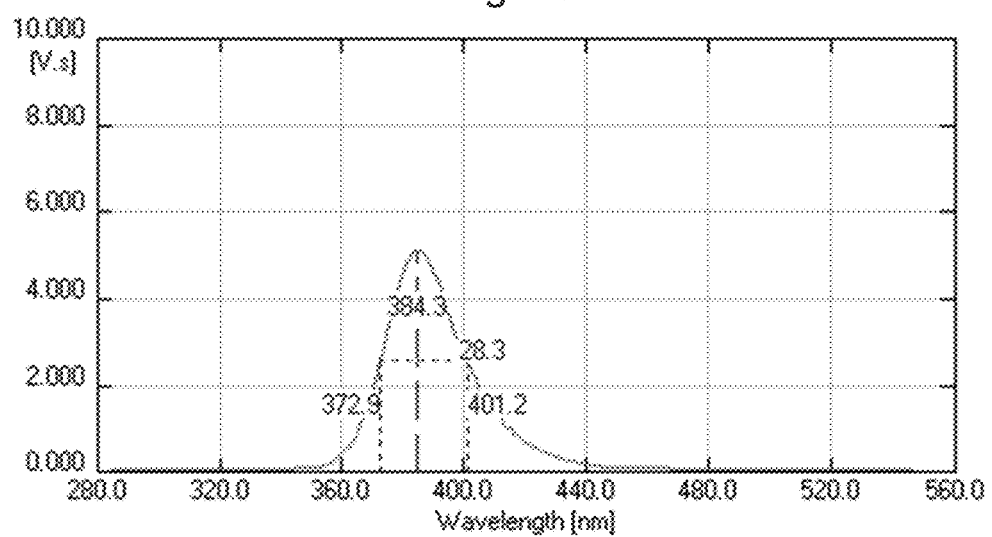
Figure 17:
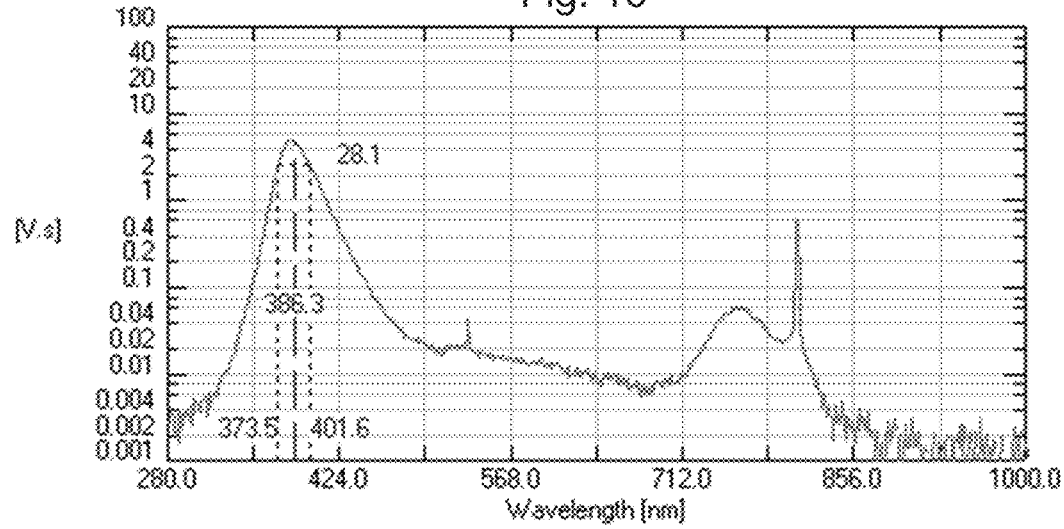

For XRD texture analysis, the angular distribution of selected reflections in reciprocal space is measured by mapping the surface of a hemisphere with radius given by the particular Bragg condition (see FIG. 2). For this purpose, the sample is rotated around its surface normal (ϕ-scan), and stepwise tilted towards the beam path plane (χ-steps) after each scan. The measured intensities are visualised as a polar projection (radius=χ) or as a stereographic projection (radius=tan (χ/2)). In a so-called pole-figure, the centre represents the direction of the surface normal, while poles at the edge of the plot (χ=) 90°) represent directions within the surface plane.

To determine the phase purity, the main orientation and the crystallographic relation between different textures of the nitride film, the measurement of at least two texture maps is necessary—one for each phase.

Figure 73:
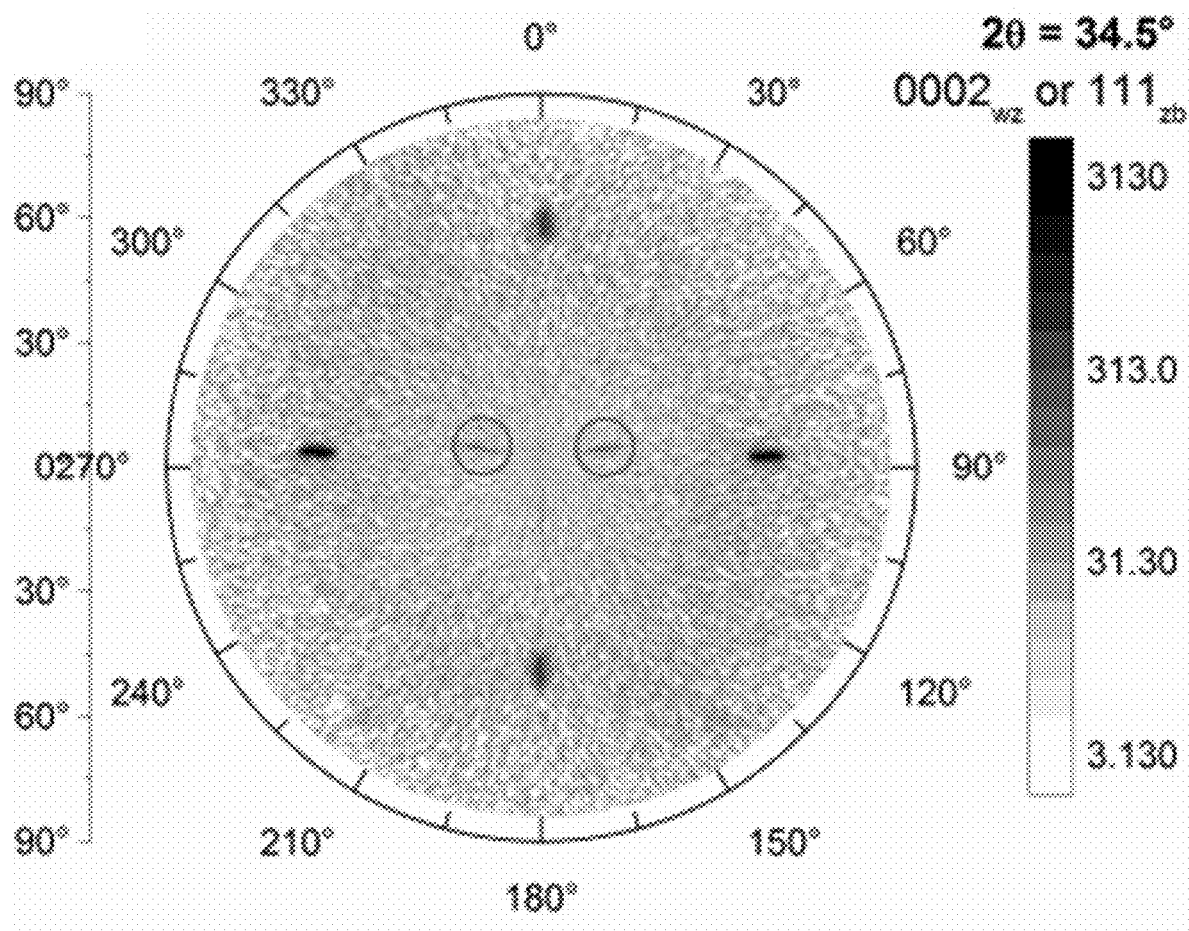
FIGS. 73-75 show pole-figures for different wurtzite and zincblende reflections of GaN grown on (001) oriented 3C—SiC/Si-templates.
Figure 74:
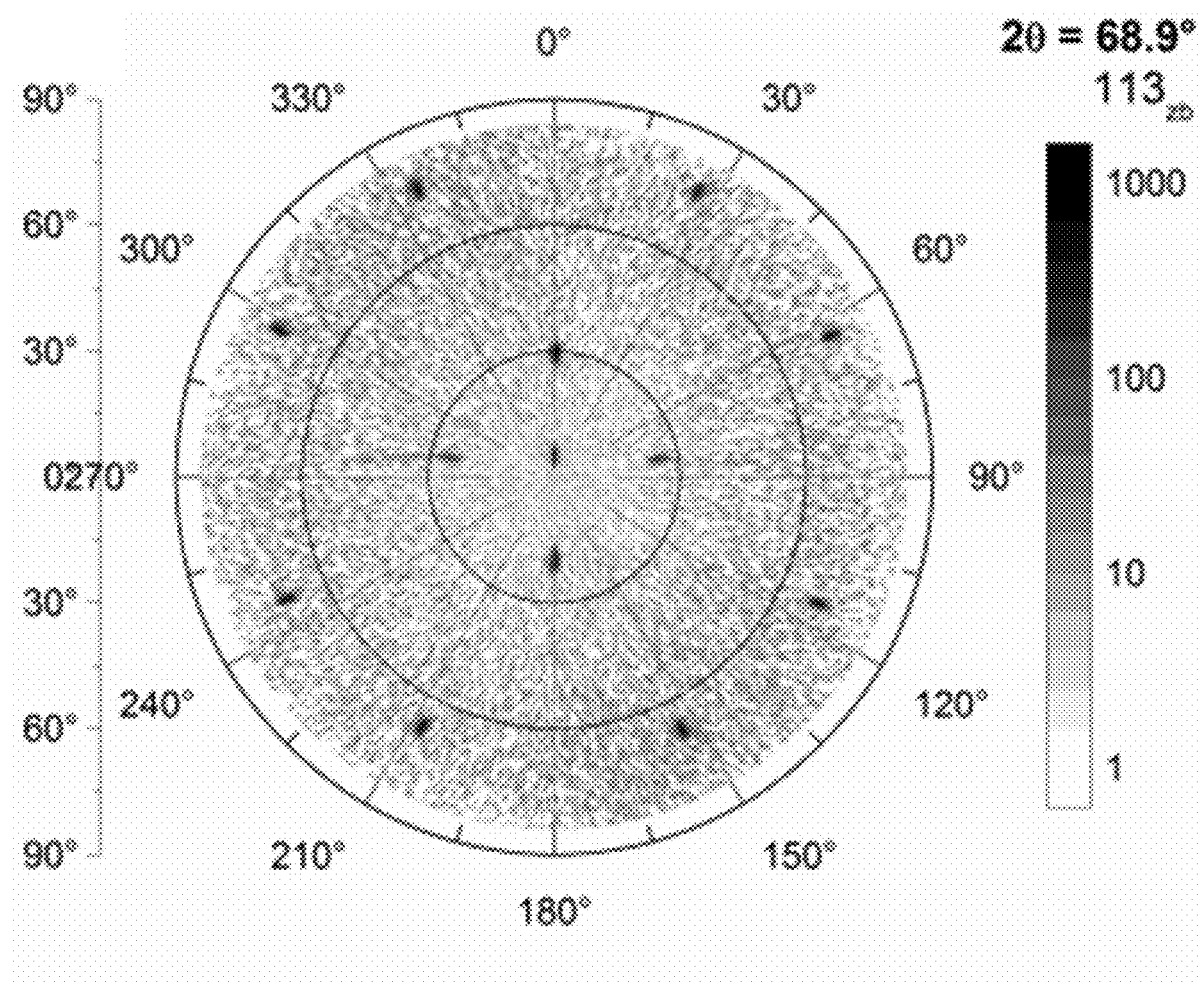
Figure 75:
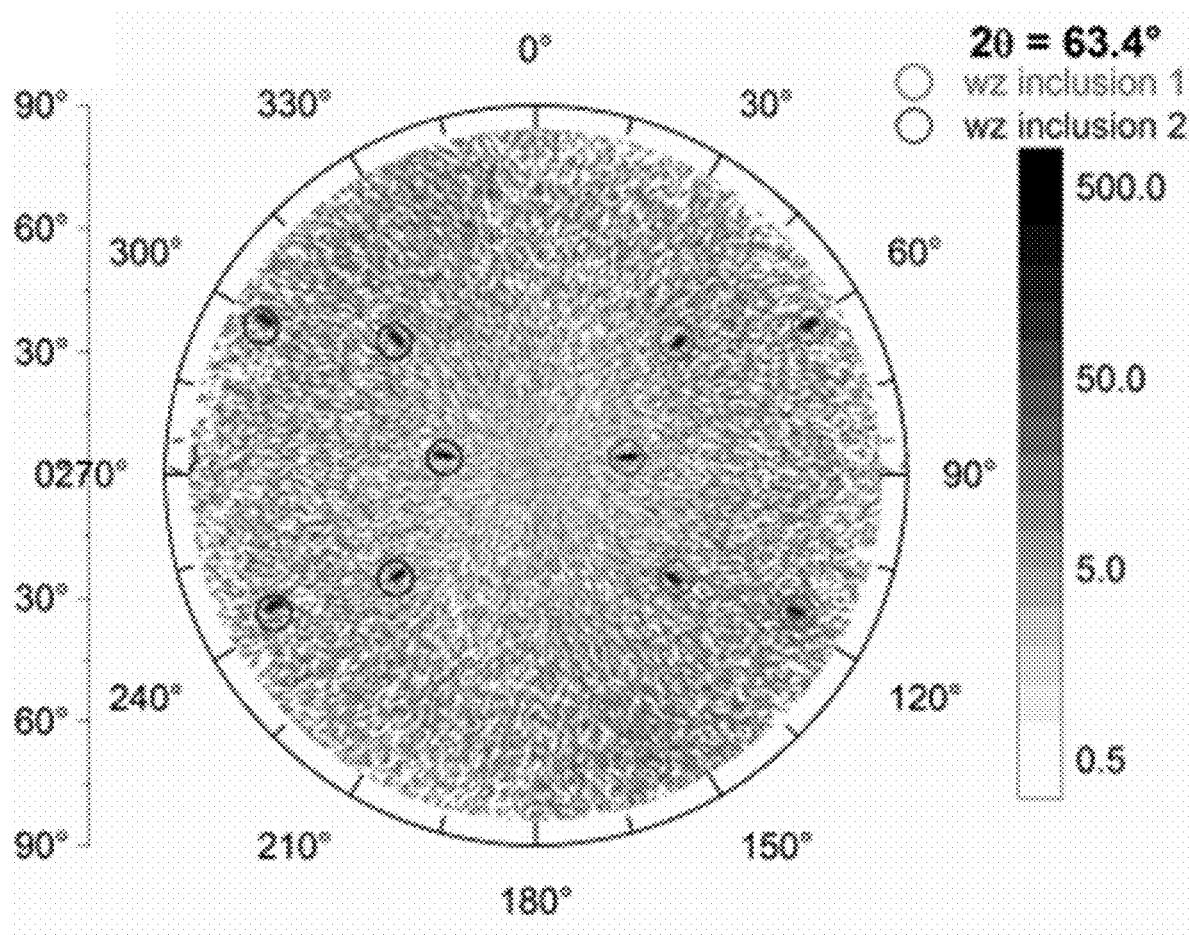

FIGS. 73, 74 and 75 show the texture maps collected at 2θ=34.5°, 2θ=68.9°, 2θ=63.4°, respectively, for a GaN epilayer grown on a 3C—SiC/Si template under non-optimised conditions. In FIG. 73 four intense reflections at χ of about 57° are clearly visible. As seen from the four-fold symmetry these reflections likely represent the $111_{zb}$ reflections of the zincblende phase. However, this result alone does not prove the absence of the wurtzite phase. The measured reflections in FIG. 73 can also represent the $0002_{wz}$ peaks originating from four different twins of the hexagonal wurtzite component growing on {111} facets of 3C—SiC, even if no cubic phase is present at all. In the more likely case that a mixture of the two phases has been grown, there will be contributions to the measured reflections from both phases.

To examine this further, we measured the distribution of the zincblende $113_{zb}$ reflections (FIG. 74) and the wurtzite $1\text{-}103_{wz}$ reflections (FIG. 75), which do not overlap with reflections of the other phase. The pattern of the $113_{zb}$ reflections (FIG. 74) show a four-fold symmetry, in which three reflections (2× at χ of about 72°, 1× at χ of about 25°) are arranged about a common $111_{zb}$ pole. This confirms categorically that the main orientation of the cubic film is (001), which is equivalent to the SiC/Si template orientation, represented by the weak 004 Si reflection in the centre of the pole-figure. In FIG. 75 the $\{1\text{-}103\}_{wz}$ facets of wurtzite phase cause a number of reflections, which form distorted hexagonal patterns around their common central 0001 pole (not visible). The result indicates that the hexagonal wurtzite phase is present in the GaN film too, but that it is the minority phase, resulting in much weaker reflection intensities in comparison to the cubic zincblende reflections.

The phase purity of the GaN mixture can be estimated by integrating the intensities of the reflections of each phase, and determining the ratio of these values. This might be sufficient enough to give fast feedback for optimisation purposes in a crystal growth campaign, as suggested by Herres et al (1999). However, for a more accurate quantification of the volume fraction of zincblende and wurtzite GaN phase an additional correction is needed to take the different scattering efficiencies of both the structures and their crystal planes into account. Since the zincblende and wurtzite phases have the same absorption coefficient, it is sufficient to consider only the different structure factors $F_{hkl}$, the volumes of the unit cells $V_{UC}$, and a geometric correction known as the Lorentz-polarisation (LP) factor. Ignoring smaller correction factors, such as absorption correction and temperature correction, the integrated intensity of a single reflection hkl is proportional to the materials volume amount $V_{phase}$, given by:

$$I_{hkl} \propto LP \cdot \left(\frac{|F_{hkl}|}{V_{uc}}\right)^2 \cdot V_{phase} \quad \text{(Eq. 4)}$$

with the Lorentz-polarisation factor $$LP = \frac{1+\cos^2(2\theta)}{2\cdot\sin(\theta)\cdot\cos(\theta)} \cdot \psi \quad \text{(Eq. 5)}$$

and the structure amplitude $$F_{hkl} = \Sigma_j f_j \cdot e^{2\pi i(hx_j + ky_j - lz_j)} \quad \text{(Eq. 6) [Cullity (1956)]}$$

The factor ψ depends on the diffraction angle for powder samples (ψ=sin$^{-1}$(θ)), while it is constant for single crystals [Reynolds (1986)]. The coordinates $x_j$, $y_j$, $z_j$ are the positions of each atom in the unit cell and are listed in Table 1. The atomic scattering factors $f_j$ of Ga and N are proportional to the electron number per atom, but also have a complex dependence on the diffraction angle and wavelength. Details of the correlation are described in literature [Cullity (1956); International Tables for Crystallography, Volume C (2004); Waasmaier and Kirfel (1995)] and in online databases [Cromer-Mann coefficients: http://www.ruppweb.org/Xray/comp/scatfac.htm and http://www.ruppweb.org/new comp/scattering factors.htm and DABAX library (ESRF) http://tx.technion.ac.il/~katrin/f0 CromerMann.txt]. With these corrections the $\{113\}_{zb}$ and $\{1\text{-}103\}_{wz}$ reflections in FIGS. 74 and 75 reveal a volume portion of around 69% vol zincblende GaN in this sample. The detection precision under which we collect the data here is a few volume percent, and is mainly influenced by the large variation in integrated intensity for reflections in the different crystal directions.

Thus, when the group 111-nitride layer is subjected to XRD characterization, the relative volume proportions of zincblende structure group 111-nitride $V_{zb}$ and wurtzite structure group III-nitride $V_{wz}$ are:

$$\frac{V_{wz}}{V_{zb}} \quad \text{(Eq. 7)}$$

where $V_{wz}$ is assessed on the basis of wurtzite structure group III-nitride 1-103 (i.e. 1-13 in conventional Miller index notation) reflections and $V_{zb}$ is assessed on the basis of zincblende structure group III-nitride 113 reflections.

Rearranging the equations already presented:

$$\frac{V_{wz}}{V_{zb}} = \frac{I_{1-13}}{I_{113}} \cdot \frac{1+\cos^2(2\theta_{113})}{1+\cos^2(2\theta_{1-13})} \cdot \frac{2\cdot\sin(\theta_{1-13})\cdot\cos(\theta_{1-13})}{2\cdot\sin(\theta_{113})\cdot\cos(\theta_{113})} \cdot \frac{\left(\frac{|F_{113}|}{V_{uczb}}\right)^2}{\left(\frac{|F_{1-13}|}{V_{ucwz}}\right)^2} \quad \text{(Eq. 8)}$$

where:

$V_{uczb}$ is the volume of the zincblende structure group III-nitride unit cell $V_{ucwz}$ is the volume of the wurtzite structure group III-nitride unit cell $F_{113}$ is the structure amplitude of the zincblende structure group III-nitride 113 reflections $F_1$-13 is the structure amplitude of the wurtzite structure group III-nitride 1-103 reflections $I_{113}$ is the integrated intensity of the zincblende structure group III-nitride 113 reflections $I_1$-13 is the integrated intensity of the wurtzite structure group III-nitride 1-103 reflections.

Figure 63:
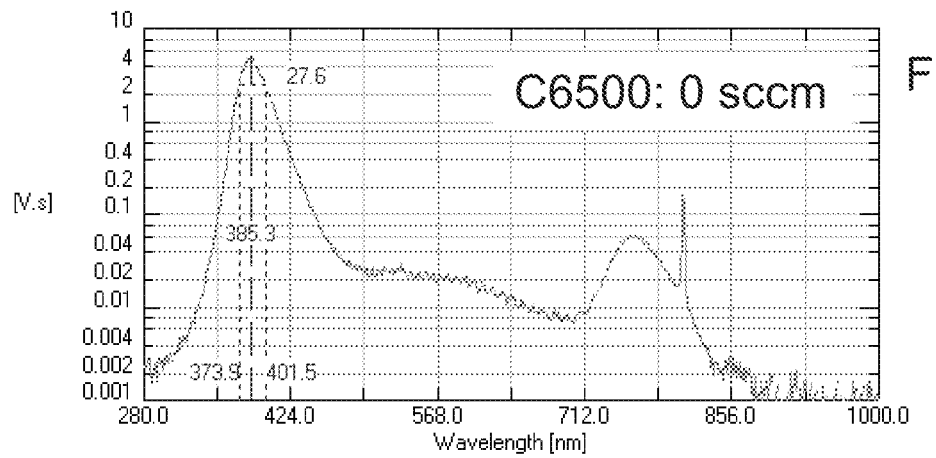
FIGS. 63-68 show changes in optical properties from PL with silane flow rate.
Figure 64:
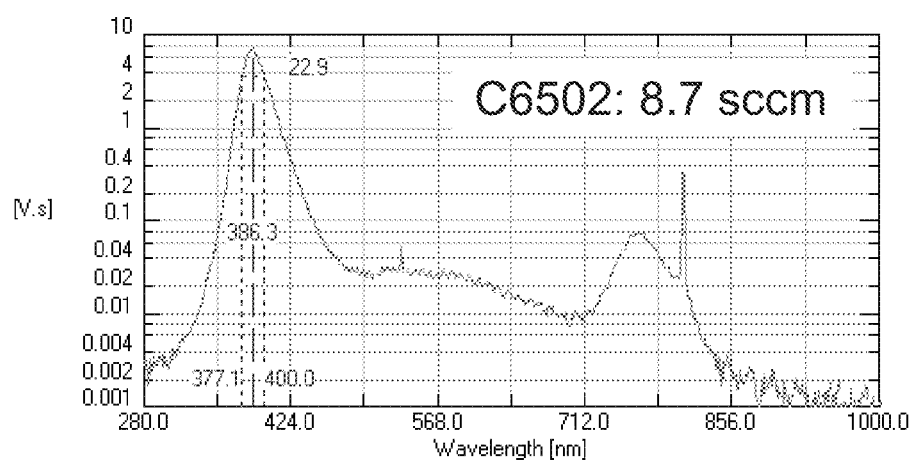
Figure 65:
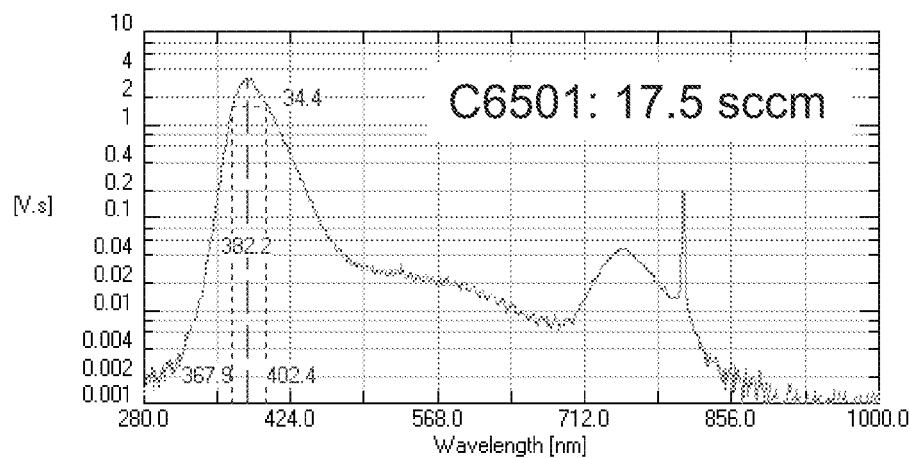
Figure 66:
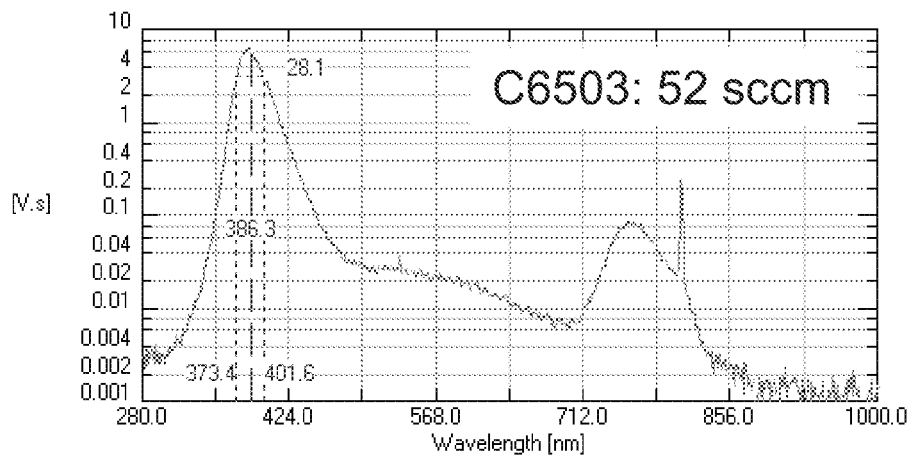
Figure 67:
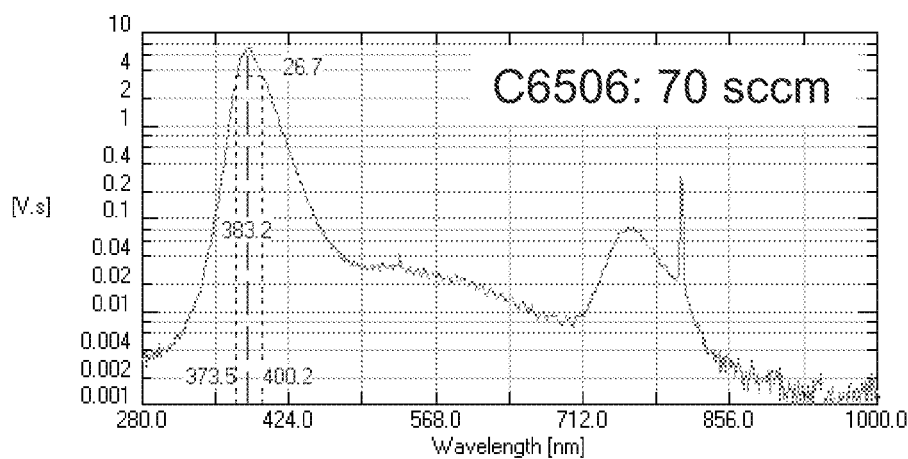
Figure 68:
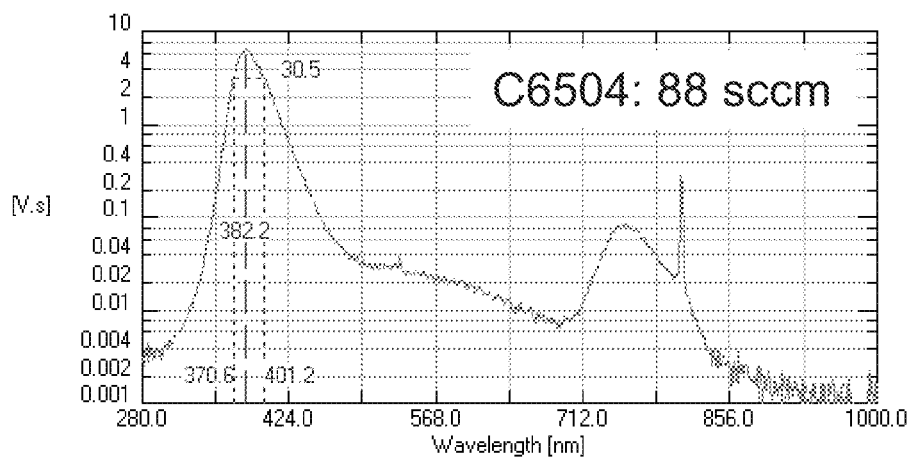
Figure 76:
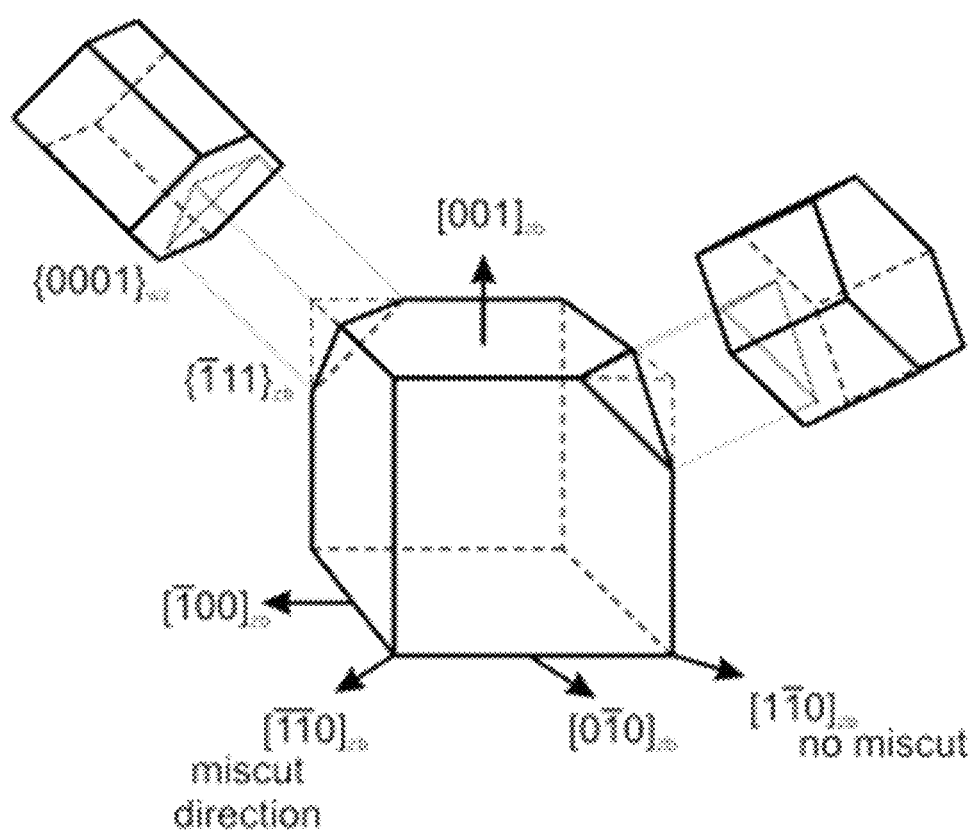
FIG. 76 illustrates the crystallographic arrangement of the wurtzite and zincblende GaN phases.

The crystallographic relation between the zincblende and the wurtzite phase can be obtained by combining the pole-figures in FIGS. 63-65, and is found to be $(111)_{zb}||(0001)_{wz}$, with $[11-2]_{zb}||[-1010]_{zb}$ and $[-110]_{zb}||[1-210]_{wz}$ for two of the four unequal {111} facets in zincblende GaN. This unit cell arrangement is illustrated in FIG. 76, and it is unsurprising, since the closed-packed planes of each structure are parallel to each other and differ only in the stacking sequence. Other groups observed a similar arrangement of the two phases by XRD [Qu et al (2001); Tsuchiya et al (1998)] and transmission electron microscope measurements [Trampert et al (1997)], and it was also found that the zincblende and wurtzite phases arrange as alternating zb-wz-lamellae [Wu et al (1997)]. As our example in FIG. 75 indicates, (0001) wurtzite GaN is not necessarily formed with equal probability on each of the four inequivalent $\{111\}_{zb}$ facets.

TABLE 1

Atomic positions in the ideal wurtzite and zincblende unit cell.

| | wurtzite structure | | zincblende structure | |
|---|---|---|---|---|
| $Ga^{3+}$ | 0, 0, 0; | ⅓, ⅔, ½; | 0, 0, 0; | ½, 0, ½; |
| $N^{3-}$ | 0, 0, ⅜; | ⅓, ⅔, ⅞; | ½, ½, 0; | 0, ½, ½; |
| | | | ¾, ¾, ¾; | ¼, ¾, ¼; |
| | | | ¼, ¼, ¾; | ¾, ¼, ¼; |

In samples grown under optimised conditions to maximise the zincblende phase, the X-ray intensity in the expected positions of the wurtzite phase reflections is negligible, i.e. only slightly above the background noise level. In these cases it is very likely that the signal originates not from diffraction by hexagonal wurtzite inclusions in the epilayers, but from diffuse scattering on planar defects, such as stacking faults. This can be shown by measuring a two-dimensional reciprocal space map as described later.

Besides wurtzite inclusions, zincblende GaN thin films could also contain twinned zincblende regions. Similar to stacking faults, these are introduced by stacking errors of a single (111) plane, but in contrast to stacking faults, the zincblende matrix continues with a different stacking sequence . . . AaCcBbAaCcBb . . . . With respect to the surrounding GaN matrix, the zincblende twins are tilted by approximately 70.4° around the [1-10] axis, so that twin and matrix have the relation $(111)_{twin}||(115)_{matrix}$ [Tsuchiya et al (1998)]. Such zincblende twins, and possibly twinned wurtzite-like material with a similar relation, cause the weak 111 reflections at $\chi$ of about 15° (circled in FIG. 73), and possibly at $\chi$ of about 83° (out of range in FIG. 73). Their volume portion is in the low percentage range.

Reciprocal Space Maps For Texture Analysis

Figure 78:
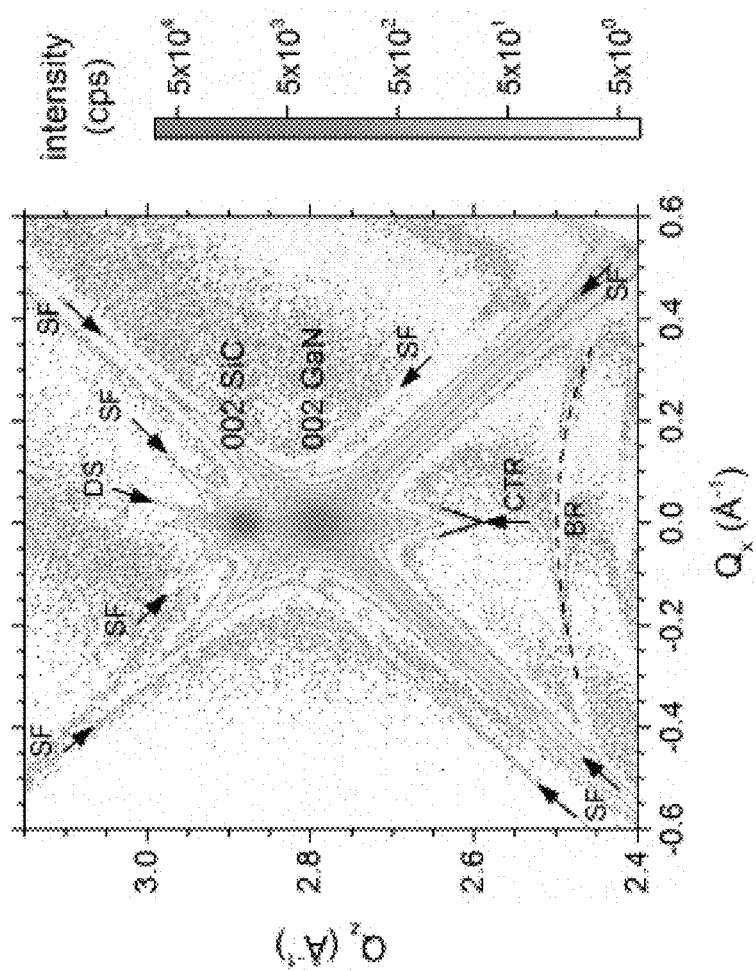
FIG. 77 and FIG. 78 show measured two dimensional reciprocal space maps (RSMs) of zincblende GaN samples grown under (FIG. 77) non-optimised conditions which promote wurtzite inclusion formation, and (FIG. 78) improved conditions which gives close to 100% pure zincblende GaN with stacking fault streaks (SF), detector streak (DS), crystal truncation rod (CTR), and Bragg-ring (BR).
Figure 77:
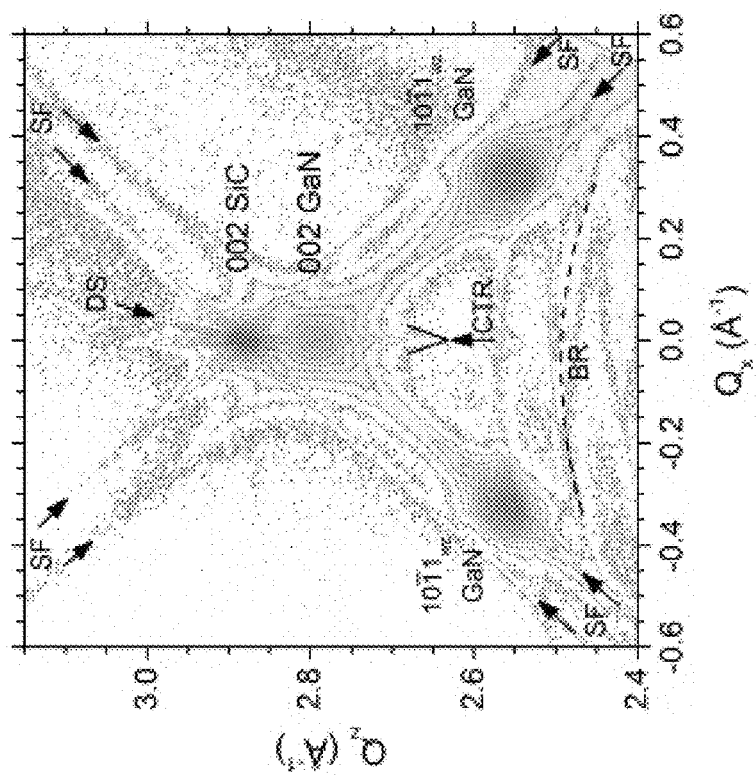

Two-dimensional reciprocal space maps (RSMs)—a combination of ω-2θ-scans with a stepwise change of the ω-angle after each scan—of suitable zincblende and wurtzite phase reflections can be used to analyse the phase purity of GaN samples, as well as several other structural properties. Suitable reflections include $002_{ZB}$ and $10\text{-}11_{WZ}$, as shown in FIGS. 77 and 78 for two different samples with and without hexagonal inclusions. In both reciprocal space maps the 002 reflections of zincblende GaN and 3C—SiC are clearly visible by their high intensities. The low intensity streaks running along <111> through the 002 reflections are caused by diffuse scattering from {111} stacking faults in the structure, where diffracted X-rays suffer an additional phase shift between both sides of a stacking fault. Stacking faults may also lead to a small shift of the GaN reflections out of the ideal position. Another feature passing through the 3C—SiC reflection on a 2θ-arc is the detector streak (DS), caused by the instrument function of the diffractometer. The streak intersecting the $002_{zb}$ GaN reflection normal to the surface is the so called (X-ray) crystal truncation rod (CTR), whose shape is influenced by surface structures in agreement with observations from atomic force microscopy. The partially visible Bragg ring in the RSMs (with 2θ of about 35.6°) stems from polycrystalline SiC deposited on the etched grid of the 3C—SiC/Si templates, and is neither related to the SiC mesa regions nor to the GaN epilayer. As the GaN epilayer is much thinner than the SiC template, similar Bragg rings from GaN grown on the etched grid are much weaker and often not visible. In the presence of wurtzite-like inclusions in the zincblende GaN thin film (FIG. 67) two additional $10\text{-}11_{wz}$ reflections of the wurtzite GaN phase appear, which are absent in the sample without these inclusions (FIG. 78). Since the stacking fault streak overlaps with the wurtzite phase reflections, these streaks can be easily misinterpreted as signal of small amounts of hexagonal inclusions in texture maps.

In comparison to texture mapping, discussed in the section above, reciprocal space maps are much faster to perform even with high integration times by using a CCD detector. This increases the signal to background noise ratio, and hence allows the quantification of even relatively low proportions of wurtzite-like GaN inclusions. However this method presumes a fixed epitaxial relation and provides no additional information on the presence of cubic twins.

Mosaicity Analysis

Due to the lack of suitable homo-substrates, cubic zincblende GaN-based nitrides are typically grown heteroepitaxially on foreign cubic substrates, such as GaAs [As et al (2000); Yang et al (1996); Shen et al (2003); Qu et al (2001); Tsuchiya et al (1998)], SiC [Wu et al (1997); Chichibu et al (2003)], Si [Lei et al (1991)], and various other cubic materials (e.g. GaP [Cheng et al (1995)], MgO [Compeán García et al (2015)]). The lattice mismatch between the different materials results in a high mosaicity and the formation of defects at grain boundaries in the epilayers. In general, mosaicity should be avoided as it negatively influences the physical properties of the sample, e.g. causes high electrical resistances at grain boundaries [Fujii et al (2010)]. And hence, mosaicity should preferably be quantified for crystal growth optimisation.

In a simplified model originating from powder diffractometry, the thin film consists of mosaic blocks (grains), which differ slightly in their finite size and orientation relative to each other. The spread in size, tilt, and twist, together with microstrain and compositional inhomogenities (in the case of alloys) lead to broadening of the X-ray reflections in reciprocal space. Mosaic tilts lead to an angular broadening of reflections perpendicular to the surface, while twists result in an azimuthal spread around the surface normal. Hence for both mosaic tilt and twist, the absolute broadening in reciprocal space $\Delta G_{hkl}$ increases linearly with the magnitude of the scattering vector $|G_{hkl}|$. The finite lateral size of mosaic grains causes a broadening parallel to the interface, being inversely proportional to the average real space size L and independent of the scattering vector magnitude ($\Delta G_{hkl}=2\pi/L$). The effects of tilt, twist and finite grain size convolute to the spread of a reflection hkl measured by ωscans in skew-symmetry as follows:

$$[\beta_{hkl}]^n = [\beta_{tilt} \cdot \cos\chi]^n + [\beta_{twist} \cdot \sin\chi]^n + \left[\frac{2\pi/L}{|G_{hkl}|}\right]^n \qquad (Eq.\ 9)$$

[Lee et al (2005)]. Here β denotes the integrated breadth, and the exponent n takes values between 1 and 2 depending on the Gaussian η and Lorentzian (1−η) contribution to a Pseudo-Voigt fit (n=1+η²) (See appendix in Srikant et al (1997)]).

Figure 79:
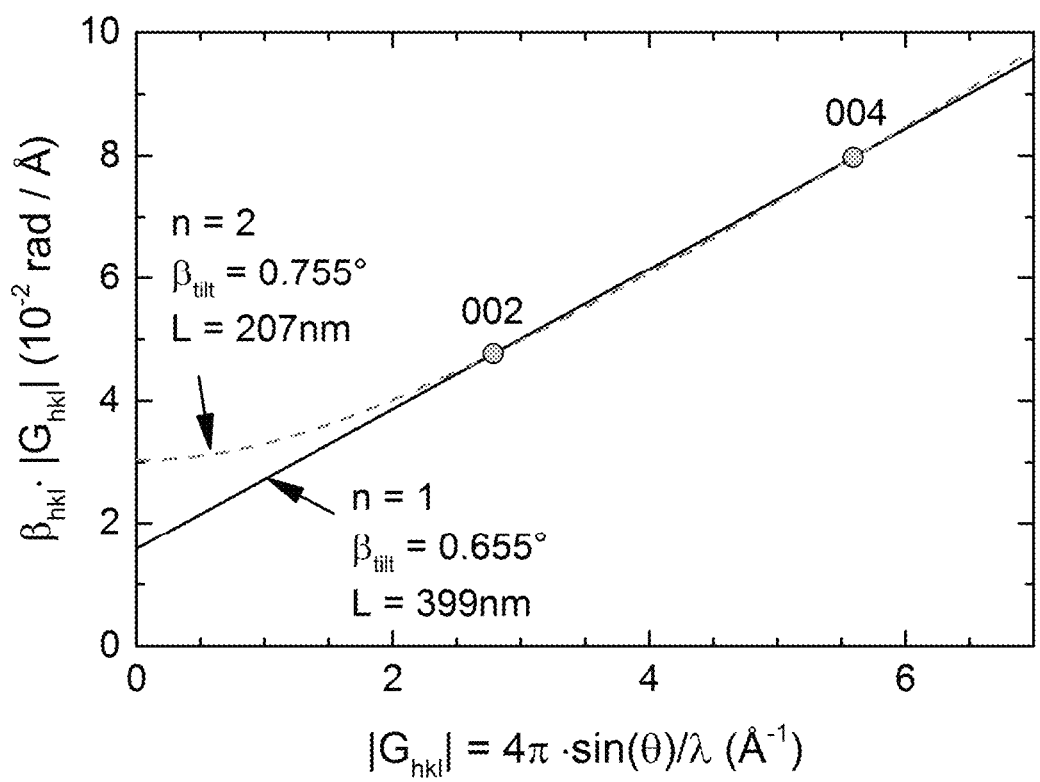
FIG. 79 shows a plot of XRD peak width of an optimised zincblende GaN sample displayed in a traditional Williamson-Hall plot with fits for Lorentzian (n=1) and Gaussian shape peaks (n=2).

The measured peak broadening is then a combination of this mosaic broadening of the sample and the instrument function (without a sample). The latter one can be neglected as long as it is much narrower than the mosaic broadening. Experimentally, the peak broadening effect due to lateral size and tilt can be separated by measuring a series of ω-scans of different order symmetric reflections 00l, and plotting $\beta^n \cdot G^n$ versus $G^n$ in a modified Williamson-Hall plot (not shown). The slope of the line is related to the tilt component ($\beta_{tilt}^n$) and the ordinate offset is related to the average grain size (($2\pi/L)^n$). Unfortunately only the symmetric 002 and 004 zincblende GaN reflections are accessible with the commonly used Cu-Kα radiation, which significantly limits the accuracy, especially of the finite size determination. FIG. 79 shows the linear behaviour of $\beta_{hkl}^n$ in a traditional Williamson-Hall plot for which typically Lorentzian broadenings (n=1) are taken, even though Lorentzian profiles often do not fit very well to measured profiles. In comparison with the curve for Gaussian fits (n=2), this results in a much larger value for the finite size L, as also pointed out by Lee et al (2005). As X-ray intensity profiles can be empirically described as a convolution of Gaussian and Lorentzian functions, the real lateral finite size is within these two extremes, depending on the portion of both profiles. Usually one gets the Gaussian and Lorentzian ratio from profile fitting, but they might vary for different reflections of a series. However, as the Lorentzian portion is often very small in such fits, mosaic block sizes estimated from pure Gaussian fits give a relatively good estimate.

The azimuthal spread around the surface normal due to mosaic twist can be determined from off-axis reflections with large polar angles χ measured in screw-symmetric geometry. Ideally one would use one of the in-plane reflections (χ of about 90°), but those often exhibit only very low intensities and are generally difficult to measure. For (001) oriented zincblende GaN films the 331 reflection (χ of about 76.7°) may be better used instead. Alternatively, the integrated breadths of a series of different off-axis reflections extracted from skew-symmetric ω-scans can be extrapolated with Eq. (9) to determine the twist component.

Figure 80:
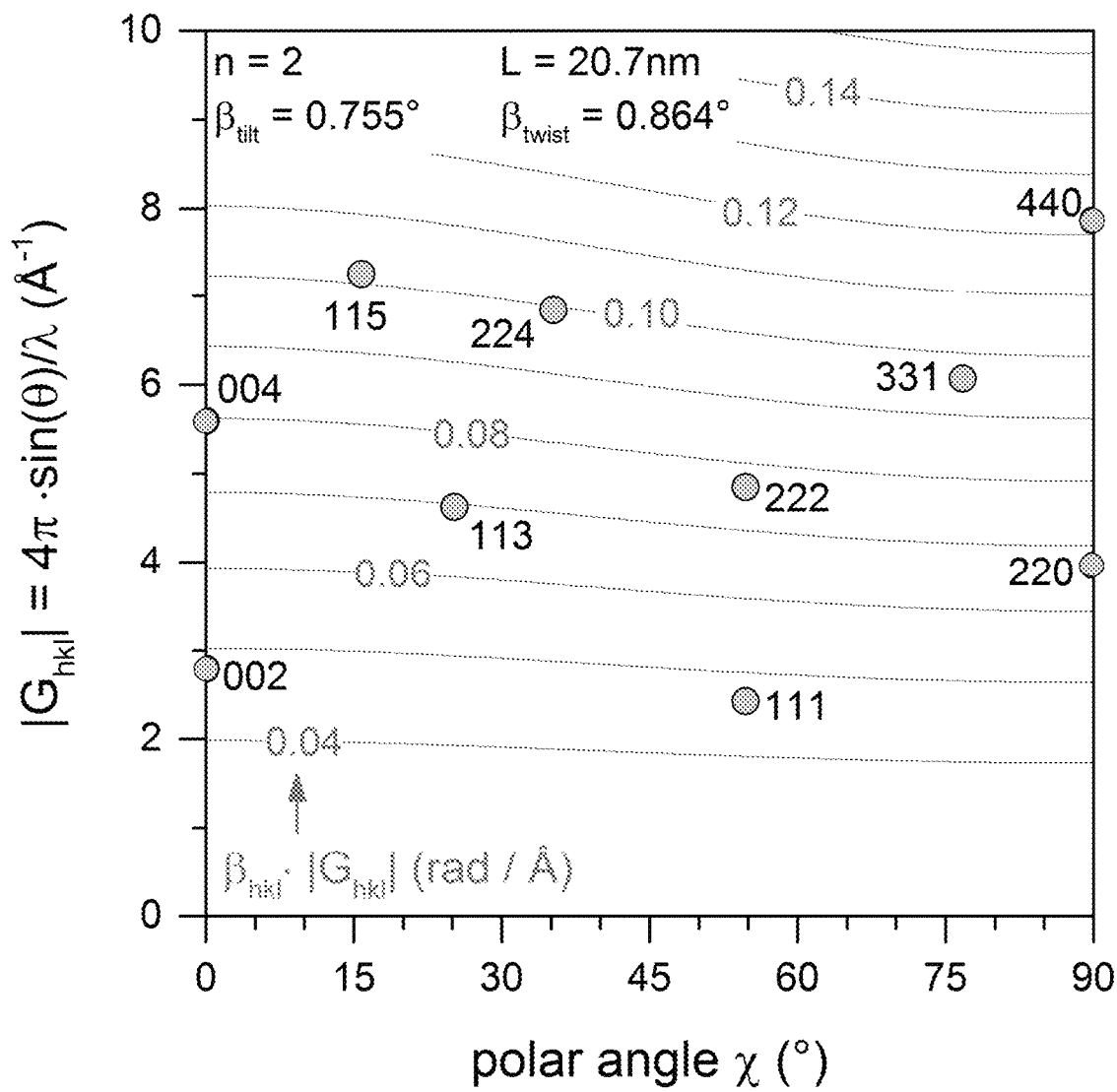
FIG. 80 shows extrapolated peak width $\beta_{hkl} \cdot |G_{hkl}|$ in reciprocal space as a function of polar angle c and scattering vector magnitude $|Ghkl|$ estimated from a series of skew-symmetric ω-scans. The circles show the measured reflections, used for the extrapolation.

FIG. 80 shows such an extrapolation, for which we converted Eq. (9) to $\beta_{hkl}^n \cdot |G_{hkl}|^n$, and fit this function (for n=2) to the measured peak broadenings of an optimised cubic GaN sample by using the tilt and finite size values from the Williamson-Hall plot in FIG. 79. The circles mark the measured reflections, and the contours are provided to indicate the extrapolated peak width in reciprocal space phkr $\beta_{hkl} \cdot |G_{hkl}|$ as function of polar angle χ and scattering vector magnitude $|G_{hkl}|$. The contours represent constant peak width. The profile at χ=0° was already shown before (FIG. 79) and is only influenced by the tilt and the finite size of the mosaic blocks. With increasing polar angle χ the broadening gradually increases, revealing a slightly higher mosaic twist (χ=90°) of 0.864° than tilt (χ=0°) of 0.755°. This trend is not much pronounced as tilt and twist are very similar, but it becomes more apparent for larger scattering vectors $|G_{hkl}|$ as the contribution of the finite size to the peak broadening decreases.

Defect Densities

In general mosaic tilt and twist are assumed to be associated with the formation of threading dislocations at grain boundaries in the thin film. Hence the XRD peak broadening is sometimes used to estimate the defect density in a thin film, by following different mosaic tilt models discussed in literature. According to these models the threading dislocation density $D_{TD}$ in a well oriented mosaic film is proportional to $\beta_{tilt/twist}$ $$D_{TD} = \frac{\beta_{tilt/twist}}{2.1 |b_{TD}| \cdot L} \qquad (Eq.\ 10)$$

[Fewster (1989)], while in poorly oriented films with randomly oriented grains and strictly statistically spread Burgers and line vectors, the threading dislocation density is proportional to $\beta^2_{tilt/twist}$ $$D_{TD} = \frac{\beta^2_{tilt/twist}}{2\pi b^2_{TD} \cdot \ln 2} \qquad (Eq.\ 11)$$

[Dunn and Koch (1957)]. Here the parameter L is the average lateral finite size of the grains, while $b_{TD}$ denotes the Burgers vector of the dislocation with a value of $a_{ZB}/\sqrt{2} \approx 3.189$ Å in the case of perfect dislocations in zincblende GaN.

In contrast to wurtzite GaN material, where the threading dislocation line vector propagates predominantly along the [0001] c-direction, the threading dislocations in zincblende GaN run along multiple <110> directions. Thus, the equations above do not allow separating between edge-type, mixed-type, or screw type dislocations in zincblende GaN. However it is well known that, the dominating threading dislocation type in zincblende like structures are 60°-type perfect dislocations [Blumenau et al (2000)].

In an intensive comparative study using XRD and transmission electron microscopy (TEM) to estimate the defect densities in wurtzite GaN films, Metzger et al (1998) found a good match with the random distribution model (Eq. xy), even though the assumptions of the model are not fulfilled at all in oriented epitaxial thin films. Contrary to expectations, the model for oriented mosaic films revealed threading dislocation densities which were more than a magnitude lower than the values estimated from TEM. Lee et al (2005) came to similar conclusions and noted that large differences in the measured dislocation densities between TEM and XRD are common. In general XRD seems to slightly overestimate the threading dislocation density when the twist component is used, and underestimate the density when the broadening due to tilt is used [Lee et al (2005)]. Furthermore it should be noted that for very thin films XRD also samples the tilts associated with misfit dislocations at the GaN/SiC interface. If the Burger's vectors of the dislocations are randomly oriented, the associated strain fields will tend to cancel out as the film thickness increases, however if the Burger's vectors are not random the tilts can persist. This discussion shows that there are still some limitations on the current understanding of even the measurements of the more widely studied wurtzite GaN, and that defect densities estimated by XRD need be handled with care. This is especially the case when comparing samples of different layer thickness.

The Influence of Layer Thickness

Figure 81:
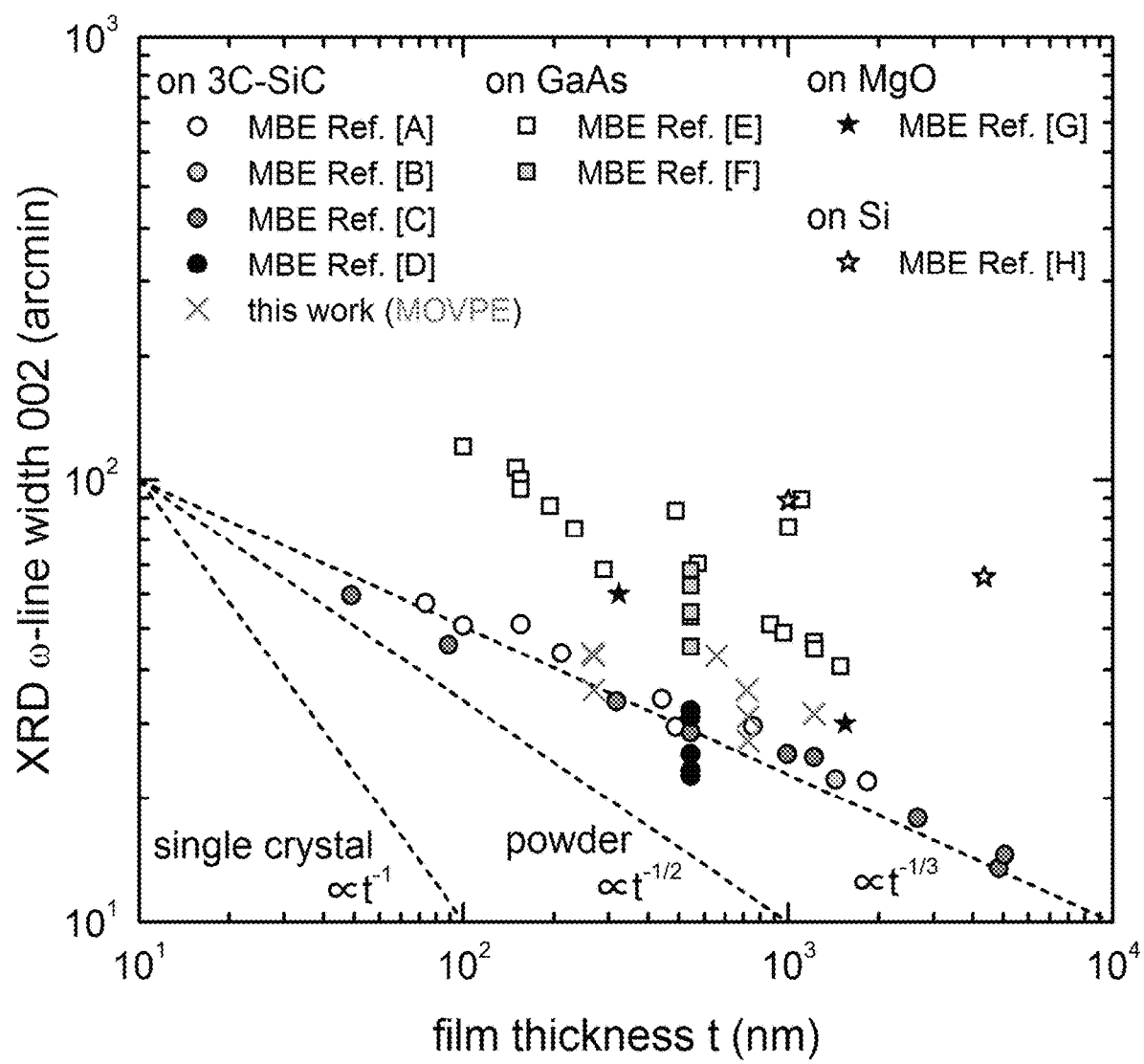
FIG. 81 shows a plot illustrating the decrease of the XRD ω-linewidth (FWHM) with increasing film thickness for oriented zincblende GaN grown on relevant substrates 3C—SiC, GaAs, MgO, and Si.

Typically the intensity spread of X-ray reflections is not constant but decreases with increasing film thickness, as shown in FIG. 81 by the full width at half maximum (FWHM) of the 002 reflection in w-scans. It is also evident that zincblende GaN (lattice constant GaN: a=4.50597 Å) grown on low lattice mismatch substrates, like 3C—SiC (lattice constant SiC: a=4.3596 Å, therefore 3.4% compressive) and MgO (lattice constant MgO: a=4.213 Å, therefore 7.0% compressive), exhibit a lower mosaicity than similar thick cubic GaN films grown with much larger mismatch on Si (lattice constant Si: a=5.4311 Å, therefore −17.0% tensile) or GaAs (lattice constant GaAs: a=5.65352 Å, therefore −20.3% tensile). Moreover, FIG. 81 shows that MOVPE grown zincblende GaN (our data) compares well with state-of-the-art cubic GaN films grown by MBE [Kemper et al (2015); Martinez-Guerrero et al (2002)]. The decreasing intensity spread of the reflections with increasing film thickness is commonly associated with an overall reduction in defect density and an improvement in material quality for thicker epitaxial films. Transmission electron microscopy investigations reveal a strong reduction in stacking fault density with increasing layer thickness by reactions between pairs of stacking faults under formation of perfect edge dislocations or partial threading dislocation. Martinez-Guerrero et al (2002) observe a nearly exponential decay of the stacking fault density from $5 \times 10^6$ cm$^{-2}$ to $3 \times 10^5$ cm$^{-2}$ in the first 500 nm of zincblende GaN growth. In our MOVPE grown cubic GaN films TEM measurements have revealed that the stacking fault density reduces from $10^7$ cm$^{-2}$ directly at the template interface to $3 \times 10^4$ cm$^{-2}$ close to the surface of 1200 nm thick films. However, the stacking fault density affects foremost the shape and intensity profile along the SF-streak in reciprocal space (as shown in Barchuk et al) for basal plane stacking faults in wurtzite GaN and in Dupraz et al (2015) for stacking faults in face-centered cubic (fcc) nano-crystals), but ω-scans of the symmetric $002_{ZB}$ reflection have almost no overlap with the stacking fault streak profile. Hence the observed peak narrowing with increasing layer thickness as shown in FIG. 71 cannot be directly related to the stacking fault reduction.

Several reports in the literature (see the references indicated in FIG. 81) suggest that the trend in FIG. 71 is due to a reduction in threading dislocation density with increasing film thickness, as a result of threading dislocation reaction, but TEM evidence for this assertion is scarce [As (2010); Kemper (2015); Rasing (2016); Lischka (1997)]. Theoretical models predict that the threading dislocation density is inversely proportional to the film thickness t [Ayers (1995)]. Combining these models with the reflection broadening due to mosaicity reveals a decrease in the intensity spread by a factor of $t^{-1}$ or $t^{-1/2}$, depending on whether an oriented thin film (Eq. (10)) or a powder sample (Eq. (11)) is assumed. As one can see from the dashed lines in FIG. 81 the experimental data do not follow the predicted trend. Instead the observed decay is much weaker, following approximately a $t^{-1/3}$ dependency. This may be explained by the generation of new threading dislocations, when stacking faults react with each other, and which to the best of our knowledge is not considered in current models. Furthermore one should consider that the models predict a threading dislocation density reduction after a certain thickness, while XRD is an integration method, which provides a weighted average value over the whole layer thickness. It should also not be forgotten that there is a natural reduction in the width of the X-ray reflections with increasing layer thickness, as the number of scattering atoms increases. This all makes a comparison of the material quality of samples with different thickness difficult.

Material Parameter For the Strain Analysis

The lattice parameters for zincblende III-nitrides are not yet well established experimentally, since such thin films suffer from stacking disorder, undoubtably a high density of line defects and wurtzite inclusions, resulting in local strain variations and relatively broad reflections. Furthermore, most X-ray diffraction experiments on predominantly zincblende GaN films are focussed on phase purity analysis, rather than high resolution lattice parameter measurements.

Our own measurements of the zincblende GaN lattice parameter using high-resolution 2θ-ω-scans of 8 on- and off-axis reflections and a least squares fit give a value of (4.50597±0.00038) Å, which is in good agreement with experimental data by Novikov et al (2010), and can be used as reference data for strain analyses in zincblende GaN thin films.

TABLE 2

Lattice parameters and elastic constants of wurtzite and zincblende GaN, InN, and AlN

|  | GaN | InN | AlN |
|---|---|---|---|
| wurtzite | | | |
| $a_{wz}$ (Å) | 3.18940 [Paszkowicz et al (2004)] | 3.5446 [Strite et al (1992)] | 3.11197 [Paszkowicz et al (2004)] |
| $c_{wz}$ (Å) | 5.18614 [Paszkowicz et al (2004)] | 5.7034 [Strite et al (1992)] | 4.98089 [Paszkowicz et al (2004)] |
| zincblende | | | |
| $a_{zb}$ (Å) | 4.4913 *1 | 4.9393 *1 | 4.3136 *1 |
| | 4.5105 *2 | 5.0128 *2 | 4.4010 *2 |
| | 4.5041 *3 | 4.9882 *3 | 4.3717 *3 |
| | 4.510 ± 0.005 [Novikov (2010)]*4 | 5.01 ± 0.01 [Schörmann et al (2006)]*4 | 4.373 ± 0.002 [As et al (2010)]*4 |
| | 4.50597 ± 0.00038*5 | 5.02 ± 0.005 [Compeán García et al (2015)]*4 | — |
| $C_{11}$ (GPa) | 293*6 | 187*6 | 304*6 |
| $C_{12}$ (GPa) | 159*6 | 125*6 | 160*6 |

*1 $\sqrt{3}c_{wz}/2$
*2 $\sqrt{2}a_{wz}$
*3 $\sqrt[3]{2V_{wz}} = \sqrt[3]{\sqrt{3}c_{wz}a_{wz}^2}$
*4 experiment
*5 this work (experiment)
*6 recommended by Vurgaftman and Meyer (2003)

But, to the best of our knowledge, no experimentally determined accurate lattice parameters are mentioned in the literature for zincblende InN and AlN. In these cases it is therefore necessary to derive the values from the well-established wurtzite lattice parameters $a_{wz}$ and $c_{wz}$. However, in wurtzite-like III-nitrides strong internal electric fields lead to a distortion of the unit cell from the ideal shape, with a $c_{wz}/a_{wz}$-ratio of $\sqrt{8/3} \approx 1.633$. In reality $c_{wz}$ is typically smaller and $a_{wz}$ slightly larger than in the ideal case, and hence the estimated zincblende parameter of nominally unstrained III-nitrides can differ substantially, as one can see from the values in Table 2. As $a_{wz}$ is less affected by the wurtzite unit cell distortion than $c_{wz}$, this parameter gives reasonably good values for the natural lattice constant of the zincblende phase $a_{zb}$. Alternatively, the lattice parameters derived from the unit cell volumes $$\left(a_{zb} = \sqrt[3]{V_{zb}} = \sqrt[3]{2V_{wz}}\right)$$

can be used. Presumably, the natural unstrained lattice constants of zincblende nitrides are somewhere between these theoretical values, and this assumption is in good agreement with the experimental data known so far.

Table 2 also contains the elastic constants $C_{11}$ and $C_{12}$ for the zincblende III-nitrides as stated in Vurgaftman and Meyer (2003), and which can be used for stress and strain calculations.

Strain

During the growth of thin films on foreign substrates and during the heterostructure growth of alloys with different compositions, the films are subjected to varying stresses, which often result in an elastic deformation of the crystal lattice. Such lattice strains have a significant impact on the physical properties and the performance of semiconductor devices. Hence, the understanding and monitoring of these strains during device development are of high importance. In the following sections we will discuss the different sources of strain, and describe how the strain in a thin zincblende GaN film can be measured.

Lattice Mismatch Strain

In epitaxial thin films the lattice mismatch between the thin film and the underlying template produces biaxial in-plane strains, when the size of both lattices are forced to match each other. Three different states are commonly used to describe the thin film deformation. The thin film is fully strained when its lattice matches the dimensions of the template lattice at the common interface, while the film is fully relaxed when its lattice is undistorted and has its natural dimensions. The state between both extremes is called partially relaxed.

In reciprocal space the lattice mismatch strain results in a shift of the reciprocal lattice points (RLPs) of the GaN thin film from their expected position and with respect to the RLPs of the substrate. The relative separation between layer and buffer peaks can be either measured in several individual $\omega$-$2\theta$-scans, or more commonly by collecting a reciprocal space map in asymmetric geometry. The latter generally gives a better overview of the relationship between the X-ray reflections of the different layers, but a correction of the sample miscut by a second scan is required for the lattice mismatch strain evaluation. Moreover, one should take into account that the layer used as reference may be affected by the substrate as well, which lowers the accuracy of this method. Ideally one should use a substrate peak as reference, but there can be a large separation in reciprocal space for systems with a large mismatch.

The strain in a certain direction of the thin film is then given as follows:

$$\varepsilon_i = \frac{a_i - a_0}{a_0} \quad \text{(Eq. 12)}$$

where $a_0$ is the natural lattice constant, and $a_i$ is the measured constant in the same direction. Due to the relatively low material quality often found in zincblende nitride materials there are currently no accurate reference values for the natural lattice parameter available in the literature, as discussed in the previous section. For GaN one can use the experimentally determined values we provided in Table 2. For other group-III nitrides we recommend using the values which are derived from the wurtzite a-parameter or from the wurtzite cell volume (see Table 2), as the wurtzite lattice parameters are well known.

Assuming that the thin film is stress-free in the growth direction (commonly labelled as z), the strain of a (001) oriented film in the growth direction is given via Hooke's law as $$\varepsilon_z = -\frac{C_{12}}{C_{11}} \cdot (\varepsilon_x + \varepsilon_y) \quad \text{(Eq. 13)}$$

where $\varepsilon_x$ and $\varepsilon_y$ are the strains in the two in-plane directions, and $C_{11}$ and $C_{12}$ are the materials' elastic constants (see Table 2) [Dunstan (1997)]. In the case of isotropic in-plane strain ($\varepsilon_x = \varepsilon_y$) this can be further simplified. The strain relations for other orientations differ from the equation above, and are published elsewhere in literature, such as in Dunstan (1997).

Thermal Mismatch Strain & Growth Induced Strain

The small strain in an epitaxial thin film originates from the thermal mismatch between the used substrate and epilayer, or is formed in the early stage of growth. It is typically much smaller than strain due to lattice mismatch, but can be large compared to the residual mismatch strain in a partially relaxed film.

As GaN has a larger thermal expansion coefficient than SiC and Si [Wahab et al (1994); La Via (2012); Okada and Tokumaru (1984)] the remaining thermal strain after cooling down from the growth temperature leads to a tension in the GaN film at the interface to the substrate. For typical zincblende GaN growth temperatures in the range between 700° C. and 1000° C., the theoretical thermal strain is between $1.1 \times 10^{-3}$ and $1.6 \times 10^{-3}$ when a Si substrate is used.

Growth-induced strain occurs due to island coalescence during nucleation on the substrate in the early stages of growth. Its magnitude is given by the smallest possible gap between two islands $\Delta$ and the average island size $s_{island}$ in the particular in-plane direction $$\varepsilon_{x,y} = \frac{\Delta}{s_{island}} \quad \text{(Eq. 14)}$$

[Hoffman (1976)].

Relative lattice parameter measurements as described above are insufficiently accurate to determine such small strains, as the resolution is often low and as the substrate itself may also be influenced by the strain. Instead analyses of very small strains require absolute measurement of the lattice parameters, using high resolution 2θ-ω-scans of a larger set of different reflections. Then the as measured plane spacings $d_j$ are matched by the plane spacings of a model crystal using a least-squares fit:

$$\Sigma_j W_j^2 \cdot (d_{sim}^{-2} - d_j^{-2})^2 \rightarrow \min. \quad (Eq.\ 15)$$

To increase the accuracy of the method a weighting factor $W_j$ such as $2\theta_j/\Delta(2\theta_j)$ [Roder et al (2006)] or $d_j^{-2}/\Delta(d_j^{-2}) = 0.5 \cdot \tan(\theta_j)/\Delta(2\theta_j)$ (this work) is sometimes used, to take the imprecision of the measurement $\Delta(2\theta_j)$ into account.

Often it is necessary to choose a suitable coordinate system, which describes the geometry of the problem better than the natural lattice. The following example illustrates this. Table 3 lists 2θ values for different reflections, which were measured from a zincblende GaN film grown on a 3C—SiC/Si template with 4° miscut in [110] direction. The Bragg angles of all reflections tilted in the miscut direction hhl are significantly smaller than the similar reflections tilted away from the miscut h-hl, indicating a difference in the lattice dimensions for these two directions. In consequence the natural crystal lattice is slightly sheared within the growth plane. This can be simplified by using a new coordinate system x', y', z' with x' (y') parallel (perpendicular) to the sample miscut, and z' pointing in the growth direction. Note that by this coordinate transformation the new unit cell is $\sqrt{2} \times \sqrt{2} \times 1$ larger than the unit cell in the natural lattice. Using this approach, the least squares fit (see above) together with Bragg's law give a unit cell size of x'=(6.39566±6.7×10$^{-4}$) Å, y'=(6.38465±5.5×10$^{-4}$) Å, and z'=(4.49236±3.2×10$^{-4}$) Å in the new coordinate system, and an anisotropy of the in-plane strain of $\varepsilon_x'$=(3.65±0.11)×10$^{-3}$ resp. $\varepsilon_y'$=(1.92±0.09)×10$^{-3}$.

TABLE 3

Reflections in the natural coordinate system (hkl) and rotated coordinate system (h'k'l') of a zincblende GaN-sample, with 2θ and Δ(2θ) derived from high-resolution 2θω-scans.

| Reflection hkl in natural lattice | Reflection h'k'l' in x'y'z' lattice | Measured 2θ (°) | FWHM Δ(2θ) (°) |
|---|---|---|---|
| 002 | 002 | 40.0871 | 0.2452 |
| 004 | 004 | 86.6495 | 0.5002 |
| 1-13 | 023 | 69.2284 | 0.3132 |
| 2-24 | 044 | 114.0130 | 0.6891 |
| 3-31 | 061 | 96.1246 | 0.4233 |
| 113 | 203 | 69.1963 | 0.3690 |
| 224 | 404 | 113.8499 | 0.7261 |
| 331 | 601 | 95.9402 | 0.5198 |

It is known that a substrate miscut can lead to strain relaxation in epitaxial thin films via alignment of threading dislocations [Young et al (2010); Chen et al (2007)], but then the zincblende GaN layer would be less strained in the miscut direction ($\varepsilon_x'$) than in the perpendicular direction ($\varepsilon_y'$). Since we observed the opposite case, we can rule out this relaxation mechanism for this sample. Instead the results indicate that the strain anisotropy is probably due to the coalescence of islands with different size in the two in-plane directions, which has been observed in atomic force microscopy images.

Wafer Curvature Analysis

In heteroepitaxial thin films stress above a certain level can be relieved by the formation of defects, or in the case of tensile surface stress by the formation of cracks. Moreover the stress in the thin film can be lowered by bowing of the whole sample. This is often the case in thick, medium stressed epilayers, such as templates and buffer layers. Thermal strains can also lead to a significant wafer bowing. This is especially a problem with large area templates with diameters up to 8", where even small bows lead to significant deviations in uniformity during growth and processing. Hence, control and management of strain and wafer bowing are of significant interest.

The bow of a wafer can be determined with XRD by measuring the incident beam angle $\omega_j$ for the symmetric reflection at different positions of the sample $x_j$. In bowed samples the lattice planes are also curved with the bow of the wafer. In consequence the incident angle needs to be corrected for different positions along the diameter of the wafer. Wafer curvature and radius of bow R are then given by the relative change of $\omega_j$ and $x_j$:

$$\kappa = \frac{1}{R} = \frac{\tan(\Delta\omega)}{\Delta x} \approx \frac{\Delta\omega}{\Delta x} \quad (Eq.\ 16)$$

Figure 82:
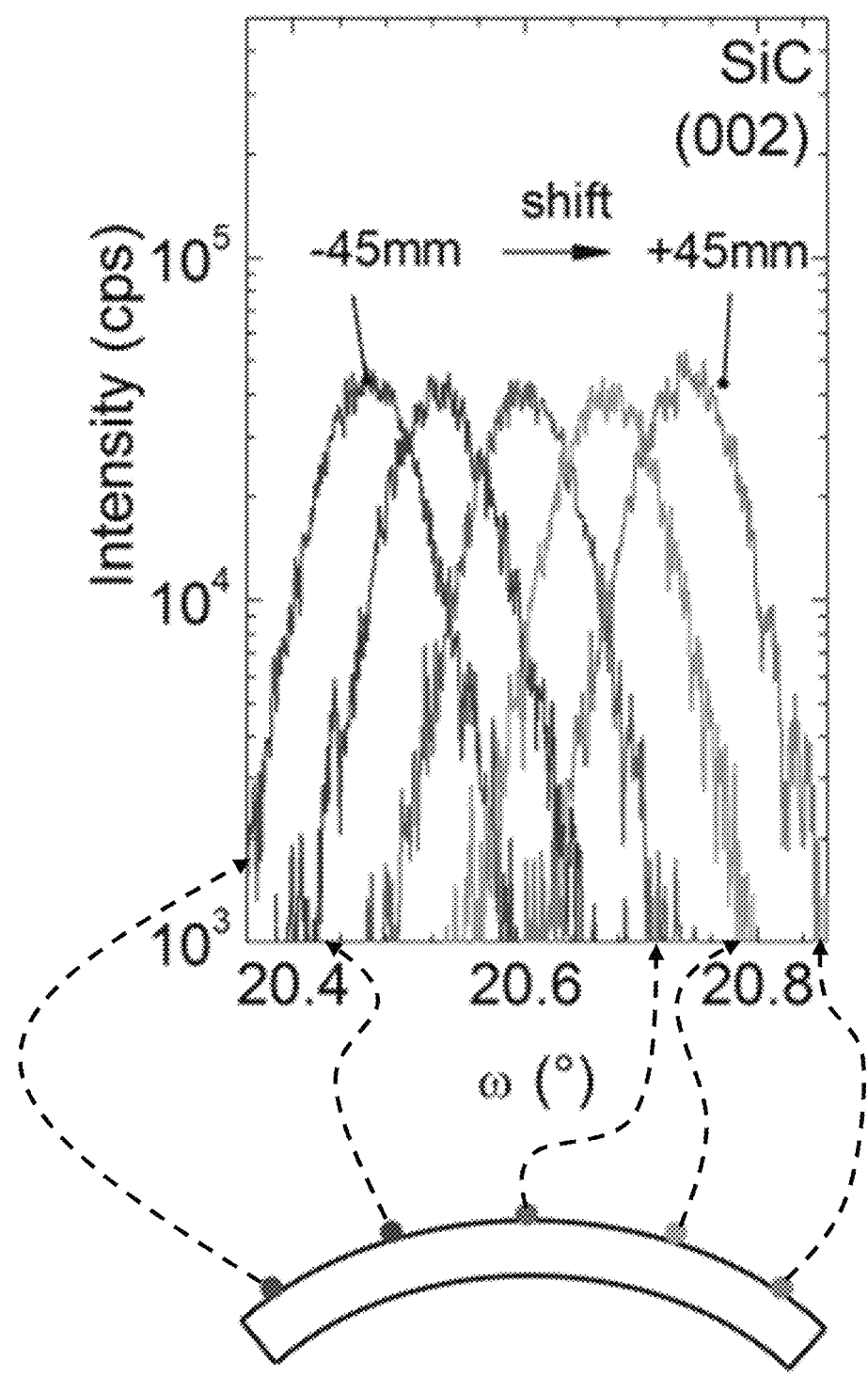
FIGS. 82 and 83 show an example for a XRD wafer bow analysis of a 4" 3C—SiC/Si template, revealing a convex curvature of $-51.5$ km$^{-1}$.
Figure 83:
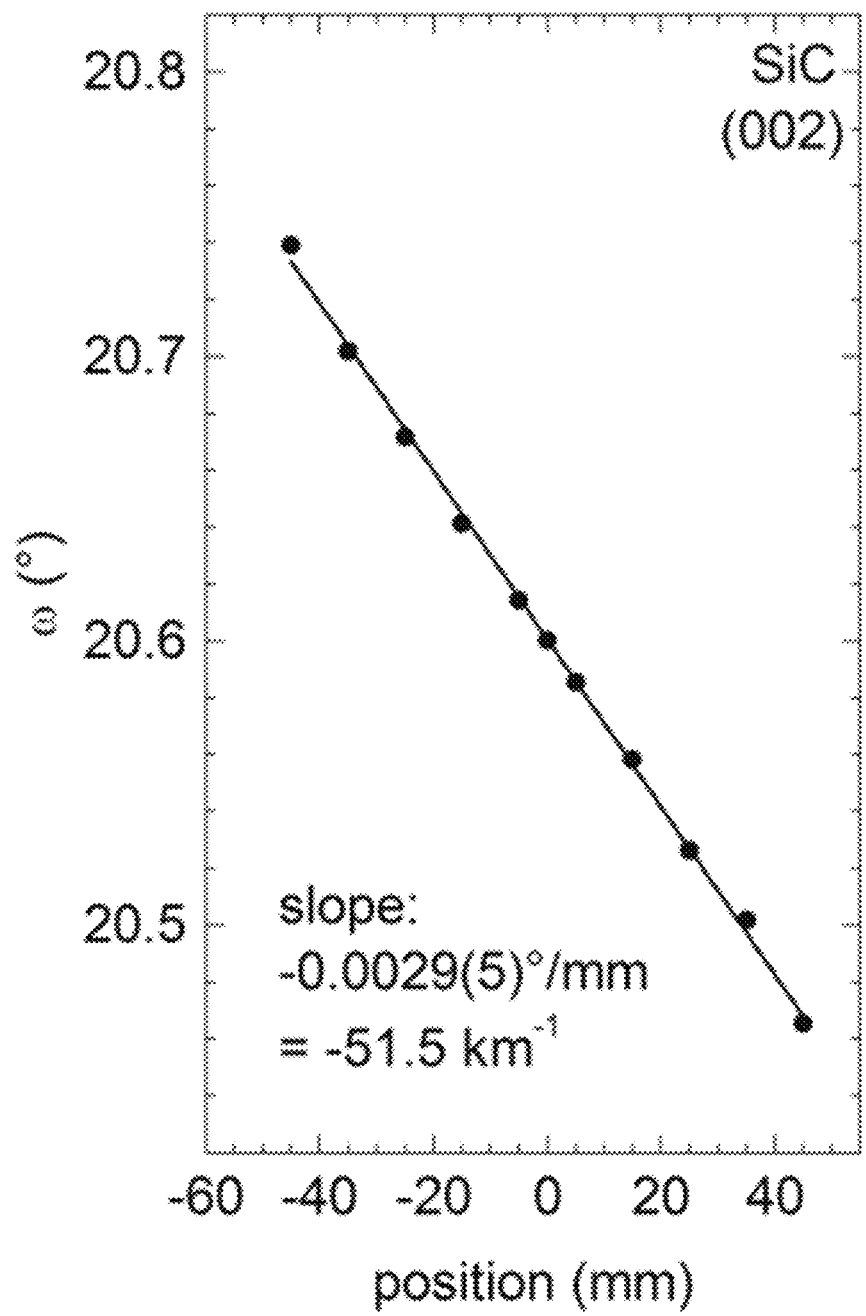

[Inaba (2014)]. Since the reflections of the zincblende GaN epilayer are often relatively broad, it is more suitable to use a narrower symmetric reflection of the underlying template. By using larger range of measurement positions, and a beam mask to reduce the irradiated area on the sample surface, the resolution of the measurement can be further improved. FIGS. 82 and 83 show such a curvature measurement for a 4" 3C—SiC/Si template, where the 002 SiC reflection was used. The curvature of the wafer along the measured direction can be easily determined graphically by linear interpolation of the measured incident beam angles. A positive (negative) slope corresponds to a concave (convex) bow of the wafer. The example in FIGS. 82 and 83 gives a convex bow of −51.5 km$^{-1}$ (respectively R=−19.4 m). It should be noted however that this technique measures the curvature of the substrate planes. If the substrates already contain a high density of dislocations or a grain structure then the planes in the substrates may already be curved before layer growth and therefore the measured bow may not give an accurate reflection of the residual stress in the wafer. For this reason there may also be discrepancies between the bow measured by X-ray and optical techniques. We find that for the high quality templates used in these studies the discrepancy between the curvature measured by X-ray diffraction and optical techniques is negligibly small.

Further Studies

Following on from the experimental work reported above, further studies have been carried out to investigate the effect of reaction pressure (and other parameters and conditions) on the growth of cubic zincblende GaN films.

In summary, cubic zincblende GaN films were grown by metalorganic vapour-phase epitaxy (MOVPE) on 3C—SiC/Si(001) templates and characterized using Nomarski optical microscopy and X-ray diffraction. In particular, the surface morphology and material quality were assessed as a function of the low-temperature nucleation layer thickness (between 3 and 44 nm in these experiments), the epigrowth temperature (in the range of 850 to 910° C. in these experiments) and the V/III ratio (from 15 to 1200 in these experiments) for a reaction pressure of 100 Torr. The reduction in reaction pressure from 300 to 100 Torr as presented here forms the main difference with the earlier results reported above. In this particular case, a window for particularly suitable MOVPE growth conditions was identified between 850 and 890° C. with a V/III ratio between 38 and 150, resulting in relatively smooth, zincblende GaN films with a wurtzite impurity content of less than 1%.

Figure 111:
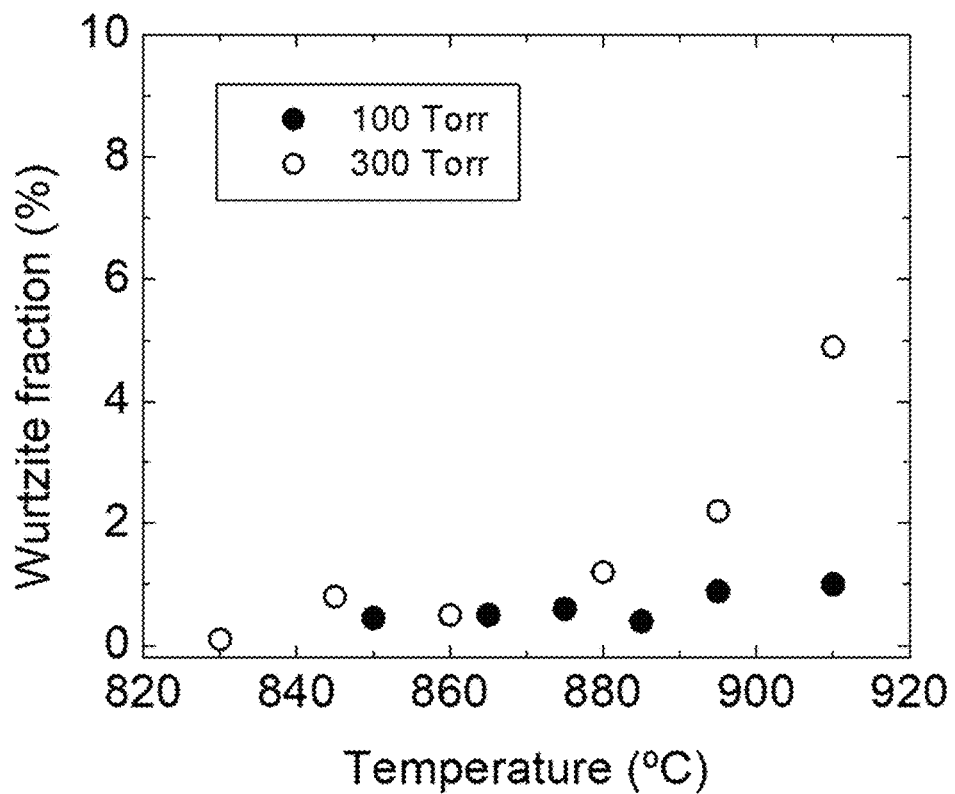
FIGS. 111 and 112: Wurtzite fraction determined by XRD in zincblende GaN epilayers grown at reaction pressures of 100 and 300 Torr as a function of temperature (FIG. 111) and V/III ratio (FIG. 112). The temperature-dependent samples in FIG. 111 were grown at a constant V/III of 76. The V/III-dependent samples in FIG. 112 were grown at 875° C. (100 Torr) and 880° C. (300 Torr).
Figure 112:
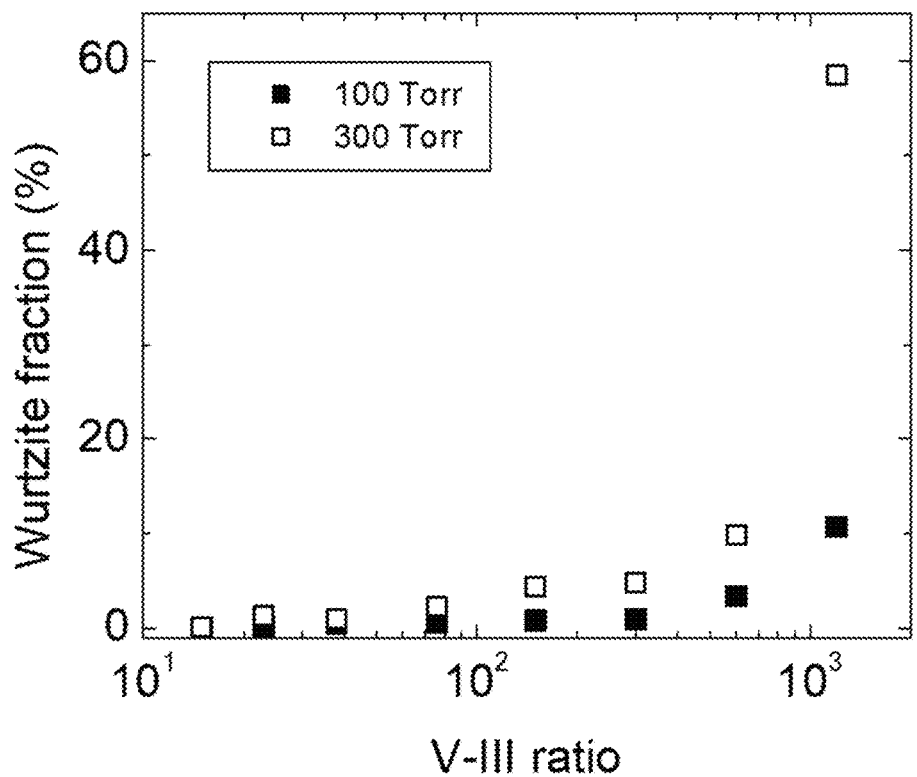

The effect of a reduction in the epilayer reaction pressure from 300 to 100 Torr on the zincblende phase purity is illustrated in FIGS. 111 and 112. These graphs show an equally low or lower wurtzite fraction for the 100 Torr data set under similar conditions of temperature and V/III ratio. Hence, the MOVPE growth window for the good zincblende GaN material quality is substantially widened under reduced reaction pressure conditions.

All samples were grown in a Thomas Swan 6×2" close-coupled showerhead MOVPE reactor on 3-SiC/Si templates. The SiC templates consisted of an about 3 µm-thick 3C—SiC layer on a Si (001) substrate with a thickness of between 0.75 mm and 1 mm and a misorientation of 4° towards [110]. For the GaN growth, trimethyl gallium (TMG) and ammonia were used as Ga- and N-precursors, respectively, while hydrogen was used as the carrier gas. The total gas flow was kept constant at 20 standard litres per min (slm). The growth procedure comprised of a high-temperature thermal anneal of the substrate followed by a low-temperature nucleation layer deposition and finally the growth of the epilayer proper at high temperature. The temperatures quoted are those recorded by a Laytec EpiTT in-situ optical monitoring system, calibrated against an Al/Si eutectic wafer. The thermal annealing step of the template took place at 960° C. in a mixture of hydrogen and 3 slm ammonia. The GaN nucleation layer (NL) was grown at 600° C., 500 Torr, and a V/III ratio of 720 to a thickness of 44 nm for sample sets A and B (see below). The epilayer growth pressure was maintained at 100 Torr while the epilayer thickness was kept constant at 300 nm. Two sample sets were prepared in which the variables were the epilayer growth temperature (sample set A) and the V/III ratio (sample set B). For set A, the epilayer growth temperature was varied between 850 and 910° C. at a constant V/III ratio of 76 in the gas phase. For set B, the V/III ratio during epilayer growth at 880° C. was varied between 15 and 1200 by changing the ammonia flow rate at a constant TMG flow rate of 145 µmol/min. All GaN epilayers were doped with Si to a nominal concentration of mid-$10^{18}$ cm$^{-3}$ using silane (50 ppm $SiH_4$ in $H_2$). Finally, a third sample set (sample set C) consisted of 300 nm thick GaN epilayers grown at 875° C., 100 Torr and V/III of 76 on low-temperature nucleation layers that varied in thickness between 3 and 44 nm.

XRD phase analysis was performed using a PANalytical Empyrean diffractometer equipped with a Cu-K$\alpha$1 source ($\lambda$=1.54056 Å), 2-bounce hybrid monochromator, ¼°-slit, Eulerian cradle, and a PIXcel solid-state area detector. Reciprocal space maps (RSMs) around the 113 zb-GaN and 1-103 wz-GaN reflections were measured parallel and perpendicular to the miscut direction of the substrate. The intensity profile along the SF streak between the 113 and 1-103 reflections were extracted from the RSMs and subsequently fitted with a maximum of three Pseudo-Voigt functions for the zincblende and wurtzite phases and a third, ill-defined, hence defective phase probably related to stacking faults. The integrated intensities of the fitted profiles were used to quantify the wurtzite fraction of the GaN epilayers. The residual peak intensity assigned to stacking faults was not quantified in this work. The 002 peak broadening was measured with a Philips X'Pert diffractometer equipped with an asymmetric 4-crystal Bartels monochromator ($\lambda$=1.54056 Å), 5×5 mm$^2$ cross slit collimator, Eulerian cradle, and gas proportional point detector without further secondary optics. The intensity profiles of open detector w-scans were fitted with Pseudo-Voigt functions.

Sample Set A—Temperature Series

The first set of samples (set A) to be discussed consisted of six samples in which the epilayer growth temperature was varied between 850 and 910° C., in steps of 10 to 15° C. In this series of experiments, the V/III ratio was kept constant at 76 which represented an intermediate value within the range of values explored in sample set B (see below). The surface morphology of the samples grown below 895° C. is characterized by elongated features or striae, as shown in the Nomarski optical micrographs in FIGS. 88-93. The striae are aligned along the [1-10] direction, i.e. in the direction perpendicular to the substrate's miscut indicating an in-plane anisotropy. The elongated features shorten to a few micrometers in length with increasing temperature. At 895° C. and above, the surface becomes more granular and roughens further with increasing temperature.

Figure 94:
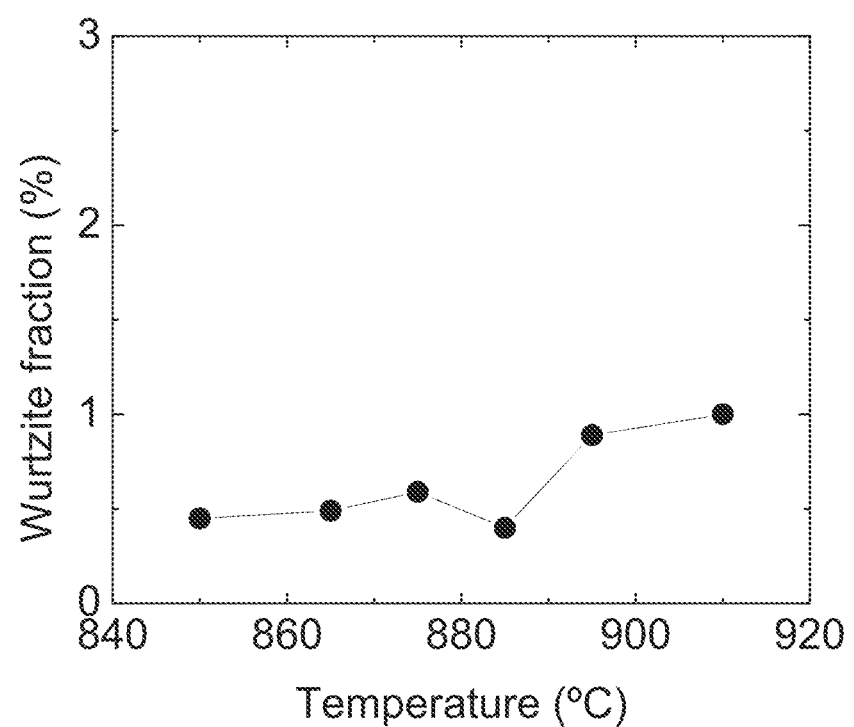
FIG. 94 shows the wurtzite fraction from XRD for GaN epilayers grown as a function of temperature at a constant V/III of 76 and a pressure of 100 Torr.

The XRD analysis of sample set A reveals that the wurtzite fraction measured perpendicular to the miscut increases gradually with increasing growth temperature but remains below 1% as shown in FIG. 94. The measurements obtained parallel to the miscut indicated no wurtzite inclusions along that direction and hence are not shown in the graph.

Sample Set B—V/III Ratio Series

The second series of samples (set B) consisted of eight samples in which the epilayer growth temperature was kept constant at 875° C., i.e. an intermediate value of set A, while the V/III ratio was varied from 15 to 1200, with a factor of about 2 between each value. The Nomarski optical micrographs in FIGS. 95-102 show the variation in surface morphology with increasing V/III ratio from granular to striated and again coarsening.

Figure 103:
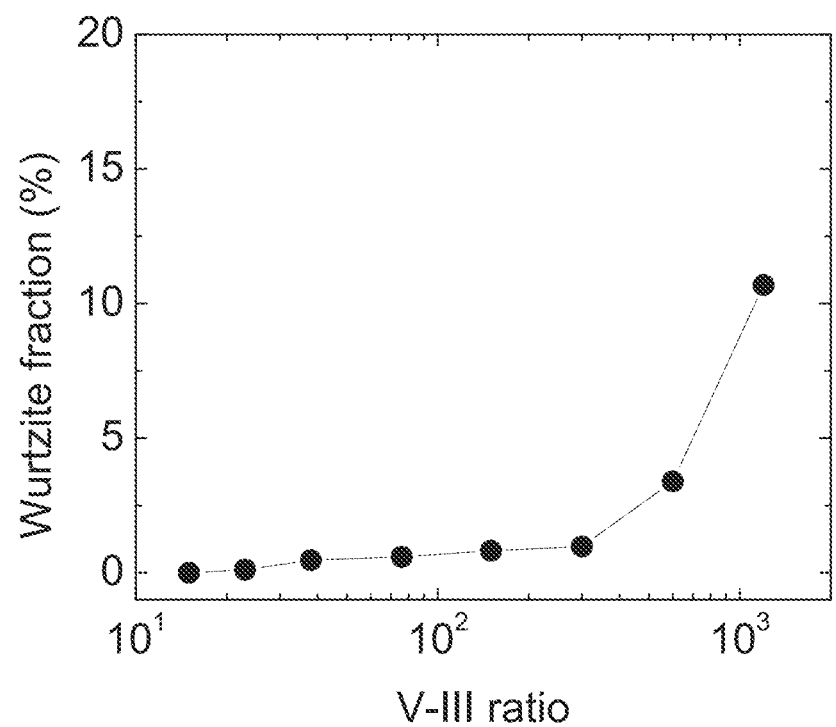
FIG. 103 shows the wurtzite fraction from XRD for GaN epilayers grown as a function of V/III ratio at a constant temperature of 875° C. and a pressure of 100 Torr.
Figures 104, 105, 106:
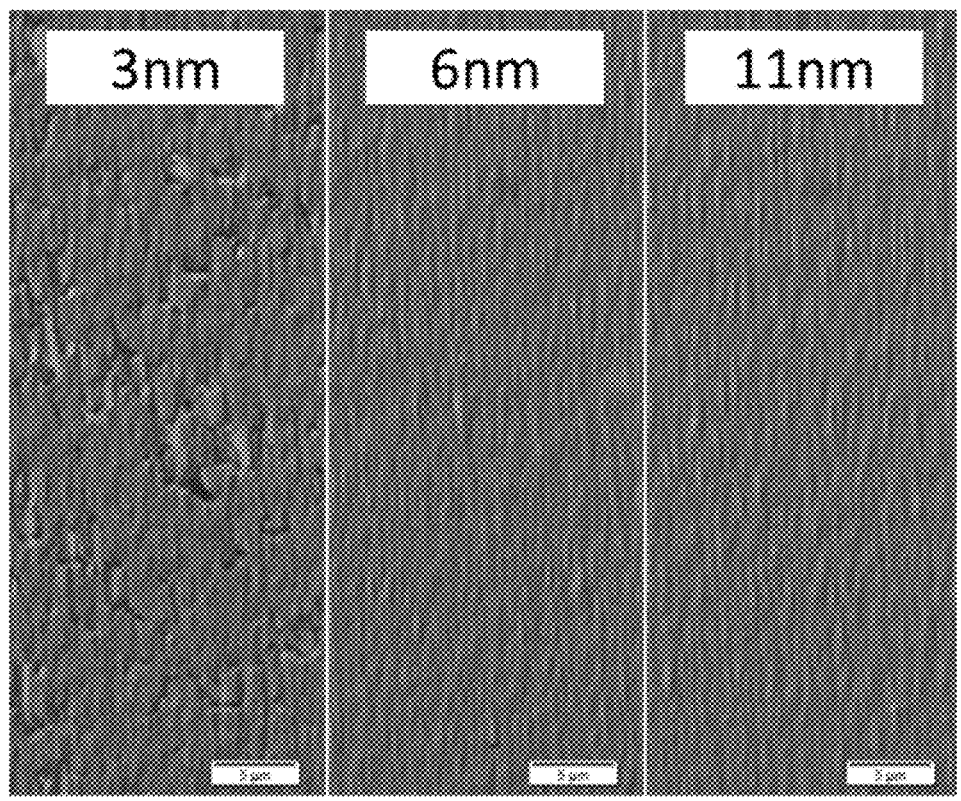
FIGS. 104-108 show Nomarski optical micrographs of GaN epilayers grown at 875° C., 100 Torr and V/III of 76 as a function of the GaN nucleation layer (NL) thickness. The nucleation layer thickness used for each is indicated on the respective images.
Figures 107, 108:
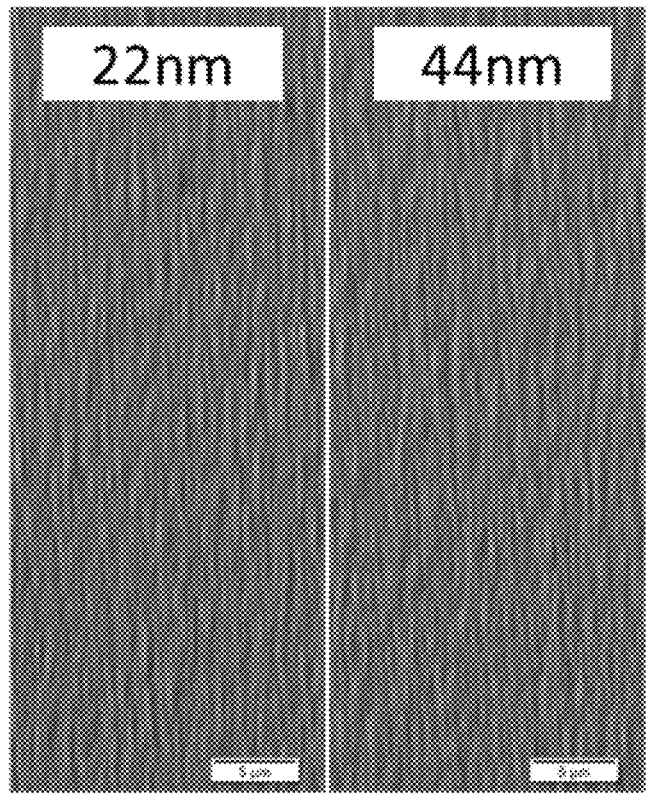

The results of the XRD phase analysis of sample set B indicates a small increase of wurtzite inclusions from 0% at V/III of 15 to 1% at V/III of 300, as is shown in FIG. 103 when measured perpendicular to the miscut. At the highest V/III values of 600 and 1200, the wurtzite fraction increases more rapidly to 3% and finally 11%. No significant presence of the wurtzite phase was found in all samples when measured parallel to the miscut and hence is omitted from the graph.

Sample Set C—NL Thickness Series

The third series of samples (sample set C) comprised of five samples in which the nucleation layer thickness was increased from 3 to 44 nm by a factor of about 2 in each step, while the epilayer growth conditions was kept constant at a temperature of 875° C., a pressure of 100 Torr and a V/III ratio of 76. The Nomarski optical micrographs in FIGS. 104-108 show the variation in surface morphology with changing NL thickness. Of the five samples, the only one that looks unusual is the one grown with the thinnest (3 nm) NL showing large pits in the epilayer. Other than that, the surface striae seem to coarsen with increasing NL thickness.

Figure 109:
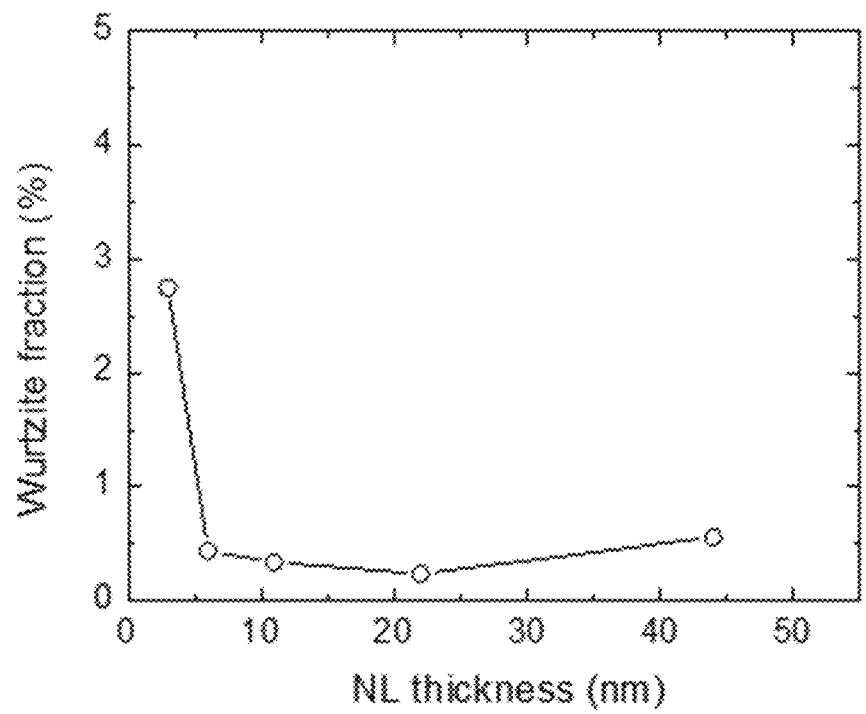
FIG. 109 shows the wurtzite fraction from XRD for GaN epilayers grown at 875° C., 100 Torr and V/III of 76 as a function of the GaN nucleation layer (NL) thickness.
Figure 110:
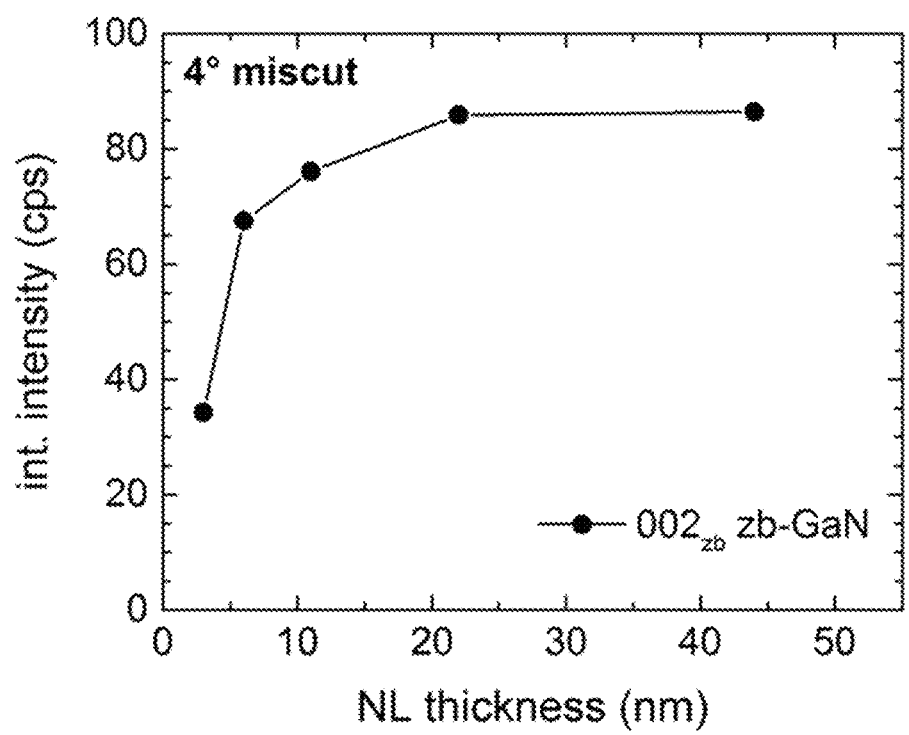
FIG. 110 shows the XRD 002 rocking curve integrated intensity for GaN epilayers grown at 875° C., 100 Torr and V/III of 76 as a function of the GaN nucleation layer (NL) thickness.

The XRD phase analysis of sample set C (see FIG. 109) indicates that the sample with the 3 nm-thick NL has the greatest wurtzite fraction at about 3%, while the other samples have less than 1% of wurtzite phase. The integrated intensity of the 002 rocking curves for sample set C are shown in FIG. 110. The changing peak intensity indicates an improvement in material quality with increasing NL thickness and the peak intensity saturates at a NL thickness of 22 nm or greater.

Discussion of Sample Sets A, B and C

The structural data of sample set A (varied temperature at a constant V/III ratio of 76) reveal that a growth temperature below 895° C. yields relatively smooth film surfaces (see FIGS. 88-93) with a wurtzite-fraction of less than 1% (see FIG. 94). At the higher growth temperatures, the surface degrades marginally and the wz-GaN fraction edges towards 1%. Hence, the preferred growth temperature is below about 890° C. at a V/III of 76 and reaction pressure of 100 Torr.

A constant growth temperature of 875° C. (i.e. within the most favourable temperature window) was used for sample set B while the V/III ratio was varied between 15 and 1200 with a factor of about 2 between each value. At the lower and higher ends of this range (see FIGS. 95-102), the surfaces are more granular. The flattest surface is probably observed for the samples grown at a V/III ratio between 38 and 150, as far as the Nomarski micrographs allow for a qualitative ranking. The wz-GaN contamination remains very small for the samples up to V/III of 300, despite their differences in surface morphology (see FIG. 103). The fast rise in wurtzite contamination at a V/III ratio above 300 is accompanied with a slight worsening of the surface morphology.

It is worth pointing out that sample set A was grown at a V/III ratio of 76, which falls in the range of V/III ratios established to be most favourable from the study of sample set B. Similarly, sample set B was grown at an epilayer growth temperature of 875° C., which falls in the temperature range established to be most preferred from the study of sample set A. Therefore, the surface and material properties of the zincblende GaN films should vary little across this MOVPE growth window.

The study of the low-temperature nucleation layer thickness (sample set C) indicates that the preferred thickness is around 22 nm. The use of a thinner GaN NL yields a loss of material quality while a thicker NL causes the surface morphology to coarsen.

In conclusion, considering the collective data of surface morphology and phase purity of samples sets A to C, the preferred MOVPE growth conditions for zincblende GaN epilayers at a constant pressure of 100 Torr are found within a small parameter window of temperature between 850 and 890° C. and V/III ratio of 38 to 150, resulting in a relatively smooth film with a wurtzite contamination of less than 1%. The preferred thickness of the NL is around 22 nm.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above and/or listed below are hereby incorporated by reference.

LIST OF NON-PATENT DOCUMENT REFERENCES

D. A. B. Miller, D. S. Chemla, T. C. Damen, A. C. Gossard, W. Wiegmann, T. H. Wood, C. A. Burrus, "Electric field dependence of optical absorption near the band gap of quantum-well structures"
Phys. Rev. B 32, 1043 (1985).
doi: 10.1103/PhysRevB.32.1043
https://doi.org/10.1103/PhysRevB.32.1043
V. Fiorentini, F. Bernardini, F. Della Sala, A. Di Carlo, P. Lugli, "Effects of macroscopic polarization in III-V nitride multiple quantum-wells",
Phys. Rev. B, vol. 60, 8849 (1999)
doi: 10.1103/PhysRevB.60.8849
https://doi.org/10.1103/PhysRevB.60.8849
S. Hammersley, M. J. Kappers, F. C.-P. Massabuau, S.-L. Sahonta, P. Dawson, R. A. Oliver, C. J. Humphreys, "Effects of quantum well growth temperature on the recombination efficiency of InGaN/GaN multiple quantum wells that emit in the green and blue spectral regions"
Appl. Phys. Lett. 107, 132106 (2015);
doi: 10.1063/1.4932200
http://dx.doi.org/10.1063/1.4932200
F. Nippert, S. Yu. Karpov, G. Callsen, B. Galler, T. Kure, C. Nenstiel, M. R. Wagner, M. Straßburg, H.-J. Lugauer, A. Hoffmann, "Temperature-dependent recombination coefficients in InGaN light-emitting diodes: Hole localization, Auger processes, and the green gap"
Applied Physics Letters 109, 161103 (2016)
doi: 10.1063/1.4965298
http://dx.doi.org/10.1063/1.4965298
S. Hammersley, M. J. Kappers, F. C.-P. Massabuau, S.-L. Sahonta, P. Dawson, R. A. Oliver, C. J. Humphreys,
"Effect of QW growth temperature on the optical properties of blue and green InGaN/GaN QW structures"
Phys. Status Solidi C 13, 209-213 (2016)
DOI: 10.1002/pssc.201510187
http://dx.doi.org/10.1002/pssc.201510187
S. Marcinkevičius, K. M. Kelchner, L. Y. Kuritzky, S. Nakamura, S. P. DenBaars, J. S. Speck, "Photoexcited carrier recombination in wide m-plane InGaN/GaN quantum wells"
Applied Physics Letters 103, 111107 (2013)
doi: 10.1063/1.4820839
http://dx.doi.org/10.1063/1.4820839
P. Dawson, S. Schulz, R. A. Oliver, M. J. Kappers, and C. J. Humphreys, "The nature of carrier localisation in polar and nonpolar InGaN/GaN quantum wells"
Journal of Applied Physics 119, 181505 (2016)
doi: 10.1063/1.4948237
http://dx.doi.org/10.1063/1.4948237
T. Detchprohm, M. Zhu, Y. Li, Y. L. Zhao, S. You, C. Wetzel, E. A. Preble, L. Liu, T. Paskova, and D. Hanser, "Wavelength-stable cyan and green light emitting diodes on nonpolar m-plane GaN bulk substrates"
Appl. Phys. Lett. 96, 051101 (2010)
doi: 10.1063/1.3299257
http://dx.doi.org/10.1063/1.3299257
Y. Zhao, Q. Yan, C.-Y. Huang, S.-C. Huang, P. Shan Hsu, S. Tanaka, C.-C. Pan, Y. Kawaguchi, K. Fujito, C. G. Van de Walle, J. S. Speck, S. P. DenBaars, S. Nakamura, D. Feezell,
"Indium incorporation and emission properties of nonpolar and semipolar InGaN quantum wells"

Applied Physics Letters 100, 201108 (2012)
doi: 10.1063/1.4719100
http://dx.doi.org/10.1063/1.4719100

S. F. Chichibu, A. Uedono, T. Onuma, T. Sota, B. A. Haskell, S. P. DenBaars, J. S. Speck, S. Nakamura, "Limiting factors of room-temperature nonradiative photoluminescence lifetime in polar and nonpolar GaN studied by time-resolved photoluminescence and slow positron annihilation techniques"
Applied Physics Letters 86, 021914 (2005)
doi: 10.1063/1.1851619
http://dx.doi.org/10.1063/1.1851619

T. Hanada, "Basic Properties of ZnO, GaN, and Related Materials", in "Oxide and Nitride Semiconductors—Processing, Properties, and Applications", Ed. T. Yao, S.-K. Hong, Advances in Materials Research 12, 1-19, Springer Berlin Heidelberg, 2009)

J. Schörmann, D. J. As, K. Lischka, P. Schley, R. Goldhahn, S. F. Li, W. Löffler, M. Hetterich, H. Kalt, "Molecular beam epitaxy of phase pure cubic InN"
Appl.Phys.Lett. 89, 261903 (2006)
doi: 10.1063/1.2422913
http://dx.doi.org/10.1063/1.2422913

V. D. Compeán García, I. E. Orozco Hinostroza, A. Escobosa Echavarría, E. López Luna, A. G. Rodríguez, M. A. Vidal, "Bulk lattice parameter and band gap of cubic $In_xGa_{1-x}N$ (001) alloys on MgO (100) substrates",
Journal of Crystal Growth 418, 120 (2015)
doi: 10.1016/j.jcrysgro.2015.02.033
http://dx.doi.org/10.1016/j.jcrysgro.2015.02.033

A. Trampert, O. Brandt, K. H. Ploog,
"Phase Transformations and Phase Stability in Epitaxial P—GaN Films",
Angewandte Chemie International Edition in English 36, 2111 (1997)
DOI: 10.1002/anie.199721111
http://dx.doi.org/10.1002/anie.199721111

X. M Shen, Y. T Wang, X. H Zheng, B. S Zhang, J Chen, G Feng, H Yang, "X-ray diffraction analysis of MOCVD grown GaN buffer layers on GaAs(0 0 1) substrates"
*Journal of Crystal Growth* 254, 23 (2003)
DOI: 10.1016/S0022-0248(03)01147-3
http://dx.doi.org/10.1016/S0022-0248(03)01147-3

J. Wu, H. Yaguchi, H. Nagasawa, Y. Yamaguchi, K. Onabe, Y. Shiraki, R. Ito, "Crystal Structure of GaN Grown on 3C—SiC Substrates by Metalorganic Vapor Phase Epitaxy",
Japanese Journal of Applied Physics 36, 4241(1997)
DOI??
http://iopscience.iop.org/article/10.1143/JJAP.36.4241

H. Yang, O. Brandt, K. Ploog, "MBE Growth of Cubic GaN on GaAs Substrates"
Phys. Status Solidi B 194, 109 (1996)
DOI: 10.1002/pssb.2221940112
http://dx.doi.org/10.1002/pssb.2221940112

O Ambacher, "Growth and applications of Group III-nitrides"
J. Phys. D: Appl. Phys. 31, 2653 (1998)
http://iopscience.iop.org/0022-3727/31/20/001

T. Hanada, "Basic Properties of ZnO, GaN, and Related Materials", in "Oxide and Nitride Semiconductors—Processing, Properties, and Applications", Ed. T. Yao, S.-K. Hong, Advances in Materials Research 12, 1-19, Springer Berlin Heidelberg, 2009)

B. D. Cullity, "Elements of X-ray diffraction",
Addison Wesley Publishing Company Inc., Reading (Massachusetts), (1978), Appendix 3, p. 501

C.-Y. Yeh, Z. W. Lu, S. Froyen, A. Zunger, "Zinc-blende—wurtzite polytypism in semiconductors"
Phys. Rev. B 46, 10086 (1992)
doi: 10.1103/PhysRevB.46.10086
https://doi.org/10.1103/PhysRevB.46.10086

P. F. Fewster and N. L. Andrew, "Absolute Lattice-Parameter Measurement"
*J. Appl. Cryst.* 28, 451 (1995)
DOI: 10.1107/S002188989500269X
https://doi.org/10.1107/S002188989500269X N. Herres, H. Obloh, K. H. Bachem, K. Helming, "X-ray analysis of the texture of heteroepitaxial gallium nitride films",
Materials Science and Engineering B59, 202 (1999)
doi: 10.1016/S0921-5107(98)00391-2
http://dx.doi.org/10.1016/S0921-5107(98)00391-2

B. D. Cullity, "Elements of X-ray diffraction"
Chapter 4: "Diffraction II: The Intensities of Diffracted Beams"
Addison-Wesley Publishing Company, Inc.
Reading, Massachusetts (1956)

R. C. Reynolds, jr., "The Lorentz-polarisation factor and preferred orientation in oriented clay aggregates"
Clays and Clay Minerals 34 (4), 359-367 (1986)
DOI: 10.1346/CCMN.1986.0340402
http://dx.doi.org/10.1346/CCMN.1986.0340402

International Tables for Crystallography, Volume C (Third edition 2004), Table 6.1.1.4 (pp. 578 . . . )
Kluwer Academic Publisher, Dordrecht, The Netherlands D. Waasmaier, A. Kirfel; "New Analytical Scattering-Factor Functions for Free Atoms and Ions"
Acta Crystallographica A51, 416-431 (1995).
doi: 10.1107/S0108767394013292
http://dx.doi.org/10.1107/S0108767394013292

B. Qu, X. H. Zheng, Y. T. Wang, S. M. Lin, Hui Yang, J. W. Liang, "Polarity dependence of hexagonal inclusions and cubic twins in GaN/GaAs(001) epilayers measured by conventional X-ray pole figure and grazing incident diffraction pole figure"
Journal of Crystal Growth 226, 57 (2001)

H. Tsuchiya, K. Sunaba, T. Suemasu, F. Hasegawa, "Growth condition dependence of GaN crystal structure on (001) GaAs by hydride vapor-phase epitaxy"
Journal of Crystal Growth 189/190, 395 (1998)

A. Trampert, O. Brandt, K. H. Ploog,
"Phase Transformations and Phase Stability in Epitaxial P—GaN Films", Angewandte Chemie International Edition in English 36, 2111 (1997)
DOI: 10.1002/anie.199721111
http://dx.doi.org/10.1002/anie.199721111

D. J. As, A. Richter, J. Busch, M. Lübbers, J. Mimkes, K. Lischka, "Electroluminescence of a cubic GaN/GaAs (001) p-n junction"
Applied Physics Letters 76, 13 (2000);
doi: 10.1063/1.125640
http://dx.doi.org/10.1063/1.125640

S. F. Chichibu, T. Onuma, T. Aoyama, K. Nakajima, P. Ahmet, T. Chikyow, T. Sota, S. P. DenBaars, S. Nakamura, T. Kitamura, Y. Ishida, H. Okumura, "Recombination dynamics of localized excitons in cubic $InxGa1-xN$/GaN multiple quantum wells grown by radio frequency molecular beam epitaxy on 3C—SiC substrate"

Journal of Vacuum. Science & Technology B 21(4), 1856-1862 (2003) doi: 10.1116/1.1593645
http://dx.doi.org/10.1116/1.1593645
T. Lei, M. Fanciulli, R. J. Molnar, T. D. Moustakas, R. J. Graham, J. Scanlon, "Epitaxial growth of zinc blende and wurtzitic gallium nitride thin films on (001) silicon"
Applied Physics Letters 59, 944 (1991)
doi: 10.1063/1.106309
http://dx.doi.org/10.1063/1.106309
T. S. Cheng, L. C. Jenkins, S. E. Hooper, C. T. Foxon, J. W. Orton, D. E. Lacklison, "Selective growth of zinc—blende, wurtzite, or a mixed phase of gallium nitride by molecular beam epitaxy"
Applied Physics Letters 66, 1509 (1995)
doi: 10.1063/1.113671
http://dx.doi.org/10.1063/1.113671
V. D. Compeán Garcia, I. E.Orozco Hinostroza, A. Escobosa Echavarría, E. López Luna, A. G. Rodríguez, M. A. Vidal, "Bulk lattice parameter and band gap of cubic InXGa1-XN (001) alloys on MgO (100) substrates",
Journal of Crystal Growth 418, 120 (2015)
doi: 10.1016/j.jcrysgro.2015.02.033
http://dx.doi.org/10.1016/j.jcrysgro.2015.02.033
K. Fujii, T. Kato, T. Minegishi, T. Yamada, H. Yamane, T. Yao,
"Photoelectrochemical Properties of Single Crystalline and Polycrystalline GaN Grown by the Na-flux Method"
Electrochemistry 78, 136 (2010)
http://doi.org/10.5796/electrochemistry.78.136
S. R. Lee, A. M. West, A. A. Allerman, K. E. Waldrip, D. M. Follstaedt, P. P. Provencio, D. D. Koleske, C. R. Abernathy, "Effect of threading dislocations on the Bragg peakwidths of GaN, AlGaN and AlN heterolayers",
Appl. Phys. Lett. 86, 241904 (2005)
DOI: 10.1063/1.1947367
http://dx.doi.org/10.1063/1.1947367
V. Srikant, J. S. Speck, D. R. Clarke, "Mosaic structure in epitaxial thin films having large lattice mismatch"
Journal of Applied Physics 82, 4286 (1997)
doi: 10.1063/1.366235
http://dx.doi.org/10.1063/1.366235
P. F. Fewster, "A high-resolution multiple-crystal multiple-reflection diffractometer",
J. Appl. Cryst. 22, 64 (1989)
doi: 10.1107/S0021889888011392
http://doi.org/10.1107/S0021889888011392
C. G. Dunn, E. F. Koch, "Comparison of dislocation densities of primary and secondary recrystallization grains of Si—Fe"
Acta metallurgica 5, 548 (1957)
doi:10.1016/0001-6160(57)90122-0
http://dx.doi.org/10.1016/0001-6160(57)90122-0
A. T. Blumenau, J Elsner., R Jones, M. I. Heggie, S. Öberg, T. Frauenheim, P. R. Briddon
"Dislocations in hexagonal and cubic GaN"
J. Phys.: Condens. Matter 12, 10223 (2000)
doi: 10.1088/0953-8984/12/49/322
http://dx.doi.org/10.1088/0953-8984/12/49/322
http://stacks.iop.org/0953-8984/12/i=49/a=322
T. Metzger, R. Höpler, E. Born, O. Ambacher, M. Stutzmann, R. Stömmer, M. Schuster, H. Göbel, S. Christiansen, M. Albrecht, H. P. Strunk, "Defect structure of epitaxial GaN films determined by transmission electron microscopy and triple-axis X-ray diffractometry",
Philosophical Magazine A 77, 1013 (1998)
DOI: 10.1080/01418619808221225
http://dx.doi.org/10.1080/01418619808221225
R. M. Kemper, P. Veit, C. Mietze, A. Dempewolf, T. Wecker, F. Bertram, J. Christen, J. K. N. Lindner, D. J. As, "STEM-CL investigations on the influence of stacking faults on the optical emission of cubic GaN epilayers and cubic GaN/AlN multi-quantum wells"
Phys. Status Solidi C 12, 469 (2015)
DOI: 10.1002/pssc.201400154
http://dx.doi.org/10.1002/pssc.201400154
E. Martinez-Guerrero, E. Bellet-Amalric, L. Martinet, G. Feuillet, B. Daudin, H. Mariette, P. Holliger, C. Dubois, C. Bru-Chevallier, P. Aboughe Nze, T. Chassagne, G. Ferro, Y. Monteil, "Structural properties of undoped and doped cubic GaN grown on SiC(001)"
Journal of Applied Physics 91, 4983 (2002)
DOI: 10.1063/1.1456243
http://dx.doi.org/10.1063/1.1456243
M. Barchuk, V. Holý, D. Kriegner, J. Stangl, S. Schwaiger, F. Scholz, "Diffuse x-ray scattering from stacking faults in a-plane GaN epitaxial layers"
Phys. Rev. B 84, 094113, (2011)
DOI: 10.1103/PhysRevB.84.094113
http://dx.doi.org/10.1103/PhysRevB.84.094113
M. Dupraz, G. Beutier, D. Rodney, D. Mordehai, M. Verdier, "Signature of dislocations and stacking faults of facecentred cubic nanocrystals in coherent X-ray diffraction patterns: a numerical study",
J. Appl. Cryst. (2015). 48, 621-644
doi: 10.1107/S1600576715005324
http://dx.doi.org/10.1107/S1600576715005324
D. J. As, "Recent developments on non-polar cubic group III nitrides for optoelectronic applications"
Proc. SPIE 7608, Quantum Sensing and Nanophotonic Devices VII, 76080G (2010);
doi:10.1117/12.846846
http://dx.doi.org/10.1117/12.846846
R. M. Kemper, P. Veit, C. Mietze, A. Dempewolf, T. Wecker, F. Bertram, J. Christen, J. K. N. Lindner, D. J. As, "STEM-CL investigations on the influence of stacking faults on the optical emission of cubic GaN epilayers and cubic GaN/AlN multi-quantum wells"
physica status solidi (c) 12, 469 (2015)
doi: 10.1002/pssc.201400154
http://dx.doi.org/10.1002/pssc.201400154
M. Rüsing, T. Wecker, G. Berth, D. J. As, A. Zrenner, "Joint Raman spectroscopy and HRXRD investigation of cubic gallium nitride layers grown on 3C—SiC"
physica status solidi (b) 253, 778 (2016)
doi: 10.1002/pssb.201552592
http://dx.doi.org/10.1002/pssb.201552592
K. Lischka, "Epitaxial ZnSe and Cubic GaN: Wide-Band-Gap Semiconductors with Similar Properties?"
physica status solidi (b) 202, 673 (1997)
DOI: 10.1002/1521-3951(199708)202:2<673::AID-PSSB673>3.0.CO; 2-C
http://dx.doi.org/10.1002/1521-3951(199708)202:2<673::AID-PSSB673>3.0.CO; 2-C
J. E. Ayers, "New model for the thickness and mismatch dependencies of threading dislocation densities in mismatched heteroepitaxial layers"
Journal of Applied Physics 78, 3724 (1995)
doi: 10.1063/1.359952
http://dx.doi.org/10.1063/1.359952

A. E. Romanov, W. Pompe, G. Beltz, J. S. Speck, "Modeling of Threading Dislocation Density Reduction in Heteroepitaxial Layers"
physica status solidi (b) 198, 599 (1996)
DOI: 10.1002/pssb.2221980205
http://dx.doi.org/10.1002/pssb.2221980205

S. V. Novikov, N. Zainal, A. V. Akimov, C. R. Staddon, A. J. Kent, C. T. Foxon,
"Molecular beam epitaxy as a method for the growth of freestanding zinc-blende (cubic) GaN layers and substrates"
J. Vac. Sci. Technol. B 28, C3B1 (2010);
doi: 10.1116/1.3276426
http://dx.doi.org/10.1116/1.3276426

W. Paszkowicz, S. Podsiablo, R. Minikayev, "Rietveld-refinement study of aluminium and gallium nitrides"
J. Alloys Compd. 382, 100 (2004)
doi:10.1016/j.jallcom.2004.05.036
http://dx.doi.org/10.1016/j.jallcom.2004.05.036

S. Strite, J. Ruan, D. J. Smith, J. Sariel, N. Manning, H. Chen, W. J. Choyke, H. Morkog Bull. Am. Phys. Soc. 37, 346 (1992)

J. Schörmann, D. J. As, K. Lischka, P. Schley, R. Goldhahn, S. F. Li, W. Löffler, M. Hetterich, H. Kalt, "Molecular beam epitaxy of phase pure cubic InN"
Appl. Phys. Lett. 89, 261903 (2006);
doi: 10.1063/1.2422913
http://dx.doi.org/10.1063/1.2422913

V. D. Compeán Garcia, I. E. Orozco Hinostroza, A. Escobosa Echavarria, E. López Luna, A. G. Rodríguez, M. A.Vidal, "Bulk lattice parameter and bandgap of cubic $InXGa1-xN$ (001) alloys on MgO (100) substrates", Journal of CrystalGrowth 418, 120 (2015)
doi: 10.1016/j.jcrysgro.2015.02.033
http://dx.doi.org/10.1016/j.jcrysgro.2015.02.033

I. Vurgaftman, J. R. Meyer, "Band parameters for nitrogen-containing semiconductors" Journal of Applied Physics 94, 3675 (2003)
DOI: 10.1063/1.1600519
http://dx.doi.org/10.1063/1.1600519

D. J. Dunstan, "Strain and strain relaxation in semiconductors", Journal of Materials Science: Materials in Electronics 8, 337 (1997)
doi:10.1023/A:1018547625106
http://dx.doi.org/10.1023/A:1018547625106

C. Roder, S. Einfeldt, S. Figge, and D. Hommel "Temperature dependence of the thermal expansion of GaN", PHYSICAL REVIEW B 72, 085218 (2005);
http://dx.doi.org/10.1103/PhysRevB.72.085218

Q. Wahab, M. R. Sardela Jr., L. Hultman, A. Henry, M. Willander, E. Jarnzen, and J.-E. Sundgren, "Growth of high-quality 3C—SiC epitaxial films on off-axis Si(OO1) sulbstrates at 850° C. by reactive magnetron sputtering", Appl. Phys. Lett. 65, 725 (1994);
doi: 10.1063/1.112212
http://dx.doi.org/10.1063/1.112212

"Silicon Carbide Epitaxy"
Editor: Francesco La Via
Research Signpost, Kerala, India
ISBN: 978-81-308-0500-9
2012

Y. Okada and Y. Tokumaru, "Precise determination of lattice parameter and thermal expansion coefficient of silicon between 300 and 1500 K," J. Appl. Phys. 56(2), 314-320 (1984).
http://dx.doi.org/10.1063/1.333965

R. W. Hoffman, "Stresses in thin films: The relevance of grain boundaries and impurities", Thin Solid Films 34, 185-190 (1976).
doi:10.1016/0040-6090(76)90453-3
http://dx.doi.org/10.1016/0040-6090(76)90453-3

C. Roder, S. Einfeldt, S. Figge, T. Paskova, D. Hommel, P. P. Paskov, B. Monemar, U. Behn, B. A. Haskell, P. T. Fini, S. Nakamura, "Stress and wafer bending of a-plane GaN layers on r-plane sapphire substrates", J. Appl. Phys. 100, 103511 (2006);
http://dx.doi.org/10.1063/1.2386940

E. C. Young, F. Wu, A. E. Romanov, A. Tyagi, C. S. Gallinat, S. P. DenBaars, S. Nakamura, J. S. Speck, "Lattice Tilt and Misfit Dislocations in (11-22) Semipolar GaN Heteroepitaxy"
Applied Physics Express 3, 011004 (2010)
doi: 10.1143/APEX.3.011004
http://dx.doi.org/10.1143/APEX.3.011004

Y. B. Chen, M. B. Katz, X. Q. Pan, C. M. Folkman, R. R. Das, C. B. Eom, "Microstructure and strain relaxation of epitaxial PrScO3 thin films grown on (001) SrTiO2 substrates"
Applied Physics Letters 91, 031902 (2007)
doi: 10.1063/1.2756359
http://dx.doi.org/10.1063/1.2756359

Katsuhiko Inaba, "Characterization of GaN-related materials using high-resolution XRD", Rigaku Journal 30 (1), 7, 2014
reprinted/republished:
The Bridge 27, Sep. 2015
http://www.rigaku.com/newsletters/mabu/sept2015/RigakuJournal_XRD_Otpdf D Zhu, D J Wallis and C J Humphreys, "Prospects of III-Nitride Optoelectronics on Si", Invited review in Reports on Progress in Physics, 76(10) 106501 (2013)

References in FIG. 71:

[A]: R. M. Kemper, P. Veit, C. Mietze, A. Dempewolf, T. Wecker, F. Bertram, J. Christen, J. K. N. Lindner, D. J. As, "STEM-CL investigations on the influence of stacking faults on the optical emission of cubic GaN epilayers and cubic GaN/AlN multi-quantum wells"
Physica Status Solidi C 12, 469 (2015)
DOI: 10.1002/pssc.201400154
http://dx.doi.org/10.1002/pssc.201400154

[B]: R. M. Kemper, M. Häberlen, T. Schupp, M. Weinl, M. Burger, M. Ruth, C. Meier, T. Niendorf, H. J. Maier, K. Lischka, D. J. As, J. K. N. Lindner
"Formation of defects in cubic GaN grown on nano-patterned 3C—SiC (001)"
physica status solid (c) 9, 1028 (2012)
DOI: 10.1002/pssc.201100174
http://dx.doi.org/10.1002/pssc.201100174

[C]: E. Martinez-Guerrero, E. Bellet-Amalric, L. Martinet, G. Feuillet, B. Daudin, H. Mariette, P. Holliger, C. Dubois, C. Bru-Chevallier, P. Aboughe Nze, T. Chassagne, G. Ferro, Y. Monteil, "Structural properties of undoped and doped cubic GaN grown on SiC(001)"
Journal of Applied Physics 91, 4983 (2002)
DOI: 10.1063/1.1456243
http://dx.doi.org/10.1063/1.1456243

[D]: D. G. Pacheco-Salazar, S. F. Li, F. Cerdeira, E. A. Meneses, J. R. Leite, L. M. R. Scolfaro, D. J. As, K.

Lischka, "Growth and characterization of cubic InxGa1-xN epilayers on two different types of substrate"
Journal of Crystal Growth 284, 379 (2005)
DOI: 10.1016/j.jcrysgro.2005.07.049
http://dx.doi.org/10.1016/j.jcrysgro.2005.07.049
[E]: H. Yang, O. Brandt, K. Ploog, "MBE growth of cubic GaN on GaAs substrates"
physica status solid (b) 194, 109 (1996)
DOI: 10.1002/pssb.2221940112
http://dx.doi.org/10.1002/pssb.2221940112
[F]: D. G. Pacheco-Salazar, S. F. Li, F. Cerdeira, E. A. Meneses, J. R. Leite, L. M. R. Scolfaro, D. J. As, K. Lischka, "Growth and characterization of cubic InxGa1-xN epilayers on two different types of substrate"
Journal of Crystal Growth 284, 379 (2005)
DOI: 10.1016/j.jcrysgro.2005.07.049
http://dx.doi.org/10.1016/j.jcrysgro.2005.07.049
[G]: R. C. Powell, N.-E. Lee, Y.-W. Kim, J. E. Greene "Heteroepitaxial wurtzite and zinc-blende structure GaN grown by reactive-ion molecular-beam epitaxy: Growth kinetics, microstructure, and properties"
J. Appl. Phys. 73, 189 (1993)
http://dx.doi.org/10.1063/1.353882
[H]: T. Lei, T. D. Moustakas, R. J. Graham, Y. He, S. J. Berkowitz, "Epitaxial growth and characterization of zinc-blende gallium nitride on (001) silicon" J. Appl. Phys. 71, 4933 (1992);
http://dx.doi.org/10.1063/1.350642

The invention claimed is:

1. A method of manufacturing a semiconductor structure comprising a substantially (001) oriented zincblende structure group III-N layer, the method including the steps:
providing a silicon substrate;
providing a 3C—SiC layer on the silicon substrate;
subjecting the 3C—SiC layer to a nitridation step at a temperature T1 in the range 800-1100° C.;
growing a zincblende structure group III-N nucleation layer at a temperature T2 in the range 550-650° C. with a growth rate in the range 0.1-1 nm/s to a thickness in the range 10-100 nm;
carrying out a nucleation layer recrystallization step at a temperature T3 in the range 850-920° C.; and
depositing and growing the zincblende structure group III-N layer by MOVPE at temperature T3 in the range 850-920° C., to a thickness of at least 0.3 μm, wherein the group III-nitride layer is a In·sub·xAl·sub·yGa·sub·1-x-yN based layer, where 0≤x≤1, 0≤y≤1.

2. The method according to claim 1 wherein the group III-nitride nucleation layer is grown to a thickness in the range 10-50 nm.

3. The method according to claim 1 wherein, in the step of depositing and growing the zincblende structure group III-nitride layer, the reactor pressure is not more than 500 Torr.

4. The method according to claim 1 wherein, in the step of depositing and growing the zincblende structure group III-nitride layer, the reactor pressure is not more than 300 Torr.

5. The method according to claim 1 wherein, in the step of depositing and growing the zincblende structure group III-nitride layer, the V-to-III ratio is not more than 300.

6. The method according to claim 1 wherein V-to-III ratio is not more than 150.

7. The method according to claim 1 wherein the silicon substrate has a diameter of at least 100 mm.

8. A method of manufacturing a semiconductor structure according to claim 1, wherein the semiconductor structure is incorporated in a semiconductor device selected from the group consisting of: a light emitting diode (LED); a laser; a diode; a transistor; a sensor.

9. A method of manufacturing a semiconductor structure comprising a substantially (001) oriented zincblende structure group III-N layer, the method including the steps:
providing a silicon substrate;
providing a 3C—SiC layer on the silicon substrate;
subjecting the 3C—SiC layer to a nitridation step at a temperature T1 in the range 800-1100° C.;
growing a zincblende structure GaN nucleation layer at a temperature T2 in the range 550-650° C. with a growth rate in the range 0.1-1 nm/s to a thickness in the range 10-100 nm;
carrying out a nucleation layer recrystallization step by ramping up the temperature at a rate of 0.1-10° C./s to a temperature T3 in the range 850-920° C.; and
depositing and growing the zincblende structure III-N layer by MOVPE at the temperature T3 in the range 850-920° C., with a V-to-III ratio of 38-300, at a growth rate of 0.1-1 nm/s to a thickness of at least 0.3 μm.

* * * * *